(12) United States Patent
Shinagawa et al.

(10) Patent No.: US 8,327,251 B2
(45) Date of Patent: Dec. 4, 2012

(54) TRANSMISSION APPARATUS AND METHOD, RECEPTION APPARATUS AND METHOD, AND PROGRAM

(75) Inventors: Masashi Shinagawa, Tokyo (JP); Makoto Noda, Tokyo (JP); Hiroyuki Yamagishi, Tokyo (JP); Keitarou Kondou, Tokyo (JP)

(73) Assignee: Sony Corporation (JP)

( * ) Notice: Subject to any disclaimer, the term of this patent is extended or adjusted under 35 U.S.C. 154(b) by 980 days.

(21) Appl. No.: 12/317,268

(22) Filed: Dec. 18, 2008

(65) Prior Publication Data

US 2010/0031124 A1 Feb. 4, 2010

(30) Foreign Application Priority Data

Dec. 21, 2007 (JP) ................ P2007-330457
Apr. 30, 2008 (JP) ................ P2008-118547
Apr. 30, 2008 (JP) ................ P2008-118548

(51) Int. Cl.
*H03M 13/09* (2006.01)

(52) U.S. Cl. ........................................ 714/807

(58) Field of Classification Search ............ 714/807
See application file for complete search history.

(56) References Cited

U.S. PATENT DOCUMENTS

| | | | |
|---|---|---|---|
| 6,085,349 A | 7/2000 | Stein et al. | |
| 6,754,870 B2 * | 6/2004 | Yoshida et al. | 714/758 |
| 6,978,415 B1 * | 12/2005 | Weng | 714/781 |
| 7,171,604 B2 * | 1/2007 | Sydir et al. | 714/758 |
| 7,216,285 B2 * | 5/2007 | Chen | 714/781 |
| 7,320,102 B2 * | 1/2008 | Milliken | 714/781 |
| 7,890,835 B2 * | 2/2011 | Kwak | 714/758 |
| 2004/0187064 A1 | 9/2004 | Takahashi et al. | |

FOREIGN PATENT DOCUMENTS

JP 2006-180172 A 7/2006

OTHER PUBLICATIONS

J. K. Wolf, R. D. Blakeney, "An exact evaluation of the probability of undetected error for certain shortened binary CRC codes," Military Communications Conference, 1988, MILCOM 88, Conference record, '21st Century Military Communications—What's Possible?', 1988 IEEE, vol. 1, pp. 287-292, Oct. 1988.

T. Baicheva, S. Dodunekov, "Undetected error probability performance of cyclic redundancy-check codes of 16-bit redundancy," IEE Proc. Comm., vol. 147, No. 5, pp. 253-256, Oct. 2000.

P. Kazakov, "Fast Calculation of the Numberf of Minimum-Weight Words of CRC Codes," IEEE Trans. Inform. Theory, vol. 47, No. 3, pp. 1190-1195, Mar. 2001.

(Continued)

*Primary Examiner* — Stephen M Baker
(74) *Attorney, Agent, or Firm* — Lerner, David, Littenberg, Krumholz & Mentlik, LLP

(57) ABSTRACT

A transmission apparatus includes: a CRC encoding processing unit configured to include a plurality of generating polynomials for an CRC encoding processing with each of a plurality of data of which the code lengths differ as a target, and employ the optimal generating polynomial out of the plurality of generating polynomials to perform the CRC encoding processing; and a transmission unit configured to transmit data obtained by the CRC encoding processing unit performing the CRC encoding processing.

12 Claims, 35 Drawing Sheets

OTHER PUBLICATIONS

P. Koopman, "Cyclic Redundancy Code (CRC) Polynomial Selection for Embedded Networks," The International Conference on Dependable System and Networks, DSN-2004, pp. 1-10.

G. Castagnoli, J. Ganz, P. Graber, "Optimum Cyclic Redundancy-Check Codes with 16-Bit Redundancy," IEEE Trans. Comm., vol. 38, No. 1, pp. 111-114, Jan. 1990.

G. Funk, "Determination of Best Shortened Codes," IEEE Trans. Comm., vol. 44, No. 1, pp. 1-6, Jan. 1996.

D. Chun, J. K. Wolf, "Special Hardware for Computing the Probability of Undetected Error for Certain CRC Codes and Test Results," IEEE Trans. Comm., vol. 42, No. 10, pp. 2769-2772, Oct. 1994.

G. Castagnoli, S. Brauer, M. Herrmann, "Optimization of Cyclic Redundancy-Check Codes with 24 and 32 Parity Bits," IEEE Trans. Comm., vol. 41, No. 6, pp. 883-892, Jun. 1993.

European Search Report from EP Application No. 08254061, dated Aug. 13, 2012.

Communication pursuant to Article 94(3) EPC, from EP Application No. 08254061.8, dated Sep. 7, 2012.

* cited by examiner

| BIT ERROR RATE | UNDETECTED ERROR PROBABILITY | |
|---|---|---|
| | CRC-8 $G(x)=x^8+x^7+x^6+x^4+x^2+1$ | PROPOSED CRCC $G(x)=x^8+x^4+x+1$ |
| $1\times10^{-3}$ | $1.21\times10^{-8}$ | $1.17\times10^{-8}$ |
| $1\times10^{-4}$ | $1.30\times10^{-12}$ | $1.25\times10^{-12}$ |
| $1\times10^{-5}$ | $1.31\times10^{-16}$ | $1.26\times10^{-16}$ |

FIG. 29

| CODE LENGTH | GENERATING POLYNOMIAL |
|---|---|
| $n_1$ | $G_1(x)$ |
| $n_2$ | $G_2(x)$ |
| $n_3$ | $G_3(x)$ |
| ⋮ | ⋮ |

FIG. 30

| BBHEADER | $G_1(x)$ |
|---|---|
| UP | $G_2(x)$ |

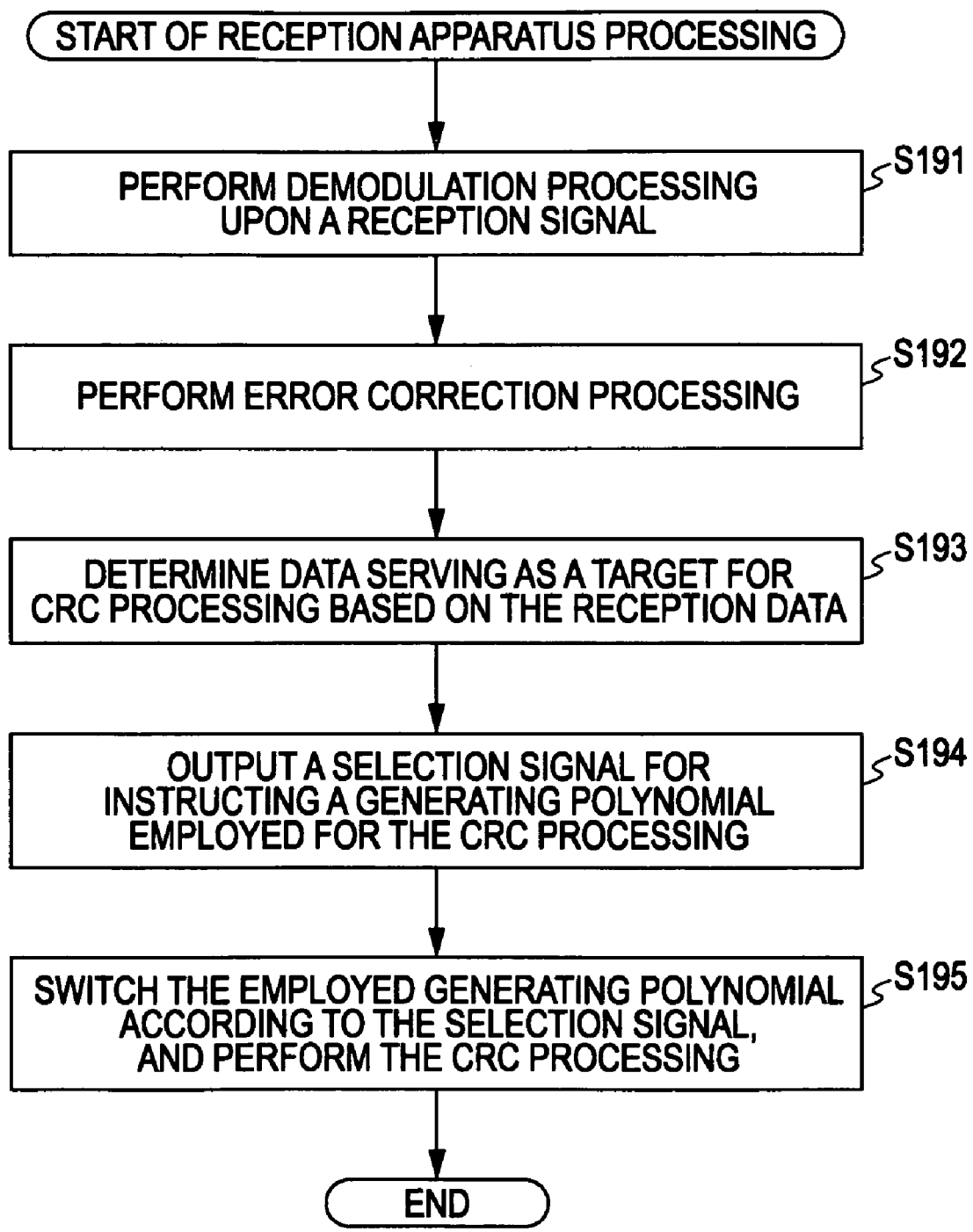

TRANSMISSION APPARATUS AND METHOD, RECEPTION APPARATUS AND METHOD, AND PROGRAM

CROSS REFERENCES TO RELATED APPLICATIONS

The present application claims priority from Japanese Patent Application No. JP 2007-330457 filed in the Japanese Patent Office on Dec. 21, 2007, and Japanese Patent Application Nos. JP 2008-118547 and JP 2008-118548, filed in the Japanese Patent Office on Apr. 30, 2008, the entire contents of which are incorporated herein by reference.

BACKGROUND OF THE INVENTION

1. Field of the Invention

The present invention relates to a transmission apparatus and method, reception apparatus and method, and program, and specifically, relates to a transmission apparatus and method, reception apparatus and method, and program whereby a more appropriate generating polynomial can be employed by being switched according to the data to be processed.

2. Description of the Related Art

With an information recording apparatus, communication apparatus, and so forth, when transmitting information (data) through a transmission line, the transmitted information sometimes includes an error.

There is a CRC (Cyclic Redundancy Check) as a technique widely employed serving as a method for detecting whether or not the information includes an error. In order to perform CRC, information to be transmitted has to be subjected to CRC encoding beforehand. CRC encoding will be described with reference to FIG. 1.

In FIG. 1, a transmission apparatus 1 and reception apparatus 3 are connected through a transmission line 2. CRC is employed for detection of error correction by error correction decoding by subjecting a CRC code obtained by adding a CRC parity to an information word (data) to error correction encoding such as the Reed-Solomon code or the like, with the transmission apparatus 1.

With the transmission apparatus 1, input information series wherein multiple information words (data) are continued, serving as a CRC encoding target to be transmitted, are input to a CRC encoder 11, and are subjected to CRC encoding. The details of the CRC encoder 11 will be described later with reference to FIG. 2. The information subjected to CRC encoding is input to an error correction encoder 12, and is subjected to error correction encoding such as Reed-Solomon Code or the like. The information subjected to error correction encoding is input to a transmission line encoder 13, subjected to transmission line encoding processing according to a transmission line 2, and transmitted to the transmission line 2.

The signal passed through the transmission line 2 is detected by a code detector 31 of the reception apparatus 3, and the detected information is input to a transmission line decoder 32. The detected information series subjected to transmission line decoding by the transmission line decoder 32 are subjected to error correction such as the Reed-Solomon code or the like, which corresponds to the processing of the error correction encoder 12, by the error correction decoder 33. The error-corrected information is next input to a CRC detector 34. The CRC detector 34 subjects the error-corrected detected series to CRC processing, determines whether or not error correction is correctly performed (whether or not the detected series include an error), and outputs the result thereof as a matching signal. The details of the CRC detector 34 will be described later with reference to FIG. 5.

The matching signal output from the CRC detector 34 is employed for improvement in reliability by performing a retransmission request with a controller of a drive of an information recording apparatus, for example.

As other applications of CRC codes, a CRC code is employed as part of a post processor with a code detector, or and is employed for header information, a transmission packet with packet communication. Also, a CRC code is employed as an elimination flag for error correction.

Error Detection Principle Employing CRC Code

Error detection principle employing a CRC code will be described. When an r-bit parity is added to an information word (data) made up of k bits to obtain a code word of a code length n (n=k+r) bits, a (k−1) order information polynomial M(x) wherein the information word is represented with a polynomial is multiplied by x'. For example, in a case wherein the information is "1010101" in binary, the information polynomial M(x) is represented with $x^6+x^4+x^2+1$.

A result M(x)·x' wherein the information polynomial M(x) is multiplied by x' is obtained in accordance with the following Expression (1) by employing a remainder polynomial R(x) (order is (r−1) order) at the time of dividing by an r-order generating polynomial G(x), and a quotient polynomial Q(x), thereby making up an (n−1) order code polynomial W(x) such as the following Expression (2).

$$M(x) \cdot x' = Q(x) \cdot G(x) + R(x) \quad (1)$$

$$W(x) = M(x) \cdot x' - R(x) \quad (2)$$

The code polynomial becomes W(x)=Q(x)·G(x) from a relation between Expressions (1) and (2). Accordingly, the code polynomial W(x) can be divided by the generating polynomial G(x) without a remainder.

According to the above-mentioned perspective, for example, when the reception apparatus 3 receives a polynomial (hereafter, referred to as "reception polynomial Y(x)") which is the code polynomial W(x) which the transmission apparatus 1 in FIG. 1 transmitted to the reception apparatus 3 through the transmission line 2, the CRC detector 34 of the reception apparatus 3 determines whether or not the reception polynomial Y(x) can be divided by the generating polynomial G(x) without a remainder.

When the reception polynomial Y(x) can be divided by the generating polynomial G(x) without a remainder, the reception polynomial Y(x) is identical to the code polynomial W(x), so it can be estimated that no error has occurred in the information word at the transmission line 2, but in a case wherein the reception polynomial Y(x) can be divided by the generating polynomial G(x) with a remainder, the reception polynomial Y(x) is not the code polynomial W(x), so determination can be made (estimation can be made) that an error has occurred in the information word at the transmission line 2.

A CRC code is a cyclic code, so as long as the generating polynomial G(x) is determined, for example, the circuit configuration of the CRC encoder 11 within the transmission apparatus 1 in FIG. 1 can be relatively readily configured as an apparatus by employing a shift register and an exclusive OR.

Example of CRC Encoder

Examples of the generating polynomial G(x) widely employed with the CRC includes $G(x)=x^{16}+x^{12}+x^5+1$ based on the CRC-CCITT standard which is the 16-bit CRC, and $G(x)=x^{16}+x^{15}+x^2+1$ based on the CRC-ANSI standard.

Description will be made below regarding a configuration example of the CRC encoder (CRC encoding circuit) 11 with the transmission apparatus 1 in FIG. 1 in the case of employing a generating polynomial $G(x)=x^3+x+1$ when the number of parity bits (order) is r=3, with reference to FIG. 2.

FIG. 2 is a diagram illustrating a configuration example of the CRC encoder 11 for generating the code polynomial W(x) from the information polynomial M(x).

The CRC encoder 11 includes a CRC parity generator 110, first selector 111, second selector 112, and number-of-bits counter 113.

The CRC parity generator 110 generates an r-bit CRC parity regarding k-bit information bit series to output this to the first selector 111. A parity generating method at the CRC parity generator 110 will be described with reference to FIGS. 3 and 4.

The second selector 112 outputs the input information bit series based on a status control signal S1 from the number-of-bits counter 113 during a period wherein the k-bit information bit series are input to a "0" input terminal. Also, when input of the information bit series to the "0" input terminal is ended, the second selector 112 outputs the r-bit parity generated at the CRC parity generator 110 which is input to a "1" input terminal through the first selector 111. Thus, "k-bit information bit series" and subsequent "r-bit parity bit generated at the CRC parity generator 110 based on the information bit series" are output from the second selector 112 of the CRC encoder 11. Thus, the code bit series output from the second selector 112 becomes code bit series of a code length n=k+r, which are made up of "k-bit information bit series" and "r-bit parity bit".

The CRC parity generator 110 and first selector 111 will be described. FIG. 3 illustrates a circuit example of the CRC parity generator 110 in the case of employing $G(x)=x^3+x+1$ as the generating polynomial G(x).

The CRC parity generator 110 in FIG. 3 is connected with a first shift register R00, first exclusive OR (EXOR) circuit EXOR1, second shift register R01, third shift register R02, and second exclusive OR circuit EXOR2 in a cyclic manner, and the output of the second exclusive OR circuit EXOR2 is input to the first exclusive OR circuit EXOR1.

Note that a circuit diagram example of the CRC parity generator 110 in the case of employing the generating polynomial $G(x)=x^4+x^3+x^2+x+1$ will be shown in FIG. 4.

The CRC parity generator 110 in FIG. 4 is connected with a first shift register R00, first exclusive OR (EXOR) circuit EXOR1, second shift register R01, second exclusive OR circuit EXOR2 in a cyclic manner, third shift register RO2, third exclusive OR circuit EXOR3, fourth shift register R03, and fourth exclusive OR circuit EXOR4, and the output of the fourth exclusive OR circuit EXOR4 is input to the first, second, and third exclusive OR circuits EXOR1, EXOR2, and EXOR3.

As illustrated in FIGS. 3 and 4, the CRC parity generator 110 is configured based on the generating polynomial G(x). In other words, as can be understood from the illustrations in FIGS. 3 and 4, as long as the generating polynomial G(x) is determined, the CRC parity generator 110 can be configured as a circuit wherein shift registers and exclusive OR circuits are connected in a cyclic manner, and the output of the exclusive OR circuit on the final stage, e.g., the output of the second exclusive OR circuit EXOR2 in FIG. 3 or fourth exclusive OR circuit EXOR4 in FIG. 4 is applied to the exclusive OR circuit on the previous stage thereof.

Description will be made below regarding the operation of the CRC parity generator 110 illustrated in FIG. 3. The operation of the CRC parity generator 110 illustrated in FIG. 4 is basically the same as the operation of the CRC parity generator 110 illustrated in FIG. 3. In FIG. 3, the information bit series represented with the information polynomial M(x) are input to the second exclusive OR circuit EXOR2 which is upstream of the third shift register R02 for each point-in-time, e.g., for each clock wherein a shift register is operated, in order from high-order term of information bit series one at a bit, whereby the bit series $M(x) \cdot x'$ wherein the information polynomial M(x) is multiplied by x' is input to the CRC parity generator 110.

Here, the initial values of the first through third shift registers R00, R01, and R02 are zero.

The values held at the first through third shift registers R00, R01, and R02 at the time of input of the zero-order terms of the information bit series to the CRC parity generator 110 being completed provide the coefficient of each order of the remainder polynomial R(x). That is to say, the remainder polynomial R(x) becomes R(x)=(content held in the R02)×$x^2$+(content held in the R01)×x+(content held in the R00).

Therefore, an enable signal E0 output from an unshown control circuit in FIG. 2 becomes disable (inactive state) at the time of input of the zero-order terms of the information bit series to the CRC parity generator 110 being completed, the values held in the first through third shift registers R00, R01, and R02 of the CRC parity generator 110 are held, and output to the first selector 111.

In FIG. 2, for example, the output from the CRC parity generator 110 of which the circuit configuration is illustrated in FIG. 3 to three input terminals 00, 01, and 10 of the first selector 111 are the outputs $R00_{out}$, $R01_{out}$, and $R02_{out}$ of the respective shift registers R00, R01, and R02 of the CRC parity generator 110, and the first selector 111 selects one of the outputs $R00_{out}$, $R01_{out}$, and $R02_{out}$ from the CRC parity generator 110 input to the three input terminals 00, 01, and 10 in order in accordance with a first selection signal S0 output from the unshown control circuit in FIG. 2, and outputs this to the "1" input terminal of the second selector 112.

The second selector 112 selects the information bit series input to the "0" input terminal during a period wherein the k-bit information bit series is input to the "0" input terminal of the second selector 112 in accordance with a second selection signal S1 output from the number-of-bits counter 113 controlled from the unshown control circuit in FIG. 2, in other words, in accordance with the bit count value of the number-of-bits counter 113, and outputs the information bit series as is. On the other hand, the second selector 112 selects and outputs the output of the first selector 111 input to the "1" input terminal of the second selector 112, i.e., the parity generated in the CRC parity generator 110 at timing wherein input of the information bit series to the CRC parity generator 110 has been completed, and all of the parities have been generated.

Thus, for example, code bit series output from the second selector 112 of the CRC encoder 11 in FIG. 2 are, as described above, made up of "k-bit information bit series" and "r-bit parity bit". Accordingly, the code bit series becomes code bit series of a code length n=k+r.

For example, with the transmission apparatus 1 in FIG. 1, as described above, the code bit series subjected to the CRC encoding at the CRC encoder 11 are input to the error correction encoder 12, and are subjected to, for example, error correction encoding such as the Reed-Solomon code or the like. The information subjected to error correction encoding is input to the transmission line encoder 13, and is subjected to transmission line encoding processing according to the transmission line 2, and is transmitted to the transmission line 2.

The signal passed through the transmission line 2 is detected by the code detector 31 of the reception apparatus 3, and the detected information is input to the transmission line decoder 32. The detected information series subjected to transmission line decoding by the transmission line decoder 32 are subjected to error correction by the error correction decoder 33. The error-corrected information is determined at the CRC detector 34 regarding whether or not the detected series include an error.

FIG. 5 is a diagram illustrating a configuration example of the CRC detector 34 for inspecting whether or not the reception polynomial Y(x) includes an error. The CRC detector 34 includes a CRC parity checker 341, and comparator 342.

The CRC parity checker 341 examines, as described above, whether or not the reception polynomial Y(x) can be divided by the generating polynomial G(x) without a reminder, and in a case wherein the reception polynomial Y(x) can be divided by the generating polynomial G(x) without a reminder, the reception polynomial Y(x) is identical to the code polynomial W(x), and accordingly, determines that no error has occurred in the information word at the transmission line 2, but in a case wherein the reception polynomial Y(x) can be divided by the generating polynomial G(x) with a reminder, the reception polynomial Y(x) is not identical to the code polynomial W(x), so determines that an error has occurred in the information word at the transmission line 2.

The CRC parity checker 341 is a circuit for dividing the reception polynomial Y(x) by the generating polynomial G(x), and the comparator 342 is a circuit for determining whether or not the result divided by the CRC parity checker 341 includes a remainder.

FIG. 6 illustrates a configuration example of the CRC parity checker 341. The configuration of the CRC parity checker 341 illustrated in FIG. 6 corresponds to the CRC parity generator 110 illustrated in FIG. 3. In a case wherein the CRC parity generator 110 has the circuit configuration in FIG. 4, the CRC parity checker 341 also has a circuit configuration according thereto. Description will be made below regarding the CRC parity checker 341 corresponding to the CRC parity generator 110 illustrated in FIG. 3.

The CRC parity checker 341 illustrated in FIG. 6 is connected with a first exclusive OR circuit EXOR11, first shift register R10, second exclusive OR circuit EXOR12, second shift register R11, and third shift register R12 in a cyclic manner, and has a circuit configuration wherein the output of the third shift register R12 is input to the second exclusive OR circuit EXOR12.

With the CRC parity checker 341 in FIG. 6, the reception bit series represented with the reception polynomial Y(x) are input to the first exclusive OR circuit EXOR11 on the right edge of the first shift register R10 one bit at a time in order from a high order term for each point-in-time. The values held at the first through third shift registers R10, R11, and R12 at the time of input of the zero-order terms of the reception bit series to the CRC parity checker 341 being completed provide the coefficients of the remainder polynomial R(x). That is to say, R(x)=(value of the R12)×x²+(value of the R11)×x+ (value of the R10). Here, the initial values of the first through third shift registers R10, R11, and R12 are zero.

In FIG. 5, the outputs R11 out, R11 out, and R12$_{out}$ to the comparator 342 from the CRC parity checker 341 are the outputs of the respective registers R10, R11, and R12 of the CRC parity checker 341 in FIG. 6.

The comparator 342 compares (determines) whether or not all of the values of the R10$_{out}$, R11$_{out}$, and R12$_{out}$ are zero, i.e., the remainder is zero, and outputs a one-bit matching signal representing whether or not all of the values of the R10$_{out}$, R11$_{out}$, and R12$_{out}$ are zero. That is to say, in a case wherein all of the values of the R10$_{out}$, R11$_{out}$, and R12$_{out}$ are zero, the reception polynomial Y(x) is identical to the code polynomial W(x), for example, a matching signal of logic "1" representing that determination is made that no error has occurred in the information word at the transmission line 2 is output from the comparator 342, or otherwise, for example, a matching signal of logic "0" is output.

The error detection capability of the CRC is generally evaluated with random error detection capability, burst error detection capability, and undetected error probability P$_{ud}$ for codes and is determined with the generating polynomial G(x) and code length n.

Now, the undetected error probability P$_{ud}$ for codes means probability wherein determination is made that there is no error in spite of the reception word changing to a code word different from the transmitted code word (a cord word wherein a CRC parity is calculated as to an information bit different from the provided information bit) due to an error occurred on the transmission line. The original code word is changed to a different code word, and accordingly, the remainder becomes zero even if the CRC is employed. That is to say, there is a case wherein while the reception word includes an error, determination is made that there is no error.

For example, as disclosed in J. K. Wolf, R. D. Blakeney, "An exact evaluation of the probability of undetected error for certain shortened binary CRC codes," Military Communications Conference, 1988, MILCOM 88, Conference record, '21st Century Military Communications—What's Possible?', 1988 IEEE, vol. 1, pp. 287-292, October 1988, the undetected error probability P$_{ud}$ for codes are represented with order (number of parities) r, code length n, a weight distribution A obtained by the generating polynomial G(x) and code length n being determined, or a dual code weight distribution B, and channel bit error probability (transition probability) ϵ at a binary symmetric channel, such as the following.

$$P_{ud} = \sum_{i=1}^{n} A_i \varepsilon^i (1-\varepsilon)^{n-i} \quad (3)$$

$$P_{ud} = 2^{-r} \sum_{i=0}^{n} B_i (1-2\varepsilon)^i - (1-\varepsilon)^n \quad (4)$$

With regard to the random error detection capability, all the ($d_{min}$−1) or less errors can be detected. However, a great number of errors other than those can be detected.

Also, with regard to the burst error detection capability, all the errors of which the length is the order of the generating polynomial G(x) or less can be detected. However, even with regard to burst errors of which the length is greater than the order of the generating polynomial, most of the errors can be detected.

With J. K. Wolf, R. D. Blakeney, "An exact evaluation of the probability of undetected error for certain shortened binary CRC codes," Military Communications Conference, 1988, MILCOM 88, Conference record, '21st Century Military Communications—What's Possible?', 1988 IEEE, vol. 1, pp. 287-292, October 1988, T. Baicheva, S. Dodunekov, "Undetected error probability performance of cyclic redundancy-check codes of 16-bit redundancy," IEE Proc. Comm., vol. 147, no. 5, pp. 253-256, October 2000, P. Kazakov, "Fast Calculation of the Number of Minimum-Weight Words of CRC Codes," IEEE Trans. Inform. Theory, vol. 47, no. 3, pp. 1190-1195, March 2001, P. Koopman, "Cyclic Redundancy Code (CRC) Polynomial Selection For Embedded Networks," The International Conference on Dependable System and Networks, DSN-2004, G. Castagnoli, J. Ganz, P. Graber, "Optimum Cyclic Redundancy-Check Codes with 16-Bit Redundancy," IEEE Trans. Comm., vol. 38, no. 1, pp. 111-114, January 1990, G. Funk, "Determination of Best Shortened Codes," IEEE Trans. Comm., vol. 44, no. 1, pp. 1-6, January 1996, D. Chun, J. K. Wolf, "Special Hardware for Computing the Probability of Undetected Error for Certain CRC Codes and Test Results," IEEE Trans. Comm., vol. 42, no. 10, pp. 2769-2772, October 1994, and G. Castagnoli, S. Brauer, M. Herrmann, "Optimum of Cyclic Redundancy-Check Codes with 24 and 32 Parity Bits," IEEE Trans. Comm., vol. 41, no. 6, pp. 883-892, June 1993, various reports have been made regarding a generating polynomial for minimizing undetected error probability for codes, and various generating polynomials have been proposed according to the order (number of parities) of a generating polynomial and code length.

With T. Baicheva, S. Dodunekov, "Undetected error probability performance of cyclic redundancy-check codes of 16-bit redundancy," IEE Proc. Comm., vol. 147, no. 5, pp. 253-256, October 2000, and P. Kazakov, "Fast Calculation of the Number of Minimum-Weight Words of CRC Codes," IEEE Trans. Inform. Theory, vol. 47, no. 3, pp. 1190-1195, March 2001, a generating polynomial has been proposed wherein with the 16-bit CRC, undetected error probability for codes is suppressed to the minimum as to each code length.

Also, with G. Castagnoli, J. Ganz, P. Graber, "Optimum Cyclic Redundancy-Check Codes with 16-Bit Redundancy," IEEE Trans. Comm., vol. 38, no. 1, pp. 111-114, Jan. 1990, and G. Castagnoli, S. Brauer, M. Herrmann, "Optimum of Cyclic Redundancy-Check Codes with 24 and 32 Parity Bits," IEEE Trans. Comm., vol. 41, no. 6, pp. 883-892, June 1993, it has been confirmed that the undetected error probability $P_{ud}$ for codes exhibit properties wherein when the code length n changes, the undetected error probability $P_{ud}$ for codes enormously increases with a code length wherein the minimum hamming distance $d_{min}$ for codes changes as a boundary.

FIG. 7 is a graph illustrating the minimum (limited) undetected error probability properties in the case of the 8-bit CRC as an example. In FIG. 7, the horizontal axis indicates the code length n (bits), and the vertical axis indicates the undetected error probability $P_{ud}$ for codes. This will be referred to as n-$P_{ud}$ properties.

With J. M. Stein, "METHOD FOR SELECTING CYCLIC REDUNDANCY CHECK POLYNOMIALS FOR LINEAR CODED SYSTEMS", U.S. Pat. No. 6,085,349, Qaulcomm Incorporated, Filed Aug. 27, 1997, an invention relating to a selecting method of a CRC generating polynomial has been disclosed.

With J. M. Stein, "METHOD FOR SELECTING CYCLIC REDUNDANCY CHECK POLYNOMIALS FOR LINEAR CODED SYSTEMS", U.S. Pat. No. 6,085,349, Qaulcomm Incorporated, Filed Aug. 27, 1997, when the order of a generating polynomial is given, a generating polynomial is selected based on a distance spectrum calculated for all of the generating polynomials of the order thereof. This distance spectrum is a table representing the number of code words at each of hamming distances. Thus, a generating polynomial having the maximum minimum hamming distance is selected, and a generating polynomial for minimizing the undetected error probability for codes is selected.

SUMMARY OF THE INVENTION

As described above, CRC error detection capabilities (undetected error probability, random error detection capability, and burst error detection capability) are determined with a generating polynomial and code length.

With all of the code lengths, there is neither a generating polynomial wherein the undetected error probability for codes is the minimum (limited value) nor a generating polynomial wherein the minimum hamming distance for codes is the maximum, and a generating polynomial wherein the undetected error probability is the minimum, and a generating polynomial of which the minimum hamming distance for codes is the maximum differ according to a code length.

That is to say, with regard to the widely employed CCITT standard and ANSI standard, generating polynomials shown in P. Koopman, "Cyclic Redundancy Code (CRC) Polynomial Selection For Embedded Networks," The International Conference on Dependable System and Networks, DSN-2004, G. Castagnoli, J. Ganz, P. Graber, "Optimum Cyclic Redundancy-Check Codes with 16-Bit Redundancy," IEEE Trans. Comm., vol. 38, no. 1, pp. 111-114, Jan. 1990, G. Funk, "Determination of Best Shortened Codes," IEEE Trans. Comm., vol. 44, no. 1, pp. 1-6, January 1996, D. Chun, J. K. Wolf, "Special Hardware for Computing the Probability of Undetected Error for Certain CRC Codes and Test Results," IEEE Trans. Comm., vol. 42, no. 10, pp. 2769-2772, October 1994, and G. Castagnoli, S. Brauer, M. Herrmann, "Optimum of Cyclic Redundancy-Check Codes with 24 and 32 Parity Bits," IEEE Trans. Comm., vol. 41, no. 6, pp. 883-892, June 1993, and so forth, a code length range wherein the undetected error probability for codes is the minimum, and the minimum hamming distance for codes is the maximum, is limited.

With most of the above-mentioned documents, in a case wherein a code length is long (several thousand bits or more) with data communication or the like, a design has been made such that the undetected error probability for codes becomes the minimum (limited value). There is a generating polynomial which exhibits further excellent performance in a case wherein a code length is shorter, such as a case wherein the CRC is employed for header information, a case wherein the CRC is employed for data recording to a recording medium such as an optical disc or the like, and so forth.

With T. Baicheva, S. Dodunekov, "Undetected error probability performance of cyclic redundancy-check codes of 16-bit redundancy," IEE Proc. Comm., vol. 147, no. 5, pp. 253-256, October 2000, P. Kazakov, "Fast Calculation of the Number of Minimum-Weight Words of CRC Codes," IEEE Trans. Inform. Theory, vol. 47, no. 3, pp. 1190-1195, March 2001, and so forth, there have been proposed a generating polynomial wherein the undetected error probability for codes is the lowest for each code length, but in this case, when employing this generating polynomial with a different code length, a different generating polynomial has to be employed in each case.

For example, with J. M. Stein, "METHOD FOR SELECTING CYCLIC REDUNDANCY CHECK POLYNOMIALS FOR LINEAR CODED SYSTEMS", U.S. Pat. No. 6,085,349, Qaulcomm Incorporated, Filed Aug. 27, 1997, a generating polynomial wherein the minimum hamming distance for codes has the maximum value for each code length is selected, but this includes a problem for leading to increase in a circuit scale.

With an actual system, generating polynomials with various code lengths and various parity lengths are employed, but the CRC code optimal for all of the code lengths and parity lengths has not been clarified so far, so only with currently available CRC codes, it is not sufficient to obtain the minimum undetected error probability $P_{ud}$ with an actual system.

Accordingly, there has been demand for a generating polynomial wherein the undetected error probability for codes can be reduced as less as possible with a given code length and parity length, the minimum hamming distance for codes can be increased as much as possible, and the generating polynomial can be used in a code length range as wide as possible.

Further, for example, in a case wherein the CRC encoder employed for the transmission apparatus 1 in FIG. 1, and the CRC detector employed for the reception apparatus 3 are configured as a circuit, a CRC encoding method has been requested whereby the circuit thereof can be simplified.

There has been recognized a demand to provide a more appropriate generating polynomial which can be employed by being switched according to the data to be processed.

A transmission apparatus according an embodiment of the present invention includes: a CRC encoding processing unit configured to include multiple generating polynomials for an CRC encoding processing with each of a plurality of data of which the code lengths differ as a target, and employ the optimal generating polynomial out of the multiple generating polynomials to perform the CRC encoding processing; and a transmission unit configured to transmit data obtained by the CRC encoding processing unit performing the CRC encoding processing.

The multiple generating polynomials may be generating polynomials selected by processing which includes a first process for obtaining the maximum minimum hamming distance (Max.$d_{min}$) which is the maximum value of the minimum hamming distance ($d_{min}$) with a code length (n) of each of codes having a k-bit information word to which an r-bit parity is added, a second process for obtaining a code length (n) changed in the maximum minimum hamming distance (Max.$d_{min}$) for codes, and obtaining a range of ($n_{min}$(r, Max.$d_{min}$)≦n≦$n_{max}$(r, Max.$d_{min}$)) of the code length (n) thereof, a third process for finding out a generating polynomial (G(x)) satisfying a condition ($d_{min}$=Max.$d_{min}$) wherein with the range ($n_{min}$(r, Max.$d_{min}$)≦n≦$n_{max}$(r, Max.$d_{min}$)) of the code length (n), the minimum hamming distance ($d_{min}$) is equal to the maximum minimum hamming distance (Max.$d_{min}$) for codes, by global search, and a fourth process for selecting out a generating polynomial of which the number of terms (w) and the undetected error probability ($P_{ud}$) are minimal out of the generating polynomial (G(x)) found out by the global search.

A transmission method or program according an embodiment of the present invention includes the steps of: performing the CRC encoding processing by employing the optimal generating polynomial out of the multiple generating polynomials; and transmitting data obtained by performing the CRC encoding processing.

A transmission apparatus according an embodiment of the present invention includes: an obtaining unit configured to obtain data based on a signal transmitted from a transmission apparatus; and a CRC processing unit configured to include multiple generating polynomials for a CRC encoding processing with each of a plurality of data of which the code lengths differ as a target, and detect an error of data by employing the optimal generating polynomial out of the multiple generating polynomials to perform the CRC encoding processing.

The multiple generating polynomials may be generating polynomials selected by processing which includes a first process for obtaining the maximum minimum hamming distance (Max.$d_{min}$) which is the maximum value of the minimum hamming distance ($d_{min}$) with a code length (n) of each of codes having a k-bit information word to which an r-bit parity is added, a second process for obtaining a code length (n) changed in the maximum minimum hamming distance (Max.$d_{min}$) for codes, and obtaining a range of ($n_{min}$(r, Max.$d_{min}$)≦n≦$n_{max}$(r, Max.$d_{min}$)) of the code length (n) thereof, a third process for finding out a generating polynomial (G(x)) satisfying a condition ($d_{min}$=Max.$d_{min}$) wherein with the range ($n_{min}$(r, Max.$d_{min}$)≦n≦$n_{max}$(r, Max.$d_{min}$)) of the code length (n), the minimum hamming distance ($d_{min}$) is equal to the maximum minimum hamming distance (Max.$d_{min}$) for codes, by global search, and a fourth process for selecting out a generating polynomial of which the number of terms (w) and the undetected error probability ($P_{ud}$) are minimal out of the generating polynomial (G(x)) found out by the global search.

A reception method or program according an embodiment of the present invention includes the steps of: obtaining data based on a signal transmitted from a transmission apparatus; and detecting an error of data by employing the optimal generating polynomial out of the multiple generating polynomials to perform the CRC processing.

With an embodiment of the present invention, CRC encoding processing is performed by employing the optimal generating polynomial of the multiple generating polynomials, and data obtained by the CRC encoding processing being performed is transmitted.

With an embodiment of the present invention, data is obtained based on a signal transmitted from a transmission apparatus, and an error of the data is detected by employing the optimal generating polynomial of the multiple generating polynomials to perform the CRC processing.

According to the present invention, a more appropriate generating polynomial can be employed by being switched according to the data to be processed.

BRIEF DESCRIPTION OF THE DRAWINGS

FIG. 21 is a diagram illustrating simulation results of undetected error probability;

FIG. 29 is a diagram illustrating a list example representing a corresponding relation between data length and a generating polynomial;

FIG. 30 is a diagram illustrating a list example representing a corresponding relation between a data type and a generating polynomial;

FIG. 36 is a flowchart describing processing of the reception apparatus in FIG. 32.

DESCRIPTION OF THE PREFERRED EMBODIMENTS

CRC Code Selecting Method

Figure 7:
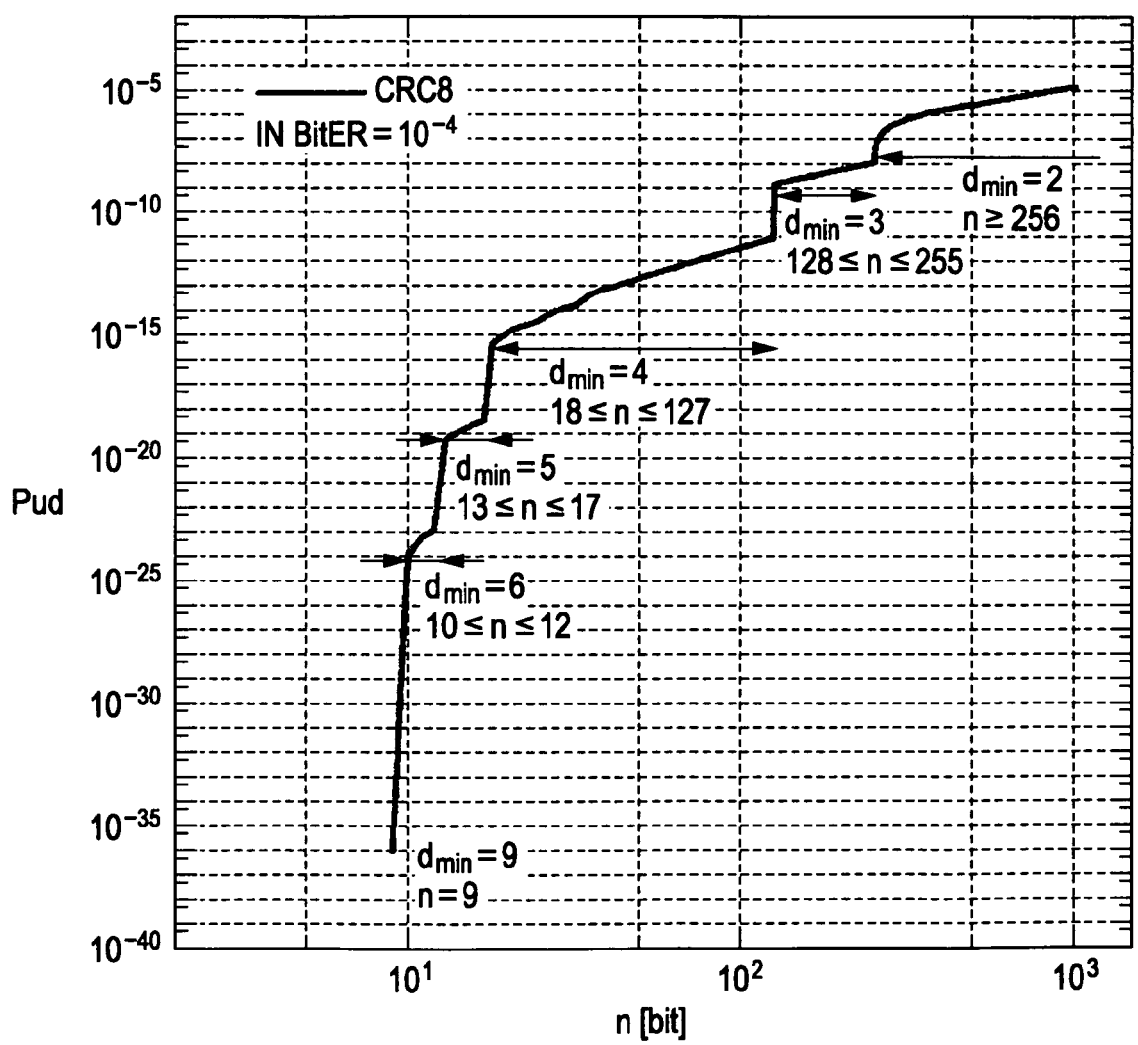
FIG. 7 is a graph illustrating an n-$P_{ud}$ property showing change in undetected error probability $P_{ud}$ (vertical axis) for codes in a code length n (horizontal axis) wherein the minimum hamming distance maximum value Max.$d_{min}$ of codes in the case of 8-bit CRC is changed.

The inventor of the present invention has focused attention on that the property of the undetected error probability $P_{ud}$ for codes suddenly deteriorates with a code length n wherein the minimum hamming distance $d_{min}$ for codes changes as a boundary, as illustrated in FIG. 7. N-$P_{ud}$ property in FIG. 7 shows a limit regarding various types of generating polynomial G(x) with each code length.

With the example shown in FIG. 7 regarding the 8-bit CRC, the undetected error probability $P_{ud}$ for codes suddenly changes at boundaries such as a code length n=10 through 12, 13 through 17, 18 through 127, 128 through 255, and so forth. Also, the code length n wherein the minimum hamming distance $d_{min}$ for codes changes differs depending on a generating polynomial. Further, the minimum hamming distance $d_{min}$ for codes with the code length n differs depending on a generating polynomial.

Figure 8:
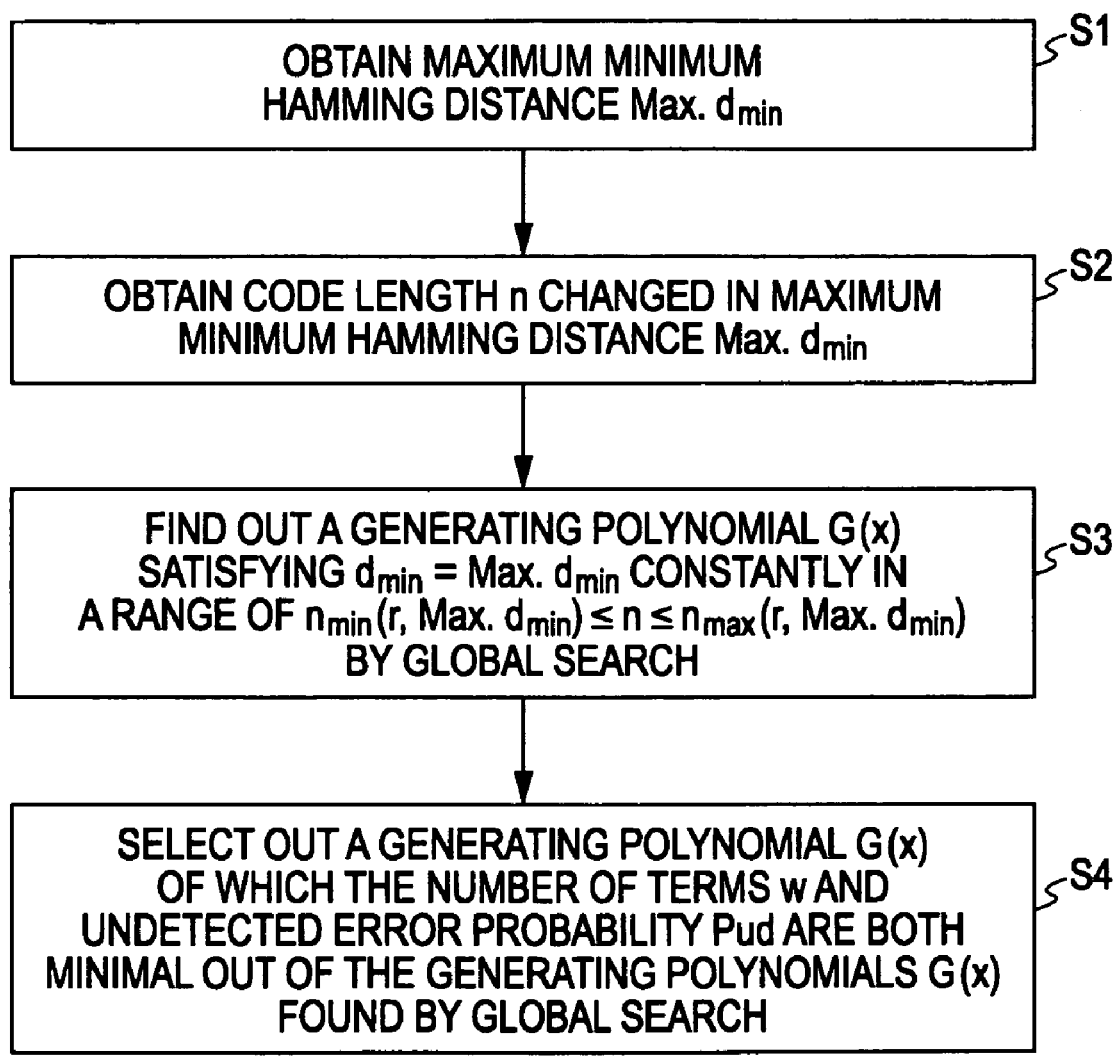
FIG. 8 is a flowchart illustrating an example of the processing content of a CRC code selecting method according to an embodiment of the present invention.

FIG. 8 is a flowchart illustrating an example of the processing content of a CRC code selecting method according to an embodiment of the present invention. Description will be made below regarding the CRC code selecting method according to an embodiment of the present invention by the inventor of the present invention based on the above-mentioned recognition with reference to FIG. 8.

Step S1: Obtain Max.$d_{min}$.

The greater the minimum hamming distance $d_{min}$ for codes is, the higher the random error detection capability is, and the lower the undetected error probability for codes, which is desirable, and accordingly, first, the maximum value of the minimum hamming distance $d_{min}$ (referred to as the maximum minimum hamming distance or the minimum hamming distance maximum value, and represented with Max.$d_{min}$) with each code length of codes of the number of parities (order) r is obtained.

Step S2: Obtain the code length n wherein the Max.$d_{min}$ changes.

Next, the code length n wherein the maximum minimum hamming distance Max.$d_{min}$ changes is obtained, and a range of the code length n wherein the Max.$d_{min}$ is constant is represented with $n_{min}(r, Max.d_{min}) \leq n \leq n_{max}(r, Max.d_{min})$. The $n_{min}(r, Max.d_{min})$ denotes that the minimum range $n_{min}$ of the code length n is stipulated with the r and Max.$d_{min}$, and similarly, the $n_{max}(r, Max.d_{min})$ denotes that the maximum range $n_{max}$ of the code length n is stipulated with the r and Max.$d_{min}$.

FIG. 7 illustrates a case of 8-bit CRC. Note however, that upon the code length n exceeding a cycle p of the generating polynomial G(x), with the example in FIG. 7, at the time of n≧256, the minimum hamming distance $d_{min}$ for codes is 2.

The cycle p of the generating polynomial G(x) becomes the maximum when the generating polynomial G(x) is a primitive polynomial, and the maximum cycle is represented with ($2^r$-1). That is to say, the range of the code length n with Max.$d_{min}$=2 becomes $2^r \leq n \leq \infty$ regardless of the generating polynomial G(x). That is to say, $n_{min}(r, 2)=2^r$, and $n_{max}(r, 2)=\infty$ hold.

Step S3: Find out a G(x) satisfying $d_{min}$=Max.$d_{min}$ with $n_{min} \leq n \leq n_{max}$ by global search.

Next, a generating polynomial which can be employed for the code length n in a range as wide as possible is desirable, so a generating polynomial G(x) satisfying $d_{min}$=Max.$d_{min}$ with $n_{min}(r, Max.d_{min}) \leq n \leq n_{max}(r, Max.d_{min})$ by global search.

Step S4: Select out a G(x) wherein the number of terms w and the undetected error probability $P_{ud}$ for codes are both the minimum out of the G(x) found out by the global search. Further, a generating polynomial G(x) wherein the number of terms w and the undetected error probability $P_{ud}$ for codes are both the minimum is selected out of the generating polynomials G(x) found out by the global search.

Figure 9:
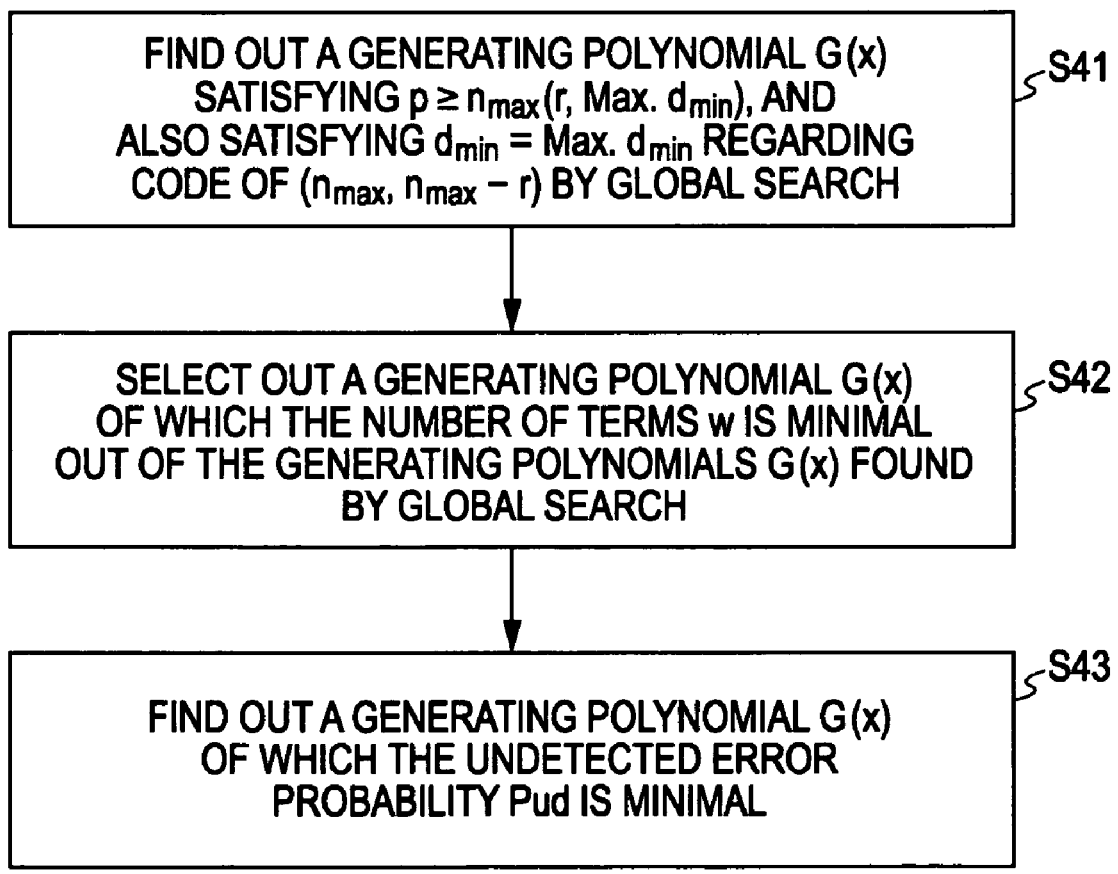
FIG. 9 is a flowchart illustrating partial detailed processing in the flowchart illustrated in FIG. 8.

A specific example regarding the search and selecting method in steps S3 and S4 will be described with reference to FIG. 9.

Step S41: Find out G(x) satisfying p≧$n_{max}$ and also satisfying $d_{min}$=Max.$d_{min}$ regarding a code of ($n_{max}$, $n_{max}$-r) by global search.

First, in order to satisfy $d_{min}$=Max.$d_{min}$ with $n_{min}(r, Max.d_{min}) \leq n \leq n_{max}(r, Max.d_{min})$, p≧$n_{max}(r, Max.d_{min})$ has to be satisfied regarding the cycle p, and also $d_{min}$=Max.$d_{min}$ be satisfied regarding ($n_{max}$, $n_{max}$−r), so a generating polynomial G(x) satisfying this condition is found out by global search.

Step S42: Select a generating polynomial G(x) wherein the number of terms w is the minimum out of the G(x) found out by the global search.

Next, a generating polynomial G(x) wherein the number of terms w is the minimum is selected out of the G(x) found out by the global search. Also, when the number of terms of the G(x) is w, a code word generated with the G(x) includes a code word wherein the hamming distance $d_H$ is w. Accordingly, if the minimum hamming distance $d_{min}$ of a code generated with the G(x) is the maximum minimum hamming distance Max.$d_{min}$, w≧Max.$d_{min}$ holds. Taking this into consideration enables G(x) to be searched in step S41 satisfying w<Max.$d_{min}$ to be omitted.

Step S43: Find out a G(x) of which the $P_{ud}$ is the minimum.

Next, the undetected error probability $P_{ud}$ for codes with $n_{min}$(r, Max.$d_{min}$)≦n≦$n_{max}$(r, Max.$d_{min}$) of the CRC code encoded by employing the generating polynomial G(x) is obtained with Expression (4), and a generating polynomial G(x) wherein the $P_{ud}$ is the minimum is found out.

However, with regard to a case wherein the code length n gets greater, and Max.$d_{min}$=2, as described above, the range of the code length n is $2^r$≦n≦∞ i.e., $n_{min}$ (r, 2)=$2^r$, and $n_{max}$(r, 2)=∞ hold, which prevents the generating polynomial G(x) from being searched with the procedure shown in step S41.

Also, with $2^r$≦n, all of the generating polynomials G(x) satisfy $d_{min}$=Max.$d_{min}$=2. Therefore, a generating polynomial G(x) wherein the number of terms w of in the polynomial and the undetected error probability $P_{ud}$ for codes are both the minimum is selected out of generating polynomials G(x) wherein the cycle p has the maximum cycle $2^r$−1 (primitive polynomial) regarding Max.$d_{min}$=2 by taking a property into consideration wherein the greater the cycle p is at the time of $d_{min}$=2, the lower the undetected error probability $P_{ud}$ for codes is. That is to say, this is identical to the generating polynomial G(x) obtained with Max.$d_{min}$=3. The reason thereof is because $n_{max}$(r, 3)=$2^r$−1 holds.

EMBODIMENTS AND COMPARATIVE EXAMPLES

Examples of the generating polynomial G(x) found out with the above-mentioned method, and comparative examples will be described. Tables 1-A through 1-C show embodiments according to the present invention, and generally employed generating polynomial examples as comparative examples, of the generating polynomial G(x) with each code length of the number of parity bits (order) r=3, 4, 6, 8, 10, 12, 14, and 16.

TABLE 1-A

| | | Max. | EMBODIMENTS | | | | COMPARATIVE EXAMPLES | | | |
|---|---|---|---|---|---|---|---|---|---|---|
| r | n | $d_{min}$ | $d_{min}$ | G(x) | w | $P_{ud}$ | $d_{min}$ | G(x) | w | $P_{ud}$ |
| 3 | 4 | 4 | 4 | F | 4 | $1.0 \times 10^{-16}$ | 3 | B[4] | 3 | $1.0 \times 10^{-12}$ |
| | 5~7 | 3 | — | — | — — | | | | | $2.0 \times 10^{-12}$~$7.0 \times 10^{-12}$ |
| | ≧8 | 2 | — | — | — — | | 2 | | | $1.0 \times 10^{-8}$~ |
| 4 | 5 | 5 | — | — | — — | | 3 | CCITT-4 | 3 | $1.0 \times 10^{-12}$ |
| | 6, 7 | 4 | 4 | 17 | 4 | $3.0 \times 10^{-16}$~$7.0 \times 10^{-16}$ | | | | $2.0 \times 10^{-12}$~$3.0 \times 10^{-12}$ |
| | 8~15 | 3 | — | — | — — | | | | | $4.0 \times 10^{-12}$~$3.5 \times 10^{-11}$ |
| | ≧16 | 2 | — | — | — — | | 2 | | | $1.0 \times 10^{-8}$~ |
| 6 | 7 | 7 | 7 | 7F | 7 | $1.0 \times 10^{-28}$ | 3 | CRC-6 | 3 | $1.0 \times 10^{-12}$ |
| | 8 | 5 | 5 | 57, 5B, 6B | 5 | $2.0 \times 10^{-20}$ | | | | $2.0 \times 10^{-12}$ |
| | 9~31 | 4 | 4 | 47 | 4 | $5.0 \times 10^{-16}$~$1.1 \times 10^{-13}$ | | | | $3.0 \times 10^{-12}$~$7.4 \times 10^{-11}$ |
| | 32~63 | 3 | — | — | — — | | | | | $8.1 \times 10^{-11}$~$6.5 \times 10^{-10}$ |
| | ≧64 | 2 | — | — | — — | | 2 | | | $1.1 \times 10^{-8}$~ |
| 8 | 9 | 9 | 9 | 1FF | 9 | $1.0 \times 10^{-36}$ | 6 (n = 9, 10) | CRC-8 | 6 | $1.0 \times 10^{-24}$ |
| | 10~12 | 6 | 6 | 13B, 14F | 6 | $3.0 \times 10^{-24}$~$1.2 \times 10^{-23}$ | | | | $2.0 \times 10^{-24}$ |
| | | | | | | | 4 (11 ≦ n ≦ 93) | | | $1.0 \times 10^{-16}$~$3.0 \times 10^{-16}$ |
| | 13~17 | 5 | — | — | — — | | | | | $5.0 \times 10^{-16}$~$1.6 \times 10^{-15}$ |
| | 18~127 | 4 | 4 | 113 | 4 | $3.1 \times 10^{15}$~$8.2 \times 10^{-12}$ | | | | $2.0 \times 10^{-15}$~$2.4 \times 10^{-12}$ |
| | | | | | | | 2 (n ≧ 94) | | | $9.9 \times 10^{-9}$~$3.4 \times 10^{-7}$ |
| | 128~255 | 3 | 3 | 12D | 5 | $1.3 \times 10^{-9}$~$1.1 \times 10^{-8}$ | | | | $3.5 \times 10^{-7}$~$2.3 \times 10^{-6}$ |
| | ≧256 | 2 | 2 | 12D | 5 | $2.0 \times 10^{-8}$~ | | | | $2.3 \times 10^{-6}$~ |

TABLE 1-B

| | | Max. | EMBODIMENTS | | | | COMPARATIVE EXAMPLES | | | |
|---|---|---|---|---|---|---|---|---|---|---|
| r | n | $d_{min}$ | $d_{min}$ | G(x) | w | $P_{ud}$ | $d_{min}$ | G(x) | w | $P_{ud}$ |
| 10 | 11 | 11 | 11 | 7FF | 11 | $1.0 \times 10^{-44}$ | 6 (n = 11, 12, 13) | CRC-10 | 6 | $1.0 \times 10^{-24}$ |
| | 12 | 8 | 8 | 55F | 8 | $3.0 \times 10^{-32}$ | | | | $3.0 \times 10^{-24}$ |
| | 13~15 | 7 | — | — | — — | | | | | $6.0 \times 10^{-24}$~$3.0 \times 10^{-16}$ |
| | 16~22 | 6 | — | — | — — | | 4 | | | $5.0 \times 10^{-16}$~$2.8 \times 10^{-15}$ |
| | 23~31 | 5 | 5 | 60B | 5 | $3.9 \times 10^{-19}$~$1.9 \times 10^{-18}$ | | | | $3.4 \times 10^{-15}$~$1.1 \times 10^{-14}$ |
| | 32~511 | 4 | 4 | 425 | 4 | $8.8 \times 10^{-15}$~$5.2 \times 10^{-10}$ | | | | $1.2 \times 10^{-14}$~$5.2 \times 10^{-10}$ |
| | 512~1023 | 3 | 3 | 409 | 3 | $2.1 \times 10^{-8}$~$1.6 \times 10^{-7}$ | 2 | | | $1.0 \times 10^{-8}$~$4.6 \times 10^{-6}$ |
| | ≧1024 | 2 | 2 | 409 | 3 | $1.7 \times 10^{-7}$~ | | | | $4.7 \times 10^{-6}$~ |
| 12 | 13 | 13 | 13 | 1FFF | 13 | $1.0 \times 10^{-52}$ | 6 | CRC-12 | 6 | $1.0 \times 10^{-24}$ |
| | 14 | 9 | 9 | 155F | 9 | $2.0 \times 10^{-36}$ | 4 | | | $1.0 \times 10^{-17}$ |
| | 15~23 | 8 | — | — | — — | | | | | $2.0 \times 10^{-16}$~$1.5 \times 10^{-15}$ |
| | 24~39 | 6 | 6 | 188B | 6 | $6.4 \times 10^{-23}$~$1.8 \times 10^{-21}$ | | | | $1.9 \times 10^{-15}$~$1.5 \times 10^{-14}$ |
| | 40~65 | 5 | 5 | 14E5 | 7 | $1.7 \times 10^{-18}$~$2.2 \times 10^{-17}$ | | | | $1.6 \times 10^{-14}$~$7.2 \times 10^{-14}$ |

TABLE 1-B-continued

| | | Max. | | EMBODIMENTS | | | | COMPARATIVE EXAMPLES | | |
|---|---|---|---|---|---|---|---|---|---|---|
| r | n | $d_{min}$ | $d_{min}$ | G(x) | w | $P_{ud}$ | $d_{min}$ | G(x) | w | $P_{ud}$ |
| | 66~2047 | 4 | 4 | 1085 | 4 | $4.6 \times 10^{-14}$~$2.9 \times 10^{-8}$ | | | | $7.5 \times 10^{-14}$~$2.9 \times 10^{-8}$ |
| | 2048~4095 | 3 | 3 | 10D1 | 5 | $3.0 \times 10^{-7}$~$2.1 \times 10^{-6}$ | 2 | | | $3.7 \times 10^{-8}$~$1.4 \times 10^{-5}$ |
| | ≧4096 | 2 | 2 | 10D1 | 5 | $2.1 \times 10^{-6}$~ | | | | $1.4 \times 10^{-5}$~ |

TABLE 1-C

| | | Max. | | EMBODIMENTS | | | | COMPARATIVE EXAMPLES | | |
|---|---|---|---|---|---|---|---|---|---|---|
| r | n | $d_{min}$ | $d_{min}$ | G(x) | w | $P_{ud}$ | $d_{min}$ | G(x) | w | $P_{ud}$ |
| 14 | 15 | 15 | 15 | 7FFF | 15 | $1.0 \times 10^{-60}$ | 4 | DARC-14 | 4 | $1.0 \times 10^{-16}$ |
| | 16 | 10 | 10 | 56BB | 10 | $2.0 \times 10^{-40}$ | | | | $2.0 \times 10^{-16}$ |
| | 17 | 9 | 9 | 496F | 9 | $3.0 \times 10^{-36}$ | | | | $3.0 \times 10^{-16}$ |
| | 18~25 | 8 | — | — | — | — | | | | $4.0 \times 10^{-16}$~$1.1 \times 10^{-15}$ |
| | 26, 27 | 7 | — | — | — | — | | | | $1.2 \times 10^{-15}$~$1.3 \times 10^{-15}$ |
| | 28~71 | 6 | 6 | 4645 | 6 | $4.6 \times 10^{-23}$~$1.8 \times 10^{-20}$ | | | | $1.4 \times 10^{-15}$~$1.4 \times 10^{-14}$ |
| | 72~127 | 5 | 5 | 4829 | 5 | $8.5 \times 10^{-18}$~$1.6 \times 10^{-16}$ | | | | $1.4 \times 10^{-14}$~$1.2 \times 10^{-13}$ |
| | 128~8191 | 4 | 4 | 4025 | 4 | $9.5 \times 10^{-14}$~$1.0 \times 10^{-6}$ | | | | $1.2 \times 10^{-13}$~$1.0 \times 10^{-6}$ |
| | 8192~16383 | 3 | 3 | 4053 | 5 | $3.1 \times 10^{-6}$~$1.4 \times 10^{-5}$ | 2 | | | $1.0 \times 10^{-6}$~$2.4 \times 10^{-5}$ |
| | ≧16384 | 2 | 2 | 4053 | 5 | $1.4 \times 10^{-5}$~ | | | | $2.4 \times 10^{-5}$~ |
| 16 | 17 | 17 | 17 | 1FFFF | 17 | $1.0 \times 10^{-68}$ | 4 | CC1TT-16 | 4 | $1.0 \times 10^{-17}$ |
| | 18 | 12 | 12 | 1557F | 12 | $3.0 \times 10^{-48}$ | | | | $2.0 \times 10^{-16}$ |
| | 19~21 | 10 | 10 | 132F5, 132BD | 10 | $4.0 \times 10^{-40}$~$2.0 \times 10^{-39}$ | | | | $3.0 \times 10^{-16}$~$5.0 \times 10^{-16}$ |
| | 22 | 9 | 9 | 121D7 | 9 | $1.2 \times 10^{-35}$ | | | | $6.0 \times 10^{-16}$ |
| | 23~31 | 8 | 8 | 1282F | 8 | $1.9 \times 10^{-31}$~$2.8 \times 10^{-30}$ | | | | $7.0 \times 10^{-16}$~$1.5 \times 10^{-15}$ |
| | 32~35 | 7 | — | — | — | — | | | | $1.6 \times 10^{-15}$~$2.2 \times 10^{-15}$ |
| | 36~151 | 6 | 6 | 1A12B | 8 | $4.5 \times 10^{-23}$~$4.6 \times 10^{-19}$ | | | | $2.4 \times 10^{-15}$~$9.7 \times 10^{-14}$ |
| | 152~257 | 5 | 5 | 18103 | 5 | $1.0 \times 10^{-16}$~$1.4 \times 10^{-15}$ | | | | $9.9 \times 10^{-14}$~$5.3 \times 10^{-13}$ |
| | 258~32767 | 4 | 4 | 12005 | 4 | $5.5 \times 10^{-13}$~$7.9 \times 10^{-6}$ | | | | $5.3 \times 10^{-13}$~$7.9 \times 10^{-6}$ |
| | 32768~65535 | 3 | 3 | 10291 | 5 | $9.7 \times 10^{-6}$~$1.5 \times 10^{-5}$ | 2 | | | $7.9 \times 10^{-6}$~$1.5 \times 10^{-5}$ |
| | ≧65536 | 2 | 2 | 10291 | 5 | $1.5 \times 10^{-5}$~ | | | | $1.5 \times 10^{-5}$~ |

The first columns of Tables 1-A through 1-C represents the number of parity bits r, the second columns and third columns are a range of the code length n satisfying the maximum minimum hamming distance Max.$d_{min}$ for codes, and the maximum minimum hamming distance Max.$d_{min}$ thereof, respectively.

The generating polynomials G(x) are described in hexadecimals. For example, "F" in hexadecimals is equal to "1111" in binary number. Also, "12D" in hexadecimals is represented with "100101101" in binary number, which represents the generating polynomial $G(x) = x^8 + x^5 + x^3 + x^2 + 1$.

Also, a polynomial wherein higher-order coefficients and lower-order coefficients are inverted is referred to as a reciprocal polynomial, which exhibits the same property.

The fourth through seventh columns of Tables 1-A through 1-C represent the minimum hamming distance $d_{min}$ for codes, generating polynomial G(x), the number of terms w, and the undetected error probability $P_{ud}$ for codes, which have been generated by employing generating polynomials according to embodiments of the present invention.

The eighth through eleventh columns of Tables 1-A through 1-C represent the minimum hamming distance $d_{min}$ for codes, generating polynomial G(x), the number of terms w, and the undetected error probability $P_{ud}$ for codes, which have been generated by employing generating polynomials according to comparative examples.

With Tables 1-A through 1-C, symbols "–" indicate portions wherein a generating polynomial searched and selected in the above-mentioned steps has already been proposed with other literatures, and the portions thereof will be shown in Table 2 for reference.

TABLE 2

| | | Max. | | LITERATURE VALUES | | |
|---|---|---|---|---|---|---|
| r | n | $d_{min}$ | $d_{min}$ | G(x) | w | $P_{ud}$ |
| 3 | 5~7 | 3 | 3 | B, [4] | 3 | $2.0 \times 10^{-12}$~$7.0 \times 10^{-12}$ |
| | ≧8 | 2 | 2 | B, [4] | 3 | $1.0 \times 10^{-8}$~ |
| 4 | 5 | 5 | 5 | CRC-4, [4] | 5 | $1.0 \times 10^{-20}$ |
| | 8~15 | 3 | 3 | CCITT-4, [4] | 3 | $4.0 \times 10^{-12}$~$3.5 \times 10^{-11}$ |
| | ≧16 | 2 | 2 | CCITT-4, [4] | 3 | $1.0 \times 10^{-8}$~ |
| 6 | 32~63 | 3 | 3 | CRC-6, [4] | 3 | $8.1 \times 10^{-11}$~$6.5 \times 10^{-10}$ |
| | ≧64 | 2 | 2 | CRC-6, [4] | 3 | $1.1 \times 10^{-8}$~ |
| 8 | 13~17 | 5 | 5 | DARC-8, [4] | 5 | $9.0 \times 10^{-20}$~$3.4 \times 10^{-19}$ |
| 10 | 13~15 | 7 | 7 | 537, [6] | 7 | $4.0 \times 10^{-28}$~$1.5 \times 10^{-27}$ |
| | 16~22 | 6 | 6 | 51D, [6] | 6 | $2.1 \times 10^{-23}$~$1.9 \times 10^{-22}$ |
| 12 | 15~23 | 8 | 8 | 149F, [6] | 8 | $6.0 \times 10^{-32}$~$5.1 \times 10^{-30}$ |

TABLE 2-continued

| r | n | Max. $d_{min}$ | $d_{min}$ | LITERATURE VALUES G(x) | w | $P_{ud}$ |
|---|---|---|---|---|---|---|
| 14 | 18~25 | 8 | 8 | 46E3, [6] | 8 | $9.0 \times 10^{-32} \sim 2.2 \times 10^{-30}$ |
|  | 26, 27 | 7 | 7 | 5153, [6] | 7 | $6.6 \times 10^{-27} \sim 8.3 \times 10^{-27}$ |
| 16 | 32~35 | 7 | 7 | 12D17, [4] | 9 | $4.4 \times 10^{-27} \sim 9.8 \times 10^{-27}$ |

The generating polynomials G(x) shown as embodiments of the present invention are generating polynomials wherein $d_{min}$=Max.$d_{min}$ is satisfied with $n_{min}$(r, Max.$d_{min}$)$\leq n \leq n_{max}$(r, Max.$d_{min}$), and further, the number of terms w is the minimum out of the generating polynomials G(x), and further, the undetected error probability $P_{ud}$ for codes is the lowest out thereof.

Figure 10:
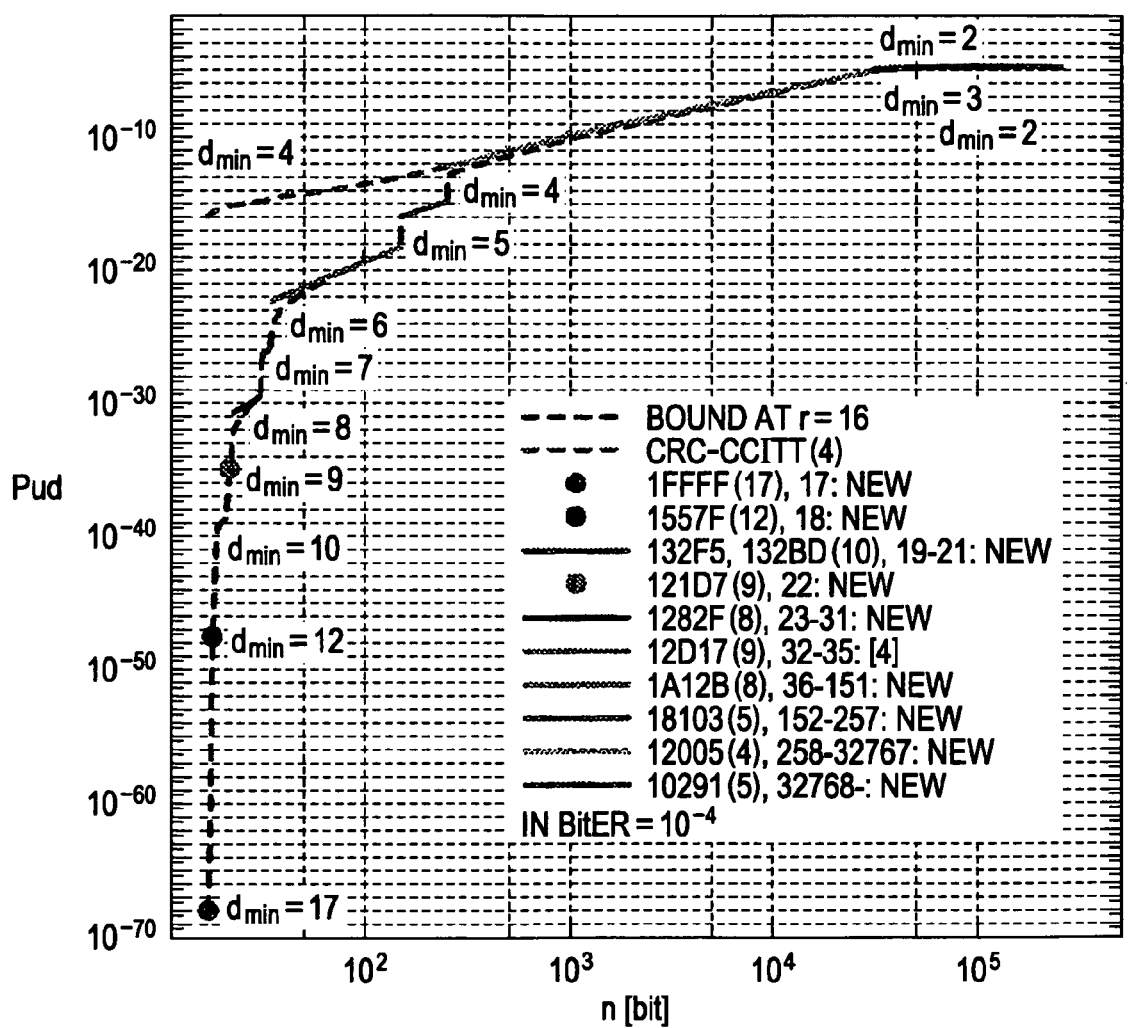
FIG. 10 is a graph illustrating an n-$P_{ud}$ property regarding an embodiment and comparative example with 16-bit CRC.
Figure 11:
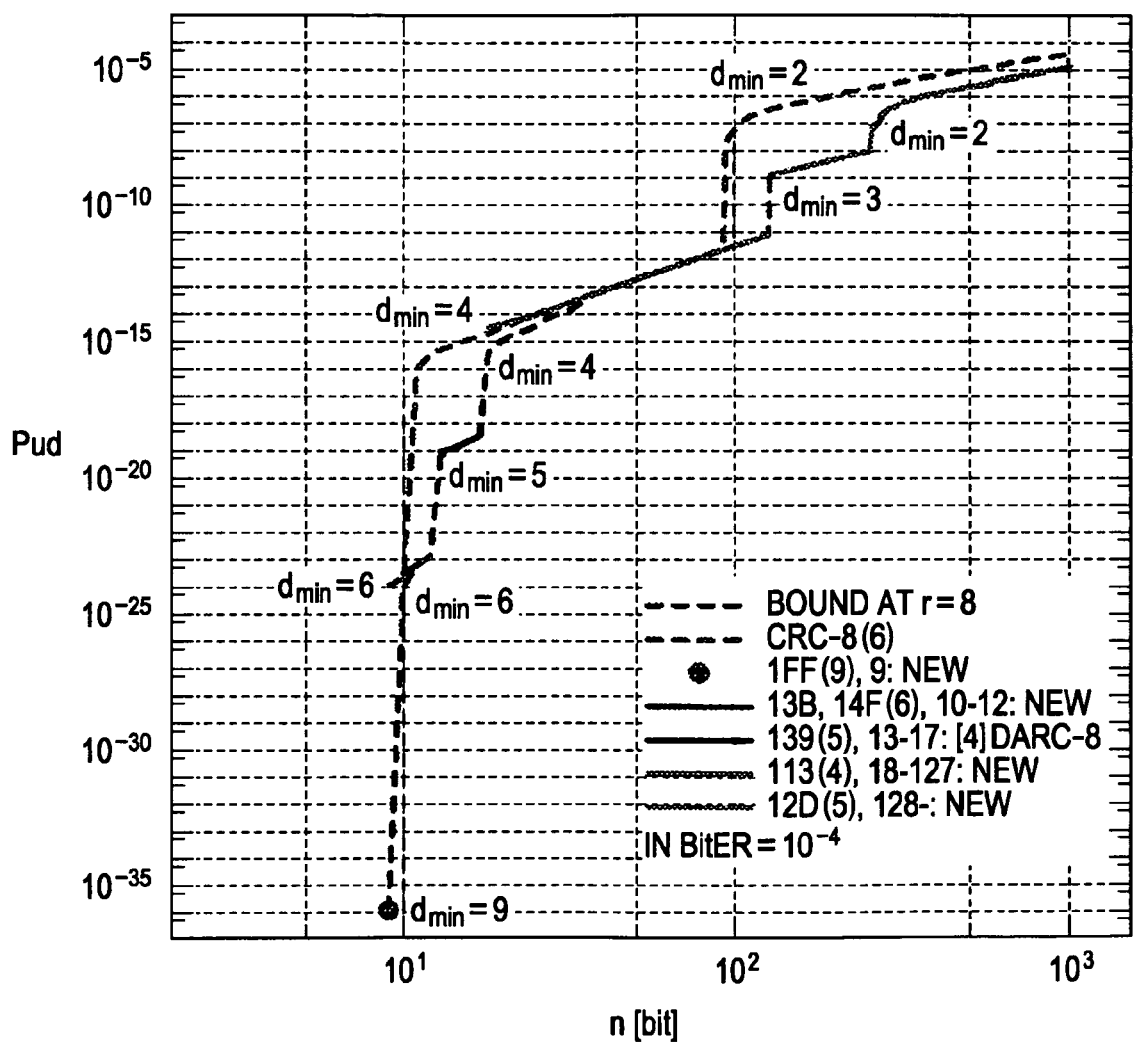
FIG. 11 is a graph illustrating an n-$P_{ud}$ property regarding an embodiment and comparative example with 8-bit CRC.

Further, FIGS. 10 and 11 illustrate a property (n-$P_{ud}$ property) between the code length n with the 16-bit CRC and 8-bit CRC, and the undetected error probability $P_{ud}$ for codes, respectively.

With these examples, a generating polynomial G(x), the number of terms w, Max.$d_{min}$ a constant code length range $n_{min} \leq n \leq n_{max}$ are represented from the left in order, and if "new" is indicated last, this is obtained from the present invention, and bundled with "[ ]" is a generating polynomial which has already been proposed with other literatures, and a numeral therein represents a document number thereof.

Examples of the generating polynomial G(x) thus obtained are arranged and listed below.

(1) When the order r=3, and code length n=4, a generating polynomial G(x)=$x^3+x^2+x+1$ is obtained.

(2) When the order r=4, and code length n is $6 \leq n \leq 7$, a generating polynomial G(x)=$x^4+x^2+x+1$ (reciprocal polynomial: $x^4+x^3+x^2+1$) is obtained.

(3) When the order r=6, and code length n=7, a generating polynomial G(x)=$x^6+x^5+x^4+x^3+x^2+x+1$ is obtained.

(4) When the order r=6, and code length n=8, a generating polynomial G(x)=$x^6+x^4+x^2+x+1$ (reciprocal polynomial: $x^6+x^5+x^4+x^2+1$) is obtained.

(5) When the order r=6, and code length n=8, a generating polynomial G(x)=$x^6+x^4+x^3+x+1$ (reciprocal polynomial: $x^6+x^5+x^3+x^2+1$) is obtained.

(6) When the order r=6, and code length n=8, a generating polynomial G(x)=$x^6+x^5+x^3+x+1$ is obtained.

(7) When the order r=6, and code length n is $9 \leq n \leq 31$, a generating polynomial G(x)=$x^6+x^2+x+1$ (reciprocal polynomial: $x^6+x^5+x^4+1$) is obtained.

(8) When the order r=8, and code length n=9, a generating polynomial G(x)=$x^8+x^7+x^6+x^5+x^4+x^3+x^2+x+1$ is obtained.

(9) When the order r=8, and code length n is $10 \leq n \leq 12$, a generating polynomial G(x)=$x^8+x^5+x^4+x^3+x+1$ (reciprocal polynomial: $x^8+x^7+x^5+x^4+x^3+1$) is obtained.

(10) When the order r=8, and code length n is $10 \leq n \leq 12$, a generating polynomial G(x)=$x^8+x^6+x^3+x^2+x+1$ (reciprocal polynomial: $x^8+x^7+x^6+x^5+x^2+1$) is obtained.

(11) When the order r=8, and code length n is $18 \leq n \leq 127$, a generating polynomial G(x)=$x^8+x^4+x+1$ (reciprocal polynomial: $x^8+x^7+x^4+1$) is obtained.

(12) When the order r=8, and code length n is $n \geq 128$, a generating polynomial G(x)=$x^8+x^5+x^3+x^2+x+1$ (reciprocal polynomial: $x^8+x^6+x^5+x^3+1$) is obtained.

(13) When the order r=10, and code length n=11, a generating polynomial G(x)=$x^{10}+x^9+x^8+x^7+x^6+x^5+x^4+x^3+x^2+x+1$ is obtained.

(14) When the order r=10, and code length n=12, a generating polynomial G(x)=$x^{10}+x^8+x^6+x^4+x^3+x^2+x+1$ (reciprocal polynomial: $x^{10}+x^9+x+x^7+x^6+x^4+x^2+1$) is obtained.

(15) When the order r=10, and code length n is $23 \leq n \leq 31$, a generating polynomial G(x)=$x^{10}+x^9+x^3+x+1$ (reciprocal polynomial: $x^{10}+x^9+x^7+x+1$) is obtained.

(16) When the order r=10, and code length n is $32 \leq n \leq 511$, a generating polynomial G(x)=$x^{10}+x^5+x^2+1$ (reciprocal polynomial: $x^{10}+x^8+x^5+1$) is obtained.

(17) When the order r=10, and code length n is $n \geq 512$, a generating polynomial G(x)=$x^{10}+x^3+1$ (reciprocal polynomial: $x^{10}+x^7+1$) is obtained.

(18) When the order r=12, and code length n=13, a generating polynomial G(x)=$x^{12}+x^{11}+x^{10}+x^9+x^8+x^7+x^6+x^5+x^4+x^3+x^2+x+1$ is obtained.

(19) When the order r=12, and code length n=14, a generating polynomial G(x)=$x^{12}+x^{10}+x^8+x^6+x^4+x^3+x^2+x+1$ (reciprocal polynomial: $x^{12}+x^{11}+x^{10}+x^9+x^8+x^6+x^4+x^2+1$) is obtained.

(20) When the order r=12, and code length n is $24 \leq n \leq 39$, a generating polynomial G(x)=$x^{12}+x^{11}+x^7+x^3+x+1$ (reciprocal polynomial: $x^{12}+x^{11}+x^9+x^5+x+1$) is obtained.

(21) When the order r=12, and code length n is $40 \leq n \leq 65$, a generating polynomial G(x)=$x^{12}+x^{10}+x^7+x^6+x^5+x^2+1$ is obtained.

(22) When the order r=12, and code length n is $66 \leq n \leq 2047$, a generating polynomial G(x)=$x^{12}+x^7+x^2+1$ (reciprocal polynomial: $x^{12}+x^{10}+x^5+1$) is obtained.

(23) When the order r=12, and code length n is $n \geq 2048$, a generating polynomial G(x)=$x^{12}+x^7+x^6+x^4+1$ (reciprocal polynomial: $x^{12}+x^8+x^6+x^5+1$) is obtained.

(24) When the order r=14, and code length n=15, a generating polynomial G(x)=$x^{14}+x^{13}+x^{12}+x^{11}+x^{10}+x^9+x^8+x+x^6+x^5+x^4+x^3+x+x+1$ is obtained.

(25) When the order r=14, and code length n=16, a generating polynomial G(x)=$x^{14}+x^{12}+x^{10}+x^9+x^7+x^5+x^4+x^3+x+1$ (reciprocal polynomial: $x^{14}+x^{13}+x^{11}+x^{10}+x^9+x^7+x^5+x^4+x^2+1$) is obtained.

(26) When the order r=14, and code length n=17, a generating polynomial G(x)=$x^{14}+x^{11}+x^8+x^6+x^5+x^3+x^2+x+1$ (reciprocal polynomial: $x^{14}+x^{13}+x^{12}+x+x^8+x^6+x^3+1$) is obtained.

(27) When the order r=14, and code length n is $28 \leq n \leq 71$, a generating polynomial G(x)=$x^{14}+x^{10}+x^9+x^6+x^2+1$ (reciprocal polynomial: $x^{14}+x^{12}+x^8+x+x+1$) is obtained.

(28) When the order r=14, and code length n is $72 \leq n \leq 127$, a generating polynomial G(x)=$x^{14}+x^{11}+x^5+x^3+1$ (reciprocal polynomial: $x^{14}+x^{11}+x^9+x^3+1$) is obtained.

(29) When the order r=14, and code length n is $128 \leq n \leq 8191$, a generating polynomial G(x)=$x^{14}+x^5+x^2+1$ (reciprocal polynomial: $x^{14}+x^{12}+x^9+1$) is obtained.

(30) When the order r=14, and code length n is $n \geq 8192$, a generating polynomial G(x)=$x^{14}+x^6+x^4+x+1$ (reciprocal polynomial: $x^{14}+x^{13}+x^{10}+x^8+1$) is obtained.

(31) When the order r=16, and code length n=17, a generating polynomial G(x)=$x^{16}+x^{15}+x^{14}+x^{13}+x^{12}+x^{11}+x^{10}+x^9+x^8+x^7+x^6+x^5+x^4+x^3+x^2+x+1$ is obtained.

(32) When the order $r=16$, and code length $n=18$, a generating polynomial $G(x)=x^{16}+x^{14}+x^{12}+x^{10}+x^8+x^6+x^5+x^4+x^3+x^2+x+1$ (reciprocal polynomial: $x^{16}+x^{15}+x^{14}+x^{13}+x^{12}+x^{11}+1+x^8+x^6+x^4+x^2+1$) is obtained.

(33) When the order $r=16$, and code length n is $19 \leq n \leq 21$, a generating polynomial $G(x)=x^{16}+x^{13}+x^{12}+x^9+x^7+x^6+x^5+x^4+x^2+x+$(reciprocal polynomial: $x^{16}+x^{14}+x^{12}+x^{11}+x^{10}+x^9+x^7+x^4+x^3+1$) is obtained.

(34) When the order $r=16$, and code length n is $19 \leq n \leq 21$, a generating polynomial $G(x)=x^{16}+x^{13}+x^{12}+x^9+x^7+x^5+x^4+x^3+x^2+$(reciprocal polynomial: $x^{16}+x^{14}+x^{13}+x^{12}+x^{11}+x^9+x^7+x^4+x^3+1$) is obtained.

(35) When the order $r=16$, and code length $n=22$, a generating polynomial $G(x)=x^{16}+x^{13}+x^8+x^7+x^6+x^4+x^2+x+1$ (reciprocal polynomial: $x^{16}+x^5+x^4+x^2+x^{10}+x^9+x^8+x^3+1$) is obtained.

(36) When the order $r=16$, and code length n is $23 \leq n \leq 31$, a generating polynomial $G(x)=x^{16}+x^{13}+x^{11}+x^5+x^3+x^2+x+1$ (reciprocal polynomial: $x^{16}+x^{15}+x^{14}+x^{13}+x^{11}+x^5+x^3+1$) is obtained.

(37) When the order $r=16$, and code length n is $36 \leq n \leq 151$, a generating polynomial $G(x)=x^{16}+x^{15}+x^{13}+x^8+x^5+x^3+x+1$ (reciprocal polynomial: $x^{16}+x^{15}+x^{13}+x^{11}+x^8+x^3+x+1$) is obtained.

(38) When the order $r=16$, and code length n is $152 \leq n \leq 257$, a generating polynomial $G(x)=x^{16}+x^{15}+x^8+x+1$ is obtained.

(39) When the order $r=16$, and code length n is $258 \leq n \leq 32767$, a generating polynomial $G(x)=x^{16}+x^{13}+x^2+1$ (reciprocal polynomial: $x^{16}+x^{14}+x^3+1$) is obtained.

(40) When the order $r=16$, and code length n is $n \geq 32768$, a generating polynomial $G(x)=x^{16}+x^9+x^7+x^4+1$ (reciprocal polynomial: $x^{16}+x^{12}+x^9+x^7+1$) is obtained.

As described above, according to the present embodiment, a generating polynomial G(x) in accordance with various conditions can be obtained.

Note that the above-enumerated generating polynomials G(x) can be arranged by being divided into two of a case wherein the code length n is $n_{min}=n_{max}$, and a case wherein the code length n is $n_{min} \neq n_{max}$.

CRC Encoding Method and CRC Encoding Circuit

Figure 1:
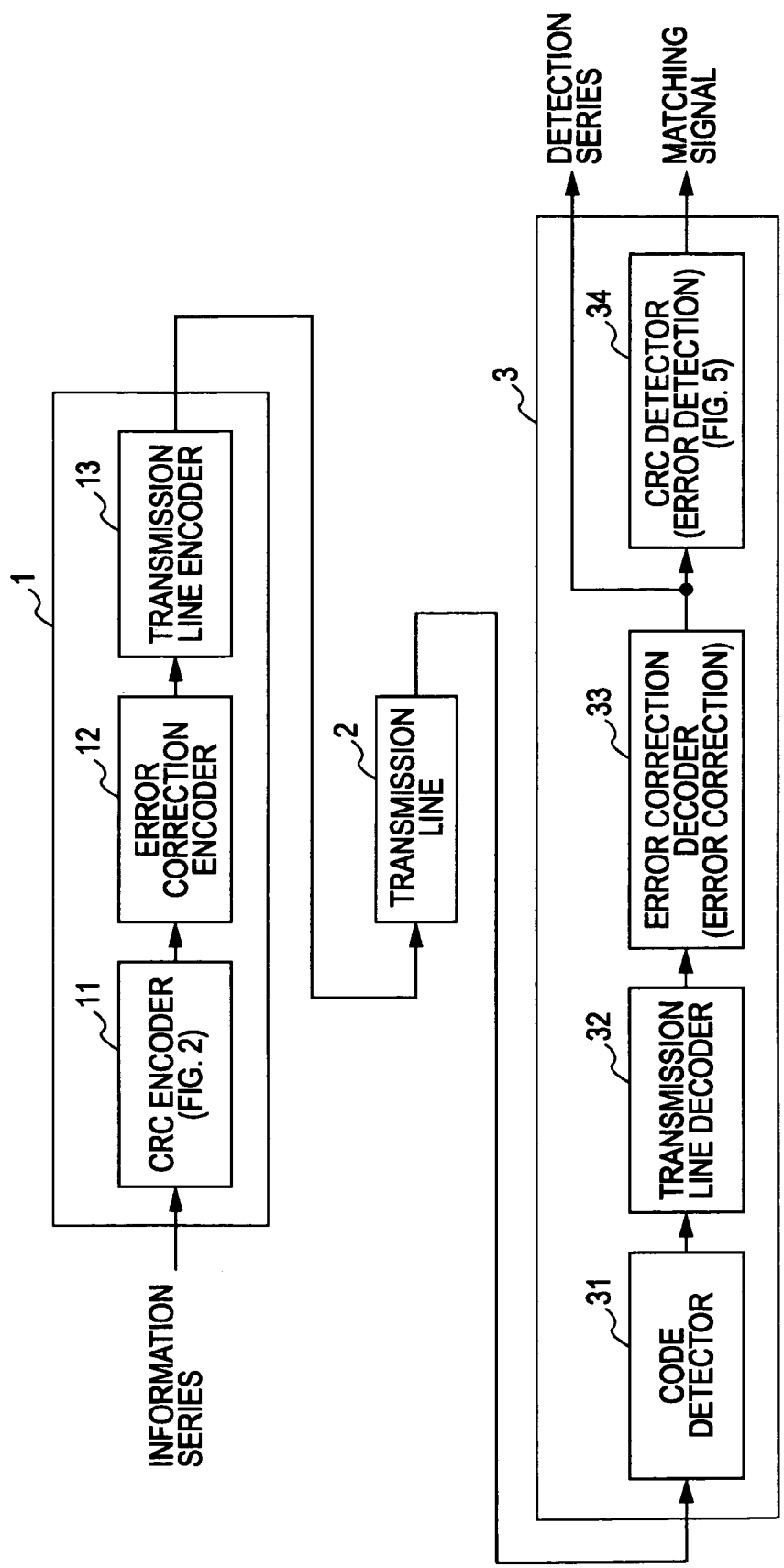
FIG. 1 is a diagram illustrating an example of configurations of a transmission apparatus and reception apparatus, which serves as an example to which a CRC encoding method and CRC encoding apparatus according to an embodiment of the present invention has been applied.
Figure 2:
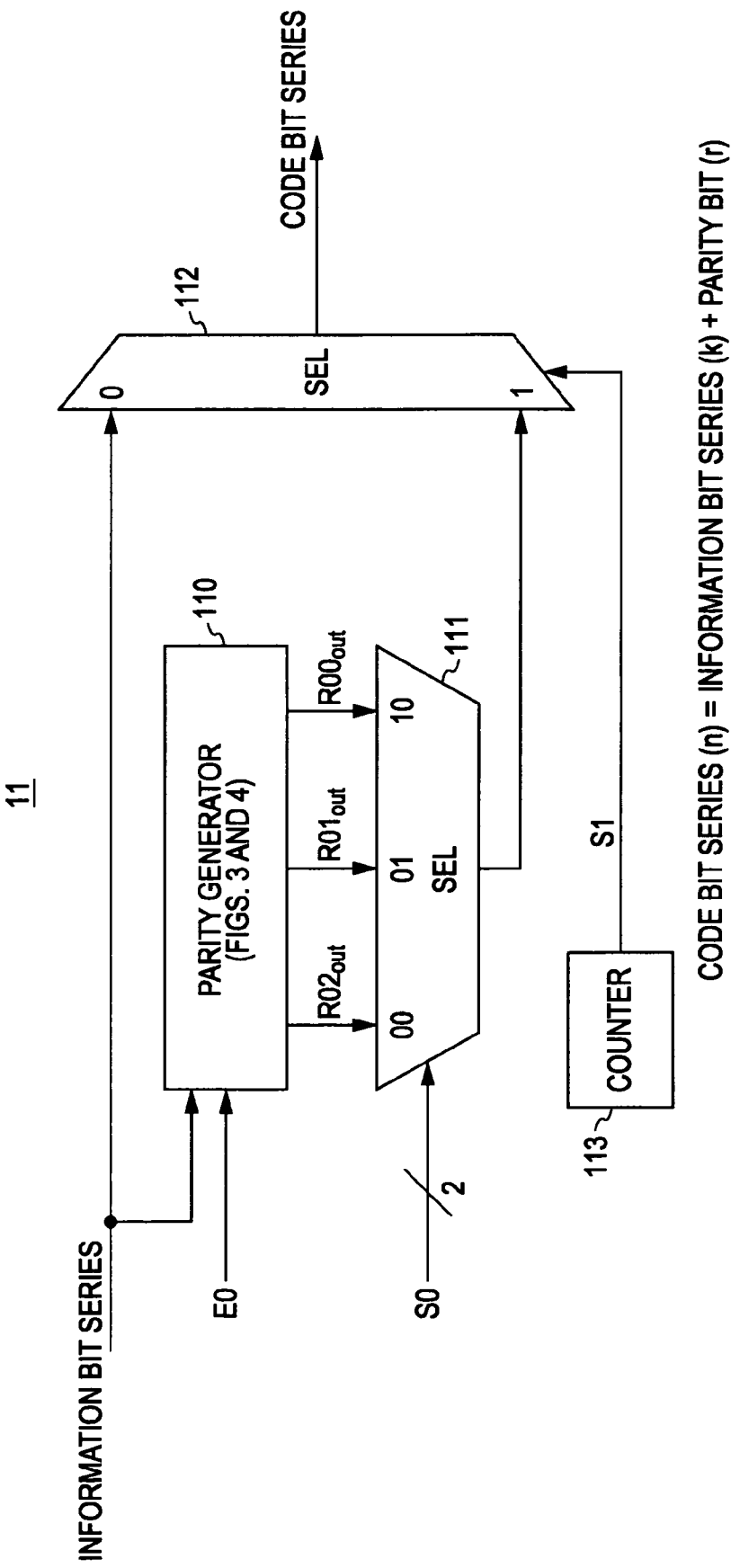
FIG. 2 is a diagram illustrating a configuration example of a CRC encoder with the transmission apparatus in FIG. 1.
Figure 5:
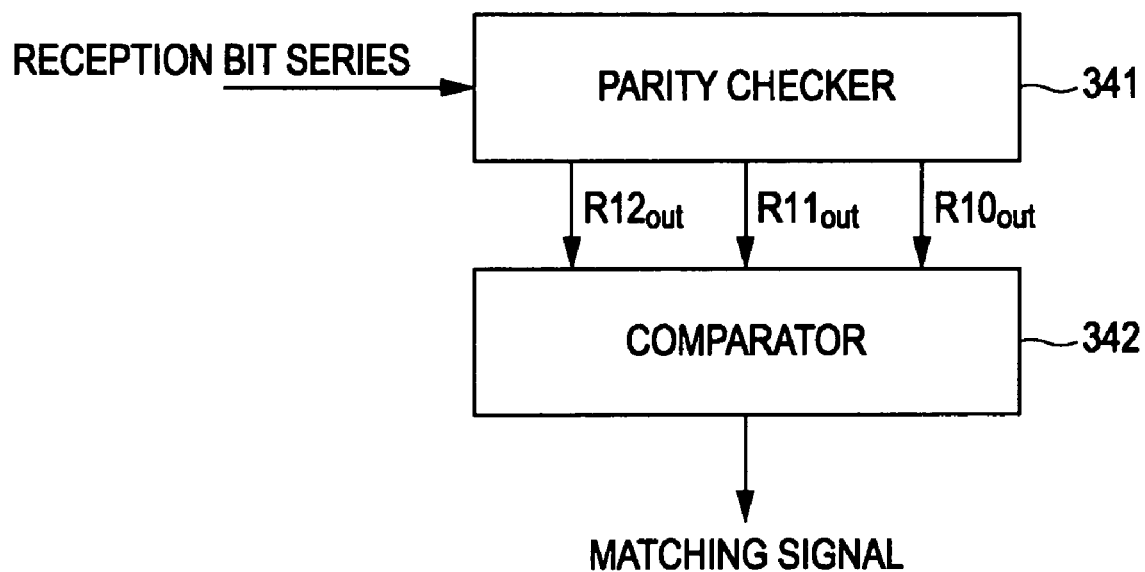
FIG. 5 is a diagram illustrating a configuration example of a CRC detector with the reception apparatus in FIG. 1.
Figure 6:
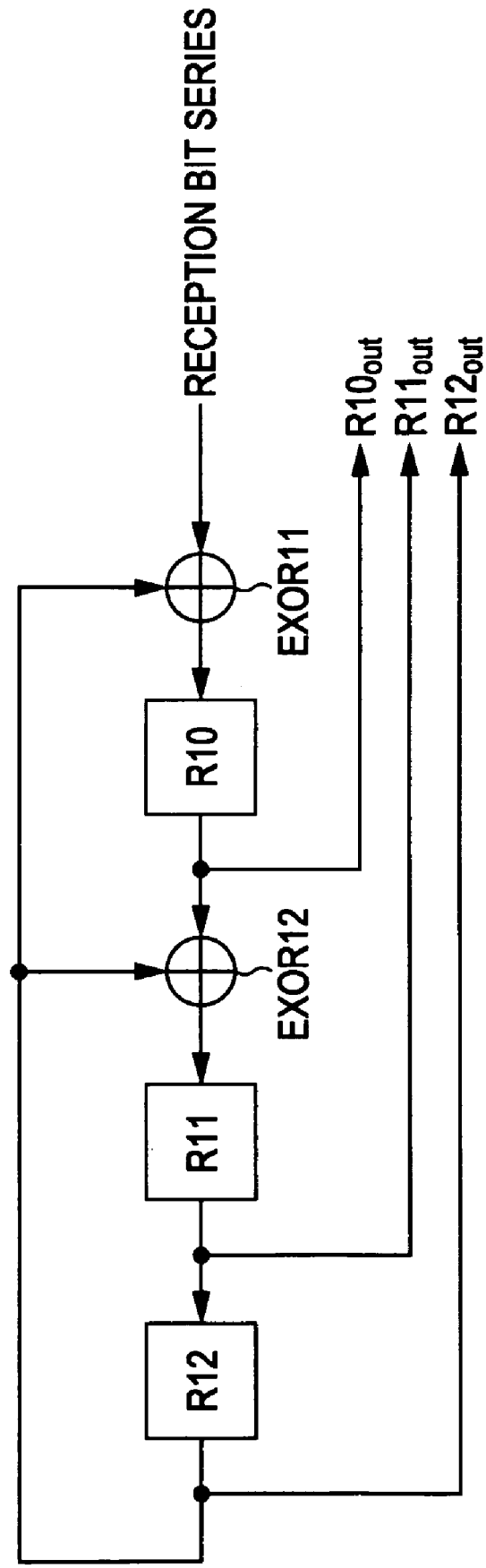
FIG. 6 is a diagram illustrating a configuration example of a CRC parity detector with making up the CRC detector illustrated in FIG. 5.

The above-mentioned generating polynomials G(x) can be applied to, for example, the CRC parity generator 110 shown in FIG. 2 or CRC parity checker 341 shown in FIG. 5.

Figure 3:
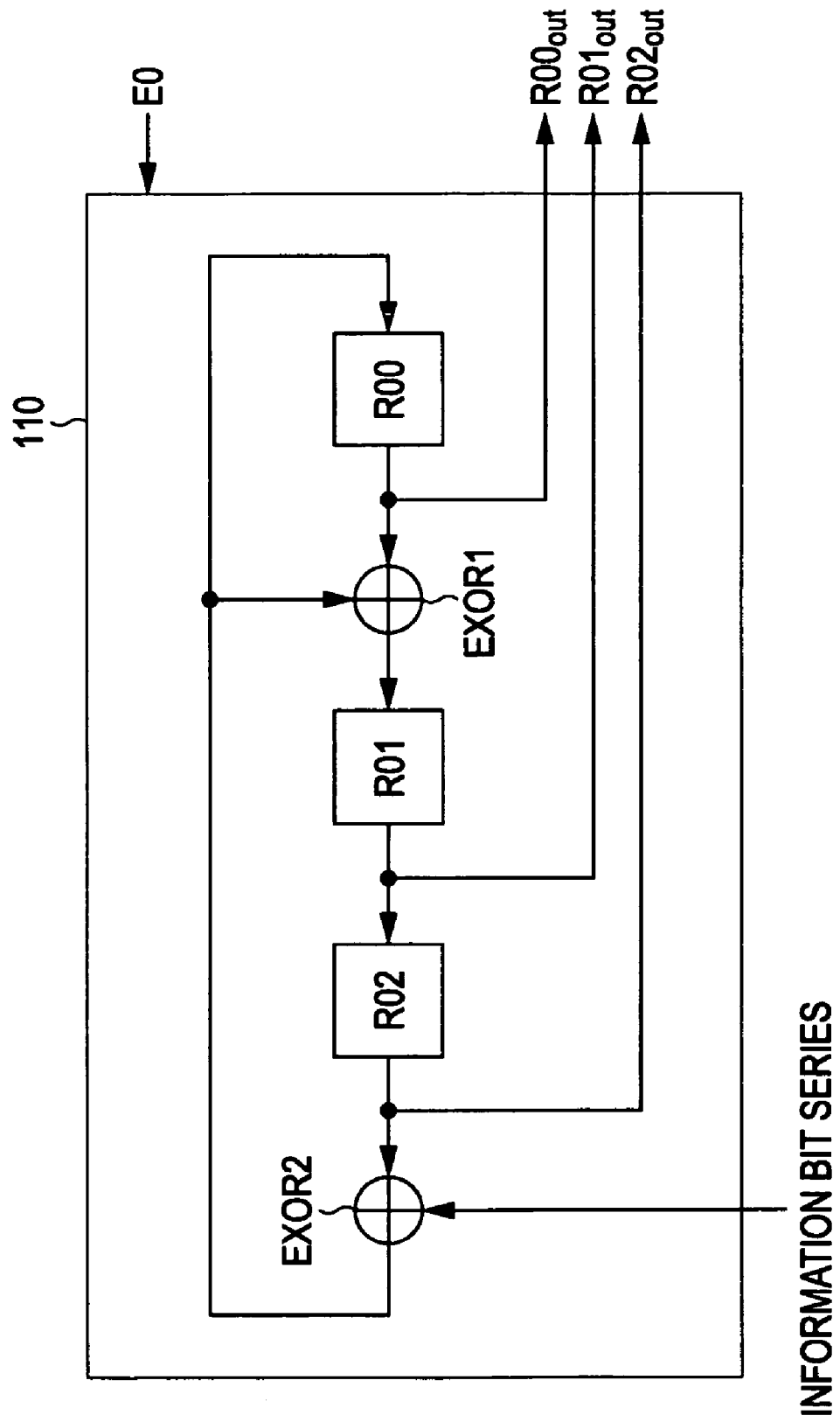
FIG. 3 is a diagram illustrating a first configuration example of a CRC parity generator with the CRC encoder illustrated in FIG. 2.
Figure 4:
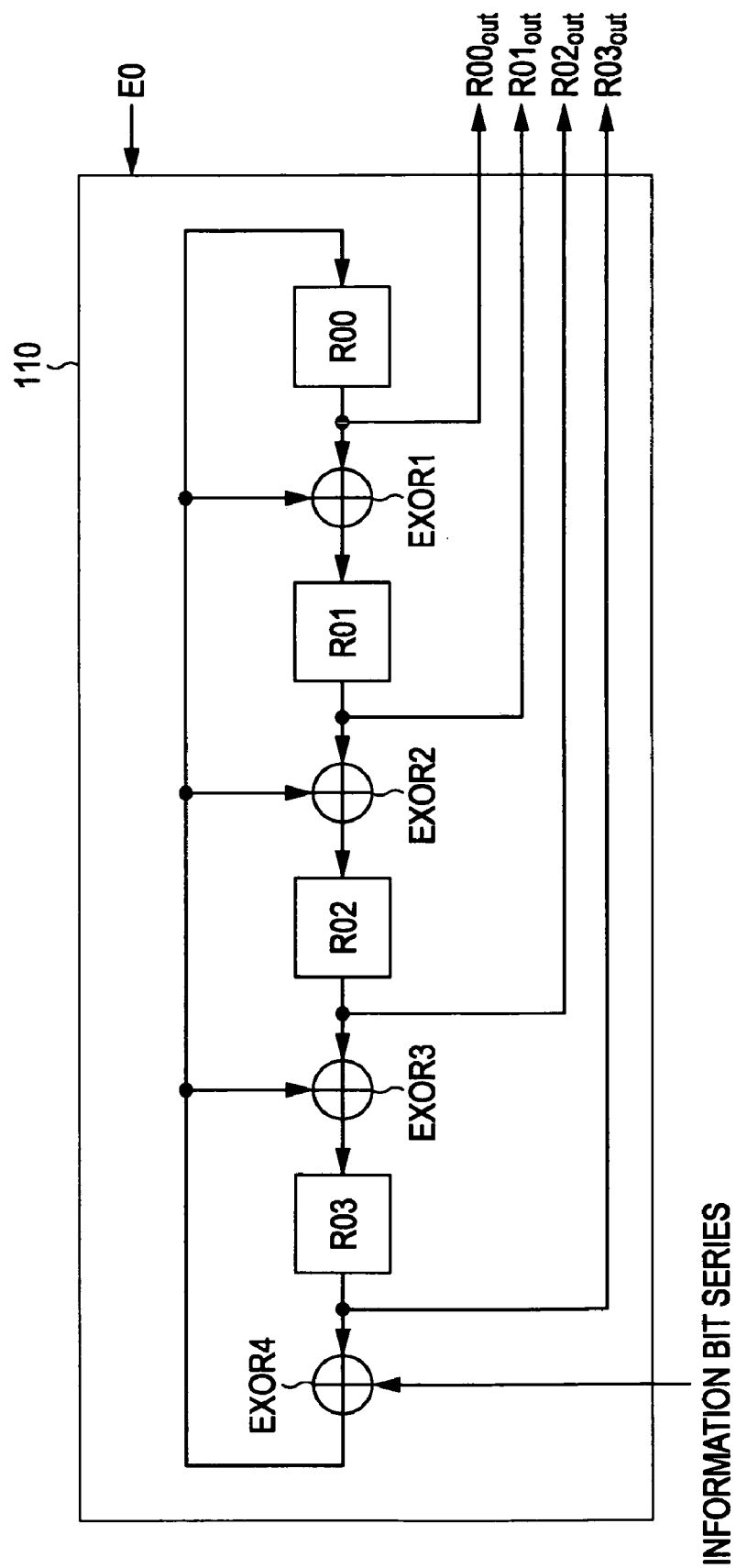
FIG. 4 is a diagram illustrating a second configuration example of a CRC parity generator with the CRC encoder illustrated in FIG. 2.

For example, let us say that the CRC parity generator 110 shown in FIG. 2 has a circuit configuration such as the circuit configuration thereof is shown in FIG. 3 or FIG. 4, wherein shift registers provided according to the order of the generating polynomial G(x), and exclusive OR circuits are connected in a cyclic manner. The exclusive OR circuits are provided according to the coefficients of the generating polynomial G(x), and the output of an exclusive OR circuit on the final stage, e.g., the output of the second exclusive OR circuit EXOR2 in FIG. 3 is input to another exclusive OR circuit disposed on the previous stage.

Thus, in the event that the generating polynomial G(x) is obtained such as described above, a CRC encoding circuit can be readily configured by employing shift registers and exclusive OR circuits. This can also be applied to the CRC parity checker 341.

As can be understood from Tables 1-A through 1-C, and the examples in FIGS. 10 and 11, a generating optimal according to a comparative example which has been widely employed exhibits a property approximating to a limit value (bound) with a certain code length range, but with a portion other than that range, the minimum hamming distance ($d_{min}$) for codes and undetected error probability ($P_{ud}$) properties deteriorate as compared to the limit value.

As compared to this, with an embodiment based on a selecting method according to the present invention, properties approximating to the limit value can be obtained with all of the code lengths n.

Thus, a CRC encoding method generated by employing a generating polynomial according to a preferred embodiment of the present invention is employed, whereby the undetected error probability for codes can be suppressed to low levels with a desired parity bit and code length as compared to a case wherein a generating polynomial which has been widely employed so far, and also the minimum hamming distance for codes reaches the maximum value, and accordingly, the random error detection capability can be maximized.

Further, the generating polynomial G(x) satisfies $d_{min}=Max.d_{min}$ and also $P_{ud}=$limit value (bound) with a code length range of $n_{min}(r, Max.d_{min}) \leq n \leq n_{max}(r, Max.d_{min})$, so even a case wherein the code length n changes can be handled with a single generating polynomial, as long as the code length n is in this code length range.

Further, a generating polynomial G(x) wherein the number of terms w is the minimum is employed out of generating polynomials G(x) wherein the minimum hamming distance ($d_{min}$) for codes reaches the maximum value constantly with a code length range of $n_{min}(r, Max.d_{min}) \leq n \leq n_{max}(r, Max.d_{min})$, whereby a circuit scale can be reduced at the time of implementing this in a circuit.

Also, if the code length n and the undetected error probability $P_{ud}$ are determined, the number of parities (order r) for satisfying those can be understood, so a generating polynomial G(x) selected with the number of parities r and code length n thereof is employed, whereby desired undetected error probability can be realized.

Transmission/Reception System

Figure 12:
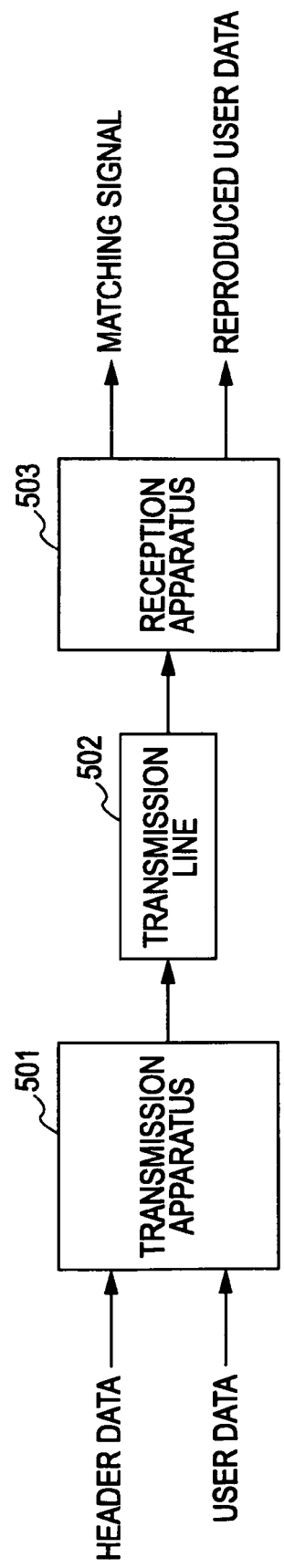
FIG. 12 is a diagram illustrating a configuration example of a transmission and reception system.

FIG. 12 is a diagram illustrating a configuration example of a transmission/reception system which performs transmission/reception of data by employing a generating polynomial G(x) selected with such a method.

As shown in FIG. 12, this transmission/reception system is configured of a transmission apparatus 501, transmission line 502, and reception apparatus 503. Transmission (broadcasting) of data is performed from the transmission apparatus 501 in accordance with a specification, for example, such as DVB-T2 (Digital Video Broadcasting-Terrestrial2) which is the specification of terrestrial digital broadcasting, DVB-S2 (Digital Video Broadcasting-Sattellite2), or the like.

The transmission apparatus 501 is an apparatus to be provided in a broadcasting station or the like, and transmits a stream obtained by subjecting header data and user data which is input externally to CRC encoding processing or the like, through the transmission line 502.

The reception apparatus 503 is an apparatus such as a television receiver, STB (Set Top Box), or the like, and subjects data obtained by demodulating a reception signal supplied from an unshown antenna to CRC processing or the like to obtain user data to be transmitted. The user data obtained by the reception apparatus 503 is output to an apparatus on the subsequent stage.

Figure 13:
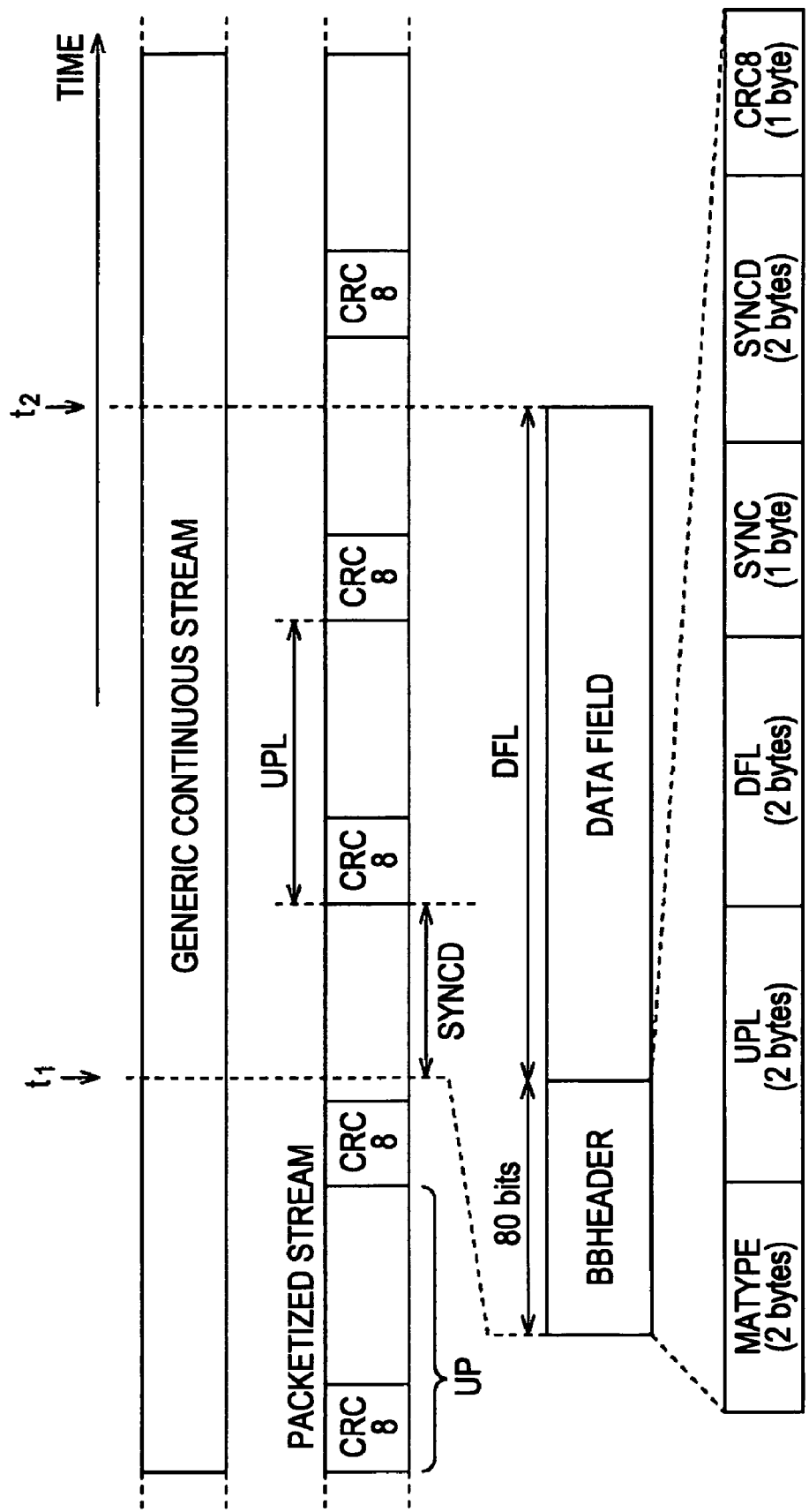
FIG. 13 is a diagram illustrating an example of a stream structure.

FIG. 13 is a diagram illustrating a structure example of a stream to be transmitted from the transmission apparatus 501. The horizontal axis represents a temporal axis. With the example in FIG. 13, a generic continuous stream which is a stream to which a synchronizing signal is not added is shown on the top, and a packetized stream which is a stream made up of packets of a predetermined amount of data is shown in the bottom thereof.

Here, a single packet making up a packetized stream will be referred to as an UP (User Packet). A single UP is data in a range from the top of a certain CRC parity to the next CRC parity on the temporal axis. The user data externally input to the transmission apparatus 501 is stored in a portion following a CRC parity of each UP. In a case wherein a stream shown on the second row from the top of FIG. 13 is a TS (Transport Stream), the length of an UP serving as a TS packet (UPL (User Packet Length)) is 188×8 bits.

As shown in FIG. 13, the top 8 bits of each UP is replaced with a CRC parity. The position to be replaced with a CRC parity is originally a position where a synchronizing signal for UP is stored. As described later in detail, this 8-bit CRC parity is obtained by employing, for example, a generating polynomial $G(x)=x^8+x^4+x+1$ (a generating polynomial of (11) enumerated above) selected such as described above.

Figure 14:
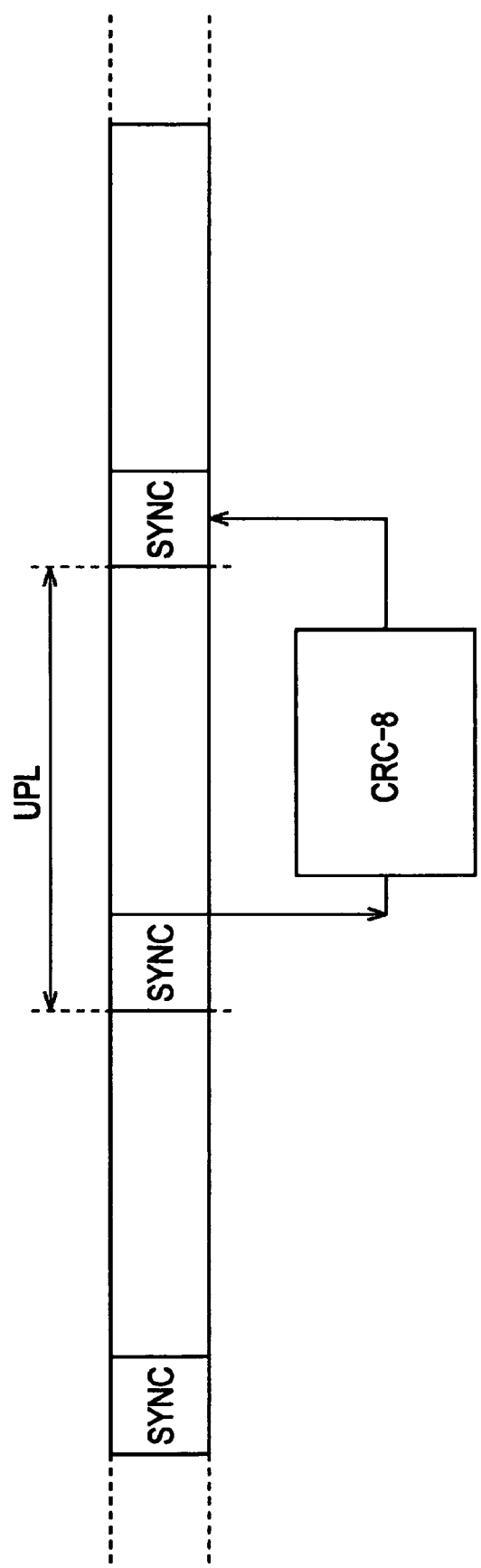
FIG. 14 is a diagram illustrating and example of generation of a CRC parity.

If we say that as shown in an UPL arrow segment, an UP including a CRC parity is taken as data of one increment, as shown in FIG. 14, a CRC parity obtained from data stored in a certain UP is replaced with the top 8-bit SYNC of the UP of the next increment in processing order.

A packetized stream made up of such an UP, and a generic continuous stream such as shown on the top of FIG. 13 are segmented into data fields (DATA FIELD) having a predetermined length such as shown in a segment from point-in-time $t_1$ through $t_2$ in FIG. 13, and a baseband header (BBHEADER) is added to each of the data fields. The header data externally input to the transmission apparatus 501 represents data included in this baseband header.

With the example in FIG. 13, a baseband header is made up of 80-bit data, and includes 2-byte MATYPE, 2-byte UPL, 2-byte DFL, 1-byte SYNC, 2-byte SYNCD, and 1-byte CRC parity.

The MATYPE is information representing the type of stream and so forth, and this MATYPE represents whether the original stream segmented into data fields is a packetized stream or generic continuous stream. The UPL represents an UPL which is the above-mentioned UP length in a case wherein the original stream is a packetized stream. The DFL represents the length of a data field, and the SYNC represents the content of a synchronizing signal of 8 bits of the top within an UP to be replaced with a CRC parity. The SYNCD represents the number of bits from the top of a data field to the top of a CRC parity.

A CRC parity within a baseband header is also generated by employing, for example, a generating polynomial $G(x)=x^8+x^4+x+1$ selected such as described above. 72 bits in total of the above-mentioned 2-byte MATYPE, 2-byte UPL, 2-byte DFL, 1-byte SYNC, and 2-byte SYNCD are employed as information bit series, and a CRC parity is obtained. Hereafter, a 8-bit CRC parity of the top of an UP making up a packetized stream will be referred to as a first CRC parity, and a CRC parity included in a baseband header will be referred to as a second CRC parity as appropriate.

Figure 15:
FIG. 15 is a diagram illustrating a data example to be added to a baseband frame.

A baseband frame (BBFRAME) is, such as shown in FIG. 15, made up of a baseband header and data field which have structures such as shown in FIG. 13. A baseband frame also includes padding of a predetermined length. With the transmission apparatus 501, a BCH FEC (Bose Chaudhuri Hocquenghem Forward Error Correction) and LDPC FEC (Low Density Parity Check Forward Error Correction) are appended to each baseband frame, and is transmitted to the reception apparatus 503.

Figure 16:
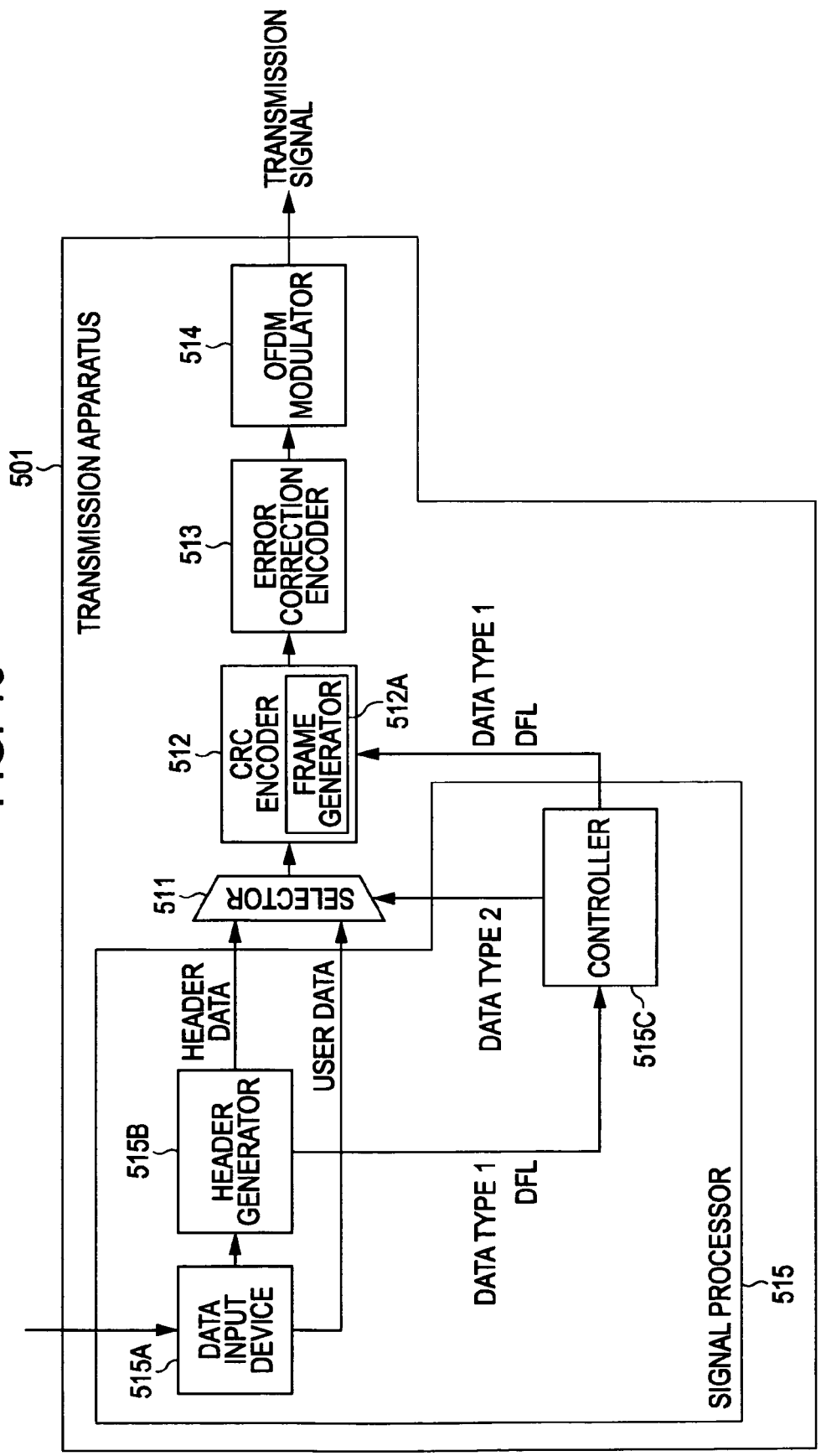
FIG. 16 is a block diagram illustrating a configuration example of the transmission apparatus.

FIG. 16 is a block diagram illustrating a configuration example of the transmission apparatus 501. As shown in FIG. 16, the transmission apparatus 501 is configured of a selector 511, CRC encoder 512, error correction encoder 513, OFDM modulator 514, and signal processor 515.

The selector 511 selects one of the header data and user data supplied from the signal processor 515 in accordance with instructions by the signal processor 515, and outputs the selected data to the CRC encoder 512. A packetized stream made up of multiple UPs, or generic continuous stream is supplied from the signal processor 515 as user data. Also, data included in a baseband header is supplied from the signal processor 515 as header data.

When a packetized stream is supplied as user data, the CRC encoder 512 treats data of a SYNC and thereafter included in each supplied UP as information bit series, and employs a generating polynomial $G(x)=x^8+x^4+x+1$ to generate a first CRC parity, and replaces a SYNC positioned in the top 8 bits of the next UP in processing order with the generated first CRC parity.

Also, with the CRC encoder 512, the frame generator 512A thereof segments the packetized stream made up of UPs of which the SYNCs are replaced with the first CRC parity in increments of a data field, thereby generating frames. The DFL information representing the length of a data field is supplied from the signal processor 515. The frame generator 512A appends the baseband header which stores the second CRC parity generated by the CRC encoder 512 to each of data fields based on the header data, and outputs data in increments of a baseband frame which is made up of such a baseband header and data field to the error correction encoder 513.

On the other hand, when a generic continuous stream is supplied as user data, with the CRC encoder 512, the frame generator 512A thereof segments the generic continuous stream in increments of a data field, thereby generating frames. At this time as well, the DFL information is supplied from the signal information processor 515. In the same way as a packetized stream is supplied, the frame generator 512A appends the baseband header which stores the second CRC parity generated by the CRC encoder 512 to each of data fields based on the header data, and outputs data in increments of a baseband frame which is made up of such a baseband header and data field to the error correction encoder 513.

When header data included in a baseband header is supplied, the CRC encoder 512 treats the supplied header data as information bit series, and employs a generating polynomial $G(x)=x^8+x^4+x+1$ to generate a second CRC parity, and stores the generated second CRC parity in the position of the last 8 bits of the baseband header. The baseband header in which the second CRC parity is stored is appended to data fields obtained by segmenting a packetized stream or generic continuous stream.

The error correction encoder 513 subjects data supplied from the CRC encoder 512 to error correction encoding processing employing BCH codes and LDPC codes, and outputs, such as shown in FIG. 15, data obtained by being subjected to the error correction encoding processing which is made up of a baseband frame, BCH FEC, and LDPC FEC, to the OFDM modulator 514.

The OFDM modulator 514 performs OFDM (Orthogonal Frequency Division Multiplexing) modulation, and transmits a transmission signal obtained by the modulation to the reception apparatus 503. Modulation may be performed with a modulation method employing a single carrier instead of a modulation method employing multiple carriers such as OFDM modulation.

The signal processor 515 outputs the user data and header data input externally by the user of the transmission apparatus 501, or the like, to the selector 511, and output to the CRC encoder 512, generation of frames performed at the CRC encoder 512, or the like is controlled from the selector 511. As shown in FIG. 16, the signal processor 515 is configured of a data input device 515A, header generator 515B, and controller 515C.

The data input device 515A obtains the input user data and header data, and outputs the user data to the selector 511, and outputs the header data to the header generator 515B, respectively.

The header generator 515B generates each piece of data of the MATYPE, UPL, DFL, SYNC, and SYNCD shown in FIG. 13 based on the header data supplied from the data input device 515A, and outputs the generated data to the selector 511 as header data.

The controller 515C outputs a data type 1 which is information representing whether the stream supplied from the selector 511 to the CRC encoder 512 as user data is a packetized stream or generic continuous stream, to the CRC encoder 512. In the case of determining that a packetized stream has been input based on the data type 1, the CRC encoder 512 generates first and second CRC parities, and in the case of determining that a generic continuous stream has been input, generates a second CRC parity.

Also, the controller 515C outputs the DFL information to the CRC encoder 512. With the frame generator 512A of the CRC encoder 512, generation of frames is performed such that user data is segmented in increments of a data field of which the length is specified with the DFL from the controller 515C. For example, the DFL is determined with an upper layer such as a MAC layer or the like. A method for determining the DFL differs according to the specification and implementation of an upper layer.

The controller 515C also outputs a data type 2 which is information to instruct whether to output either the header data or user data to the CRC encoder 512, to the selector 511. The controller 515C internally includes a counter and so forth, and determines whether to output either the header data or user data based on the DFL supplied from the header generator 515B, and so forth.

Figure 17:
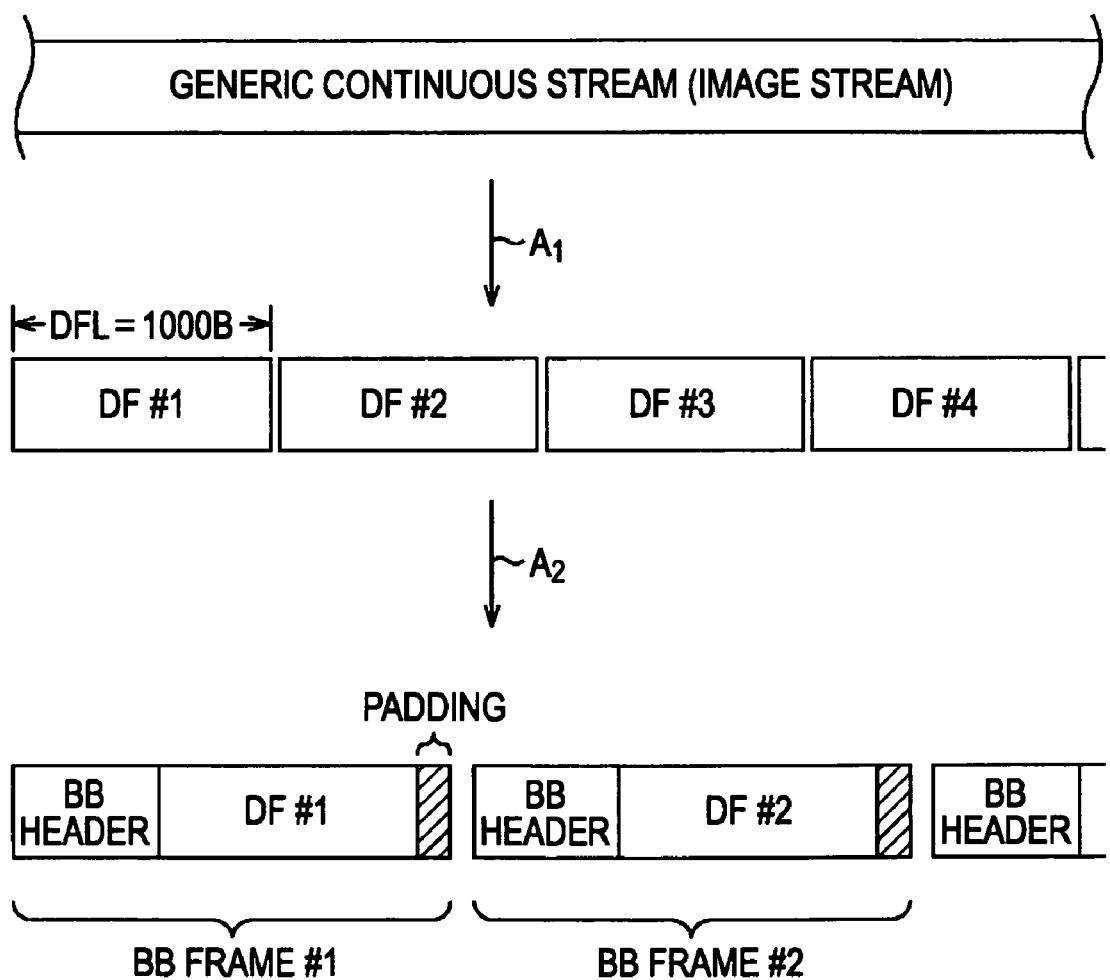
FIG. 17 is a diagram illustrating generation of frames with a generic continuous stream as a target.
Figure 18:
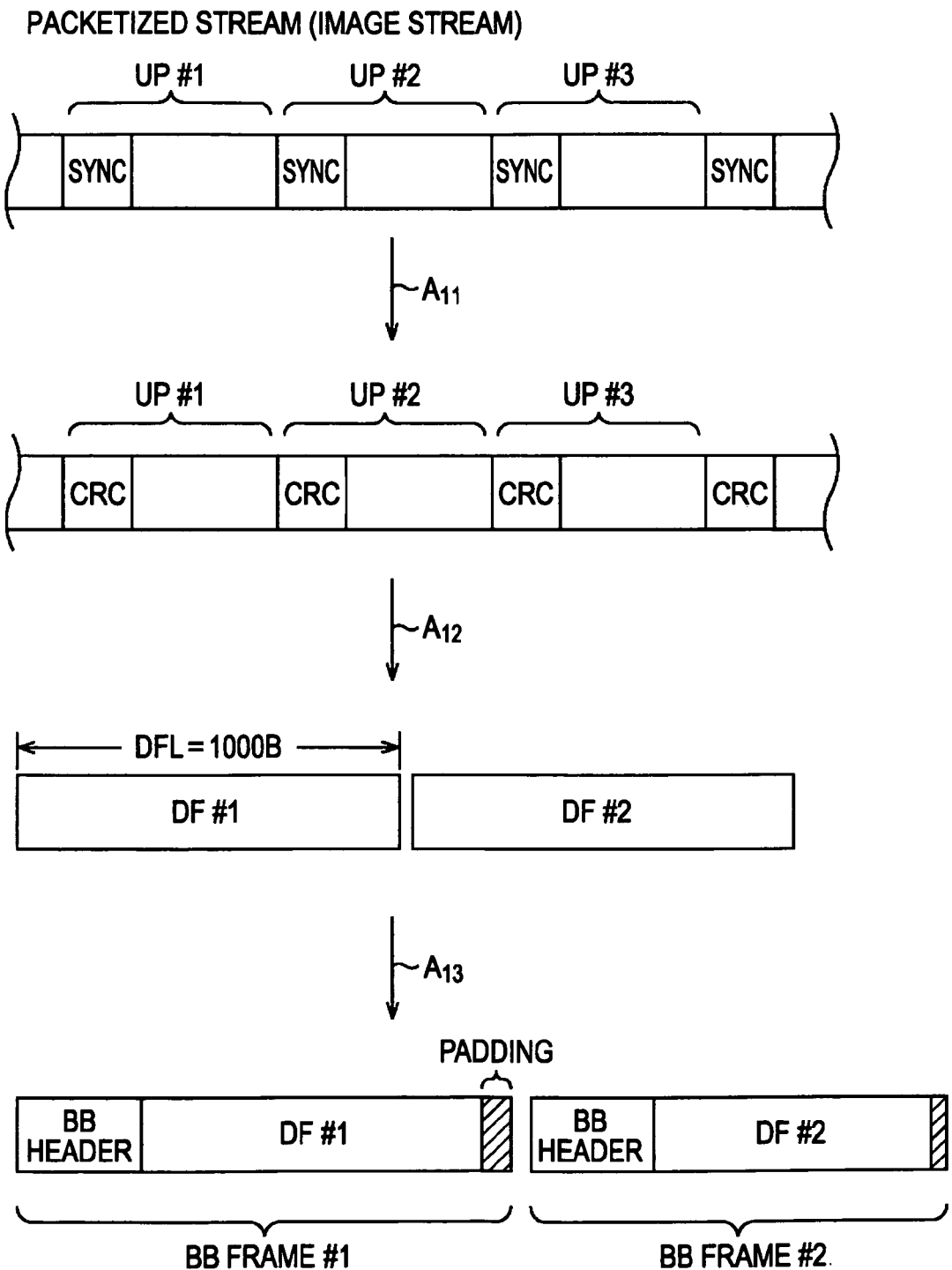
FIG. 18 is a diagram illustrating generation of frames with a packetized stream as a target.

FIGS. 17 and 18 are diagrams illustrating generation of frames from user data performed at the transmission apparatus 501 having such a configuration. FIG. 17 illustrates generation of frames with a generic continuous stream as a target, and FIG. 18 illustrates generation of frames with a packetized stream as a target.

As shown in the top of FIG. 17, in a case wherein an image stream or the like is supplied in a generic continuous stream form, with the frame generator 512A of the CRC encoder 512, as shown in the tip of an arrow $A_1$ in FIG. 17, a generic continuous stream is segmented in increments of a 1000-byte data field (DF). This length of 1000 bytes is specified with the DFL from the controller 515C. In FIG. 17, four data fields of data fields #1 through #4 are shown.

After being segmented in increments of a data field, as shown in the tip of an arrow $A_2$ in FIG. 17, the baseband header generated by the header generator 515B is appended to each of the data fields by the frame generator 512A, whereby baseband frames are generated. The second CRC parity generated by the CRC encoder 512 is also stored in the baseband header to be appended to each of the data fields. In FIG. 17, the baseband header is appended to the data field #1, whereby a baseband frame #1 is generated, and the baseband header is appended to the data field #2, whereby a baseband frame #2 is generated. Hatched portions appended to the baseband frames #1 and #2 represent padding of a predetermined length.

On the other hand, as shown in the top of FIG. 18, in a case wherein an image stream or the like is supplied in a packetized stream form including UPs #1 through #3, with the CRC encoder 512, as shown in the tip of an arrow $A_{11}$ in FIG. 18, SYNCs are replaced with CRC parities (first CRC parities). The CRC parity of the UP #1 has been obtained by the CRC encoder 512 by employing immediately previous UP data, and the CRC parity of the UP #2 has been obtained by employing the data of the UP #1. Also, the CRC parity of the UP #3 has been obtained by employing the data of the UP #2.

After the SYNCs are replaced with CRC parities, with the frame generator 512A of the CRC encoder 512, as shown in the tip of an arrow $A_{12}$ in FIG. 18, a packetized stream is segmented, for example, in increments of a 1000-byte data field. In FIG. 18, two data fields of data fields #1 and #2 are shown.

After being segmented in increments of a data field, as shown in the tip of an arrow $A_{13}$ in FIG. 18, the baseband header generated by the header generator 515B is appended to each of the data fields by the frame generator 512A, whereby baseband frames are generated. The second CRC parity generated by the CRC encoder 512 is also stored in the baseband header to be appended to each of the data fields. In FIG. 18 as well, the baseband header is appended to the data field #1, whereby a baseband frame #1 is generated, and the baseband header is appended to the data field #2, whereby a baseband frame #2 is generated. The data of baseband frames thus generated based on a generic continuous stream or packetized stream are output to the error correction encoder 513 from the CRC encoder 512.

Figure 19:
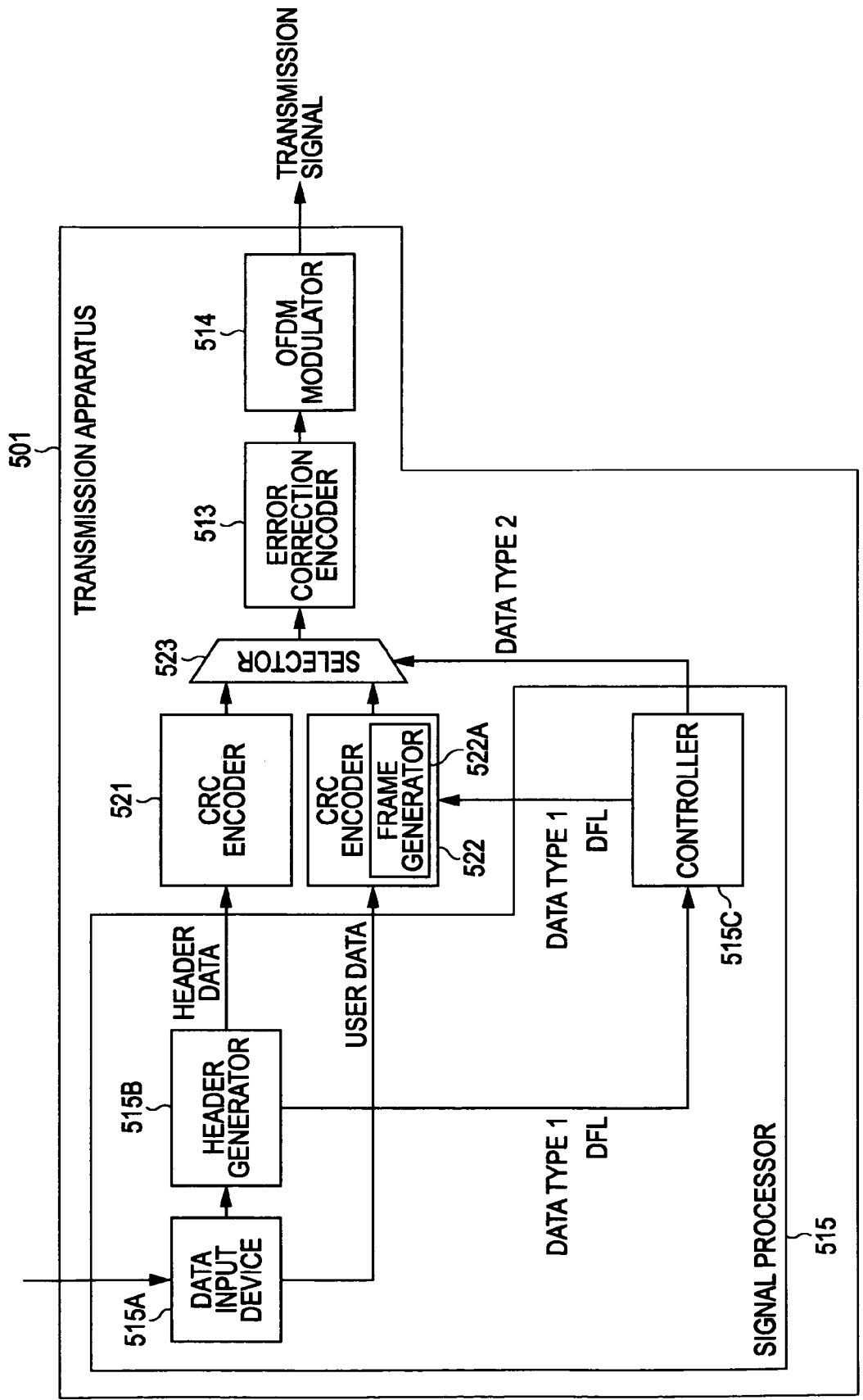
FIG. 19 is a block diagram illustrating another configuration example of the transmission apparatus.

FIG. 19 is a block diagram illustrating another configuration example of the transmission apparatus 501. The same configurations as those shown in FIG. 16 are appended with the same reference numerals. Redundant description will be omitted. With the example in FIG. 19, CRC encoders 521 and 522 are provided as a configuration for performing the CRC encoding processing. The header data output from the signal processor 515 is input to the CRC encoder 521, and the user data output from the signal processor 515 is input to the CRC encoder 522.

The CRC encoder 521 generates a second CRC parity by employing a generating polynomial $G(x)=x^8+x^4+x+1$ with the header data as information bit series. The CRC encoder 521 appends the generated second CRC parity to the back of the information bit series of each piece of data of the MATYPE, UPL, DFL, SYNC, and SYNCD to make up a baseband header, and outputs the baseband header to a selector 523.

In a case wherein a packetized stream made up of multiple UPs is supplied from the data input device 515A of the signal processor 515 as user data, the CRC encoder 522 employs a generating polynomial $G(x)=x^8+x^4+x+1$ to generate a first CRC parity. The CRC encoder 522 replaces a SYNC positioned in the top 8 bits of the next UP in processing order with the generated first CRC parity. Also, with the CRC encoder 522, a frame generator 522A thereof segments the packetized stream made up of UPs of which the SYNCs are replaced with the first CRC parity in increments of a data field, thereby generating frames. The DFL information representing the length of a data field is supplied from the controller 515C. The frame generator 522A outputs the data of the data fields obtained by generating frames to the selector 523.

On the other hand, when a generic continuous stream is supplied as user data, with the CRC encoder 522, the frame generator 522A thereof segments the generic continuous stream in increments of a data field, thereby generating frames. The frame generator 522A outputs the data of the data fields obtained by generating frames to the selector 523.

The selector 523 outputs the data of the data fields supplied from the CRC encoder 522 to the error correction encoder 513 subsequently to the data of the baseband header supplied from the CRC encoder 521. The data of the baseband frames is supplied to the error correction encoder 513 from the selector 523. Regarding whether to output either the data of the baseband header supplied from the CRC encoder 521 or the data of the data fields supplied from the CRC encoder 522 is instructed by the controller 515C of the signal processor 515 based on the data type 2.

The controller 515C of the signal processor 515 outputs a data type 1 representing whether the stream supplied to the CRC encoder 522 is a packetized stream or generic continuous stream and DFL to the CRC encoder 522.

The controller 515C outputs a data type 2 to instruct whether to output either the data of the baseband header supplied from the CRC encoder 521 or the data of the data fields supplied from the CRC encoder 522 to the error correction encoder 513, to the selector 523.

Thus, the CRC encoder for the first CRC parity, and the CRC encoder for the second CRC parity may be provided, respectively. Also, a generating polynomial employed at the CRC encoder for the first CRC parity, and a generating polynomial employed at the CRC encoder for the second CRC parity may differ. A generating polynomial employed at each of the CRC encoders is selected with the above-mentioned method according the number of parity bits and code length.

Figure 20:
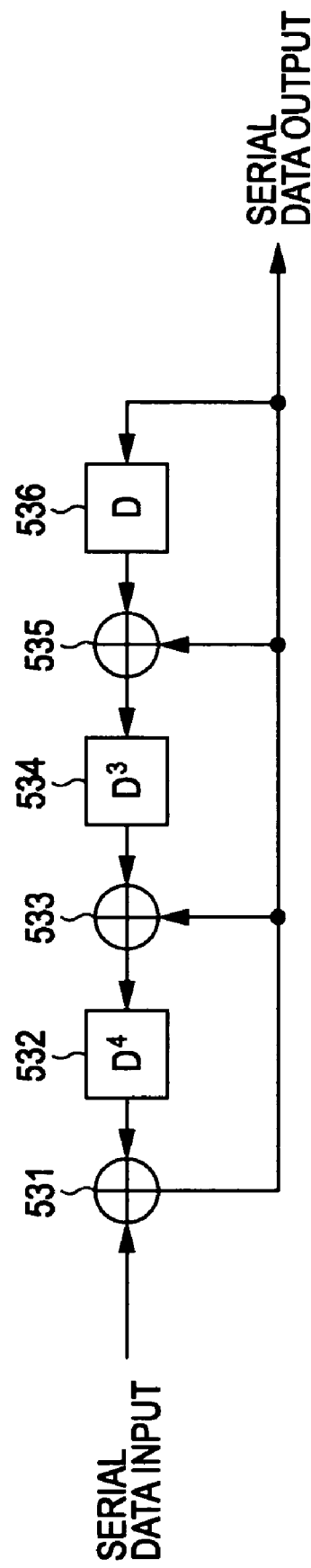
FIG. 20 is a diagram illustrating a circuit configuration example of the CRC encoder in FIG. 16.

FIG. 20 is a diagram illustrating a circuit configuration example of a portion for generating a CRC parity (portion equivalent to the parity generator 110 in FIG. 2) of the CRC encoder 512 in FIG. 16. FIG. 20 illustrates an example wherein $G(x)=x^8+x^4+x+1$ is employed as a generating polynomial. In a case wherein the generating polynomials employed at the CRC encoders 521 and 522 in FIG. 19 are $G(x)=x^8+x^4+x+1$, the same configuration as that shown in FIG. 20 is provided in the CRC encoders 521 and 522, respectively.

The CRC parity generated by the circuit such as shown in FIG. 20 is appended as a part of a UP or baseband header, and the data of a baseband frame including the UP and baseband header is output to the error correction encoder 513. As described with reference to FIG. 3 and so forth, the CRC parity generator can be configured as a circuit wherein shift register and exclusive OR circuits are connected in a cyclic manner, and the output of the exclusive OR circuit on the final stage is applied to the exclusive OR circuit on the previous stage thereof.

In FIG. 20, "$D^4$", indicated in the block of a shift register 532 represents that the shift register 532 is configured by four shift registers being connected in serial, and "$D^3$" indicated in the block of a shift register 534 represents that the shift register 534 is configured by three shift registers being connected in serial. A shift register 536 of which the block indicates "D" is a register for delaying by one timing worth. These can be applied to later-described circuit diagrams such as FIG. 24 and so forth.

With an EXOR circuit 531, an exclusive OR operation is performed based on serial data (1, 0) which is header data or user data supplied from the selector 511, and the value delayed by four timing worth at the shift register 532. The logical operation result of the EXOR circuit 531 is output as serial data, and is also supplied to the EXOR circuits 533 and 535, and shift register 536.

With the EXOR circuit 535, an exclusive OR operation is performed based on the value delayed by one timing worth at the shift register 536, and the value supplied from the EXOR circuit 531. The logical operation result of the EXOR circuit 535 is supplied to the shift register 534.

With the EXOR circuit 533, an exclusive OR operation is performed based on the value delayed by three timing worth at the shift register 534, and the value supplied from the EXOR circuit 531. The logical operation result of the EXOR circuit 533 is supplied to the shift register 532.

FIG. 21 is a diagram showing undetected error probability simulation results in the case of employing $G(x)=x^8+x^4+x+1$, and in the case of employing $G(x)=x^8+x^7+x^6+x^4+x^2+1$, as a generating polynomial. FIG. 21 shows the undetected error probability of CRC codes obtained with 72-bit data from the MATYPE to SYNCD in the baseband header as information bit series. Employed bit rates are $1\times10^{-3}$, $1\times10^{-4}$, and $1\times10^{-5}$.

As shown in FIG. 21, in either bit error rate case, when employing data of which the code length is relatively short such as 80 bits, as a target, the undetected error probability is low in the case of employing $G(x)=x^8+x^4+x+1$ as a generating polynomial. The CRC encoder 512 is configured of a circuit for realizing an operation employing this generating polynomial $G(x)=x^8+x^4+x+1$.

Figure 22:
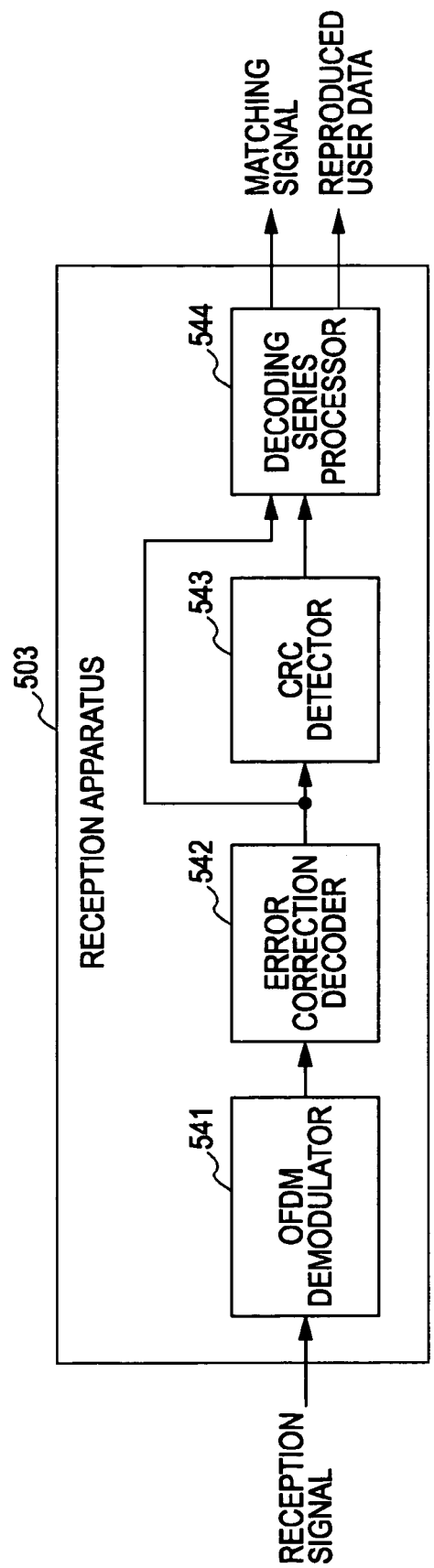
FIG. 22 is a block diagram illustrating a configuration example of the reception apparatus.

FIG. 22 is a block diagram illustrating a configuration example of the reception apparatus 503. As shown in FIG. 22, the reception apparatus 503 is configured of an OFDM demodulator 541, error correction decoder 542, CRC detector 543, and decoding series processor 544. A reception signal supplied from an antenna or the like is input to the OFDM demodulator 541.

The OFDM demodulator 541 subjects the reception signal to OFDM demodulation, and outputs the demodulated and obtained data to the error correction decoder 542. In a case wherein modulation has been performed with a modulation method employing a single carrier, demodulation processing according to the modulation method thereof is performed at the OFDM modulator 541.

The error correction decoder 542 subjects the data supplied from the OFDM demodulator 541 to error correction employing BCH codes and LDPC codes, and outputs the data obtained by being subjected to error correction. The data output from the error correction decoder 542 is output to the CRC detector 543 and decoding series processor 544.

The CRC detector 543 detects whether or not the data of the baseband header subjected to error correction at the error correction decoder 542 includes an error based on the second CRC parity included in the data supplied from the error correction decoder 542. The CRC detector 543 outputs the detection result to the decoding series processor 544. With the error detection performed at the CRC detector 543 as well, the same generating polynomial $G(x)=x^8+x^4+x+1$ as the generating polynomial employed at the transmission apparatus 501 is employed.

Also, the CRC detector 543 detects whether or not the data of an UP subjected to error correction at the error correction decoder 542 includes an error based on the first CRC parity included in the data supplied from the error correction decoder 542.

The decoding series processor 544 subjects the data supplied from the error correction decoder 542 to predetermined processing based on the detection result by the CRC detector 543, and obtains reproduced user data. The decoding series processor 544 outputs a matching signal representing the detection result by the CRC detector 543 to the subsequent-stage apparatus along with the reproduced user data.

Figure 23:
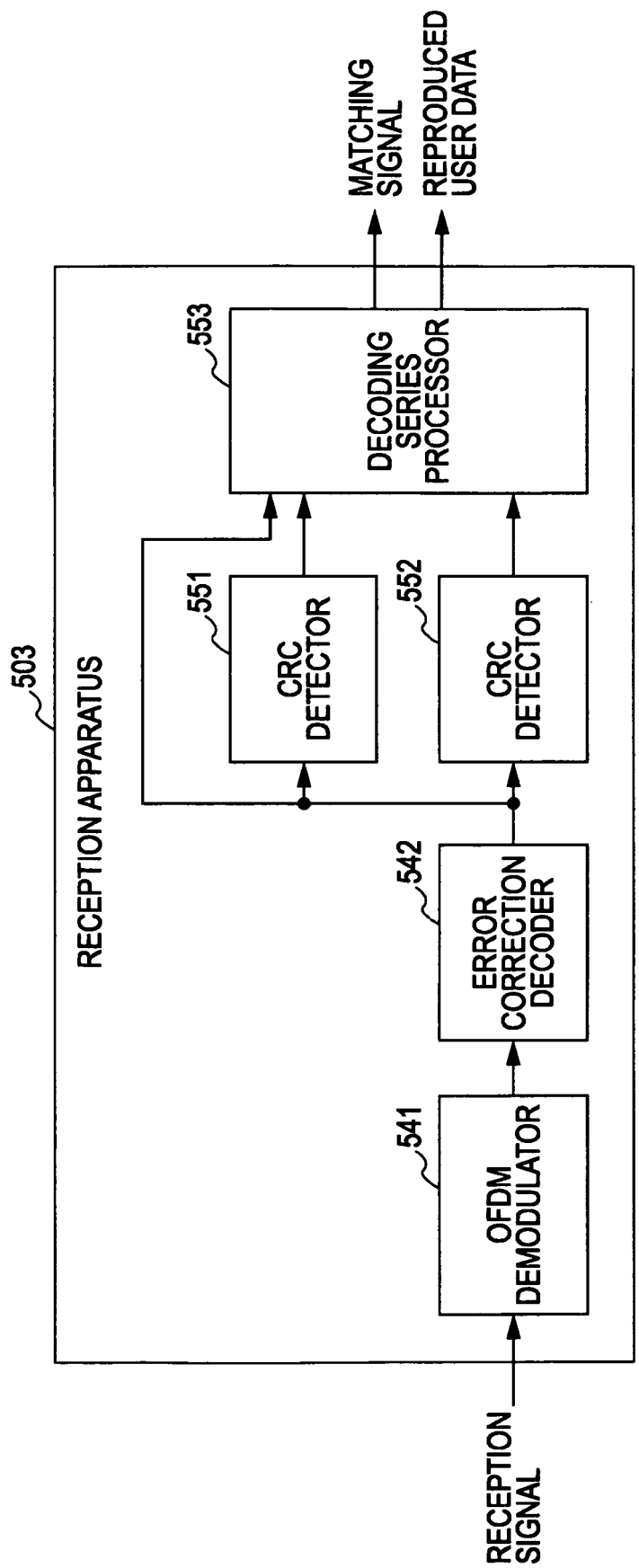
FIG. 23 is a block diagram illustrating another configuration example of the reception apparatus.

FIG. 23 is a block diagram illustrating another configuration example of the reception apparatus 503. The same configurations as those shown in FIG. 22 are appended with the same reference numerals. Redundant description will be omitted. With the example in FIG. 23, CRC detectors 551 and 552 are provided as a configuration for performing the CRC processing. The data obtained by being subjected to the error correction processing at the error correction decoder 542 is supplied to the CRC detectors 551 and 552, and decoding series processor 553, respectively.

The CRC detector 551 detects whether or not the data of the baseband header subjected to error correction at the error correction decoder 542 includes an error based on the second CRC parity included in the data supplied from the error correction decoder 542, and outputs the detection result to the decoding series processor 553. With the error detection performed at the CRC detector 552 as well, for example, a generating polynomial $G(x)=x^8+x^4+x+1$ is employed.

Also, the CRC detector 552 detects whether or not the data of an UP subjected to error correction at the error correction decoder 542 includes an error based on the first CRC parity included in the data supplied from the error correction decoder 542, and outputs the detection result to the decoding series processor 553. With the error detection performed at the CRC detector 551 as well, for example, a generating polynomial $G(x)=x^8+x^4+x+1$ is employed.

The decoding series processor 553 subjects the data supplied from the error correction decoder 542 to predetermined processing based on the detection results by the CRC detectors 551 and 552, and obtains reproduced user data. The decoding series processor 553 outputs a matching signal representing the detection results by the CRC detectors 551 and 552 to the subsequent-stage apparatus along with the reproduced user data.

Thus, the CRC detector for header, and the CRC detector for UP may be provided, individually. Also, a generating polynomial employed at the CRC detector for header, and a generating polynomial employed at the CRC detector for UP may differ. A generating polynomial employed at each of the CRC detectors is selected with the above-mentioned method according the number of parity bits and code length.

Figure 24:
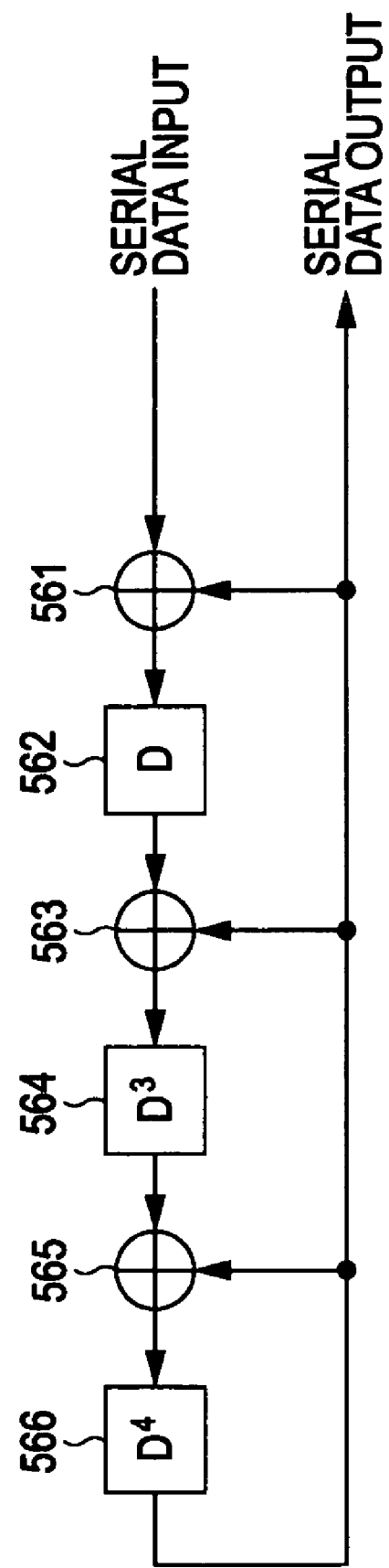
FIG. 24 is a diagram illustrating a circuit configuration example of the CRC detector in FIG. 22.

FIG. 24 is a diagram illustrating a circuit configuration example of a portion for performing CRC parity check (portion equivalent to the parity checker 341 in FIG. 5) of the CRC detector 543 in FIG. 22. FIG. 24 illustrates an example wherein $G(x)=x^8+x^4+x+1$ is employed as a generating polynomial. In a case wherein the generating polynomials employed at the CRC detectors 551 and 552 in FIG. 23 are $G(x)=x^8+x^4+x+1$, the same configuration as that shown in FIG. 24 is provided in the CRC detectors 551 and 552, respectively.

With an EXOR circuit 561, an exclusive OR operation is performed based on serial data supplied form the error correction decoder 542, and the value delayed by four timing worth at a shift register 566. The logical operation result of the EXOR circuit 561 is supplied to a shift register 562.

With an EXOR circuit 563, an exclusive OR operation is performed based on the value delayed by one timing worth at the shift register 562, and the value delayed by four timing worth at the shift register 566. The logical operation result of the EXOR circuit 563 is supplied to a shift register 564.

With an EXOR circuit 565, an exclusive OR operation is performed based on the value delayed by three timing worth at the shift register 564, and the value delayed by four timing worth at the shift register 566. The logical operation result of the EXOR circuit 565 is supplied to a shift register 566.

Now, description will be made regarding processing of the transmission apparatus 501 and reception apparatus 503 which have such a configuration. Processing in each step shown in a later-described flowchart is performed in number order, and is also performed in parallel with the processing in another step in some cases.

First, description will be made regarding processing of the transmission apparatus 501 in FIG. 16 for transmitting user data in a generic continuous stream form, with reference to the flowchart in FIG. 25. This processing is started, for example, when user data and header data is input.

In step S101, the data input device 515A of the signal processor 515 outputs the user data externally input, to the selector 511, and outputs the header data to the header generator 515B.

In step S102, the header generator 515B generates each piece of data to be stored in a baseband header based on the header data supplied from the data input device 515A, and outputs the generated data to the selector 511 as header data.

In step S103, the controller 515C outputs a data type 2 for instructing to output the header data to the CRC encoder 512, to the selector 511. The header data is selected at the selector 511 in response to the data type 2 being supplied thereto, and is output to the CRC encoder 512.

In step S104, the CRC encoder 512 treats the header data supplied from the selector 511 as information bit series, employs a generating polynomial $G(x)=x^8+x^4+x+1$ to generate a second CRC parity, and stores the generated second CRC parity in a baseband header.

In step S105, the controller 515C outputs a data type 2 for instructing to output the user data to the CRC encoder 512, to the selector 511. The user data is selected at the selector 511 in response to the data type 2 being supplied thereto, and is output to the CRC encoder 512.

In step S106, the controller 515C outputs a data type 1 representing that the stream supplied from the selector 511 as user data is a generic continuous stream, and the DFL information to the CRC encoder 512.

In step S107, the frame generator 512A of the CRC encoder 512 segments the user data which is a generic continuous stream in increments of a data field of which the length is specified with the DFL, thereby generating frames.

In step S108, the frame generator 512A appends the baseband header to each of the data fields, thereby generating baseband frames, and outputs the data in increments of a baseband frame to the error correction encoder 513.

In step S109, the error correction encoder 513 subjects the data supplied from the CRC encoder 512 to the error correction encoding processing, and outputs the data obtained by being subjected to the error correction encoding processing to the OFDM modulator 514.

In step S110, the OFDM modulator 514 performs processing such as OFDM modulation as transmission line encoding processing.

In step S111, the OFDM modulator 514 transmits a transmission signal obtained by performing processing such as OFDM processing or the like, and ends the present processing.

Description will be made regarding processing of the transmission apparatus 501 in FIG. 16 for transmitting user data in a packetized stream form, with reference to the flowchart in FIG. 26.

Processing for transmitting user data in a packetized stream form is basically the same as the processing described with reference to the flowchart in FIG. 25 except that processing for replacing a SYNC of a UP with the first CRC parity is included.

Specifically, in step S121, the data input device 515A of the signal processor 515 outputs the user data to the selector 511, and outputs the header data to the header generator 515B.

In step S122, the header generator 515B generates each piece of data to be stored in a baseband header, and outputs the generated data to the selector 511 as header data.

In step S123, the controller 515C outputs a data type 2 for instructing to output the header data to the CRC encoder 512, to the selector 511. The header data is selected at the selector 511 in response to the data type 2 being supplied thereto, and is output to the CRC encoder 512.

In step S124, the CRC encoder 512 generates a second CRC parity, and stores the generated second CRC parity in a baseband header.

In step S125, the controller 515C outputs a data type 2 for instructing to output the header data to the CRC encoder 512, to the selector 511. The header data is selected at the selector 511 in response to the data type 2 being supplied thereto, and is output to the CRC encoder 512.

In step S126, the controller 515C outputs a data type 1 representing that the stream supplied as user data is a generic continuous stream, and the DFL information to the CRC encoder 512.

In step S127, the CRC encoder 512 treats data of a SYNC and thereafter included in each UP supplied as user data, as information bit series, and employs a generating polynomial $G(x)=x^8+x^4+x+1$ to generate a first CRC parity, and replaces a SYNC positioned in the top 8 bits of the next UP in processing order with the generated first CRC parity.

In step S128, the frame generator 512A of the CRC encoder 512 segments the packetized stream made up of UPs of which the SYNCs are replaced with the first CRC parity in increments of a data field of which the length specified with the DFL, thereby generating frames.

In step S129, the frame generator 512A appends the baseband header to each of the data fields, thereby generating baseband frames, and outputs the data in increments of a baseband frame to the error correction encoder 513.

In step S130, the error correction encoder 513 subjects the data supplied from the CRC encoder 512 to the error correction encoding processing, and outputs the data obtained by being subjected to the error correction encoding processing to the OFDM modulator 514.

In step S131, the OFDM modulator 514 performs processing such as OFDM modulation as transmission line encoding processing.

In step S132, the OFDM modulator 514 transmits a transmission signal obtained by performing processing such as OFDM processing or the like, and ends the present processing.

Figure 27:
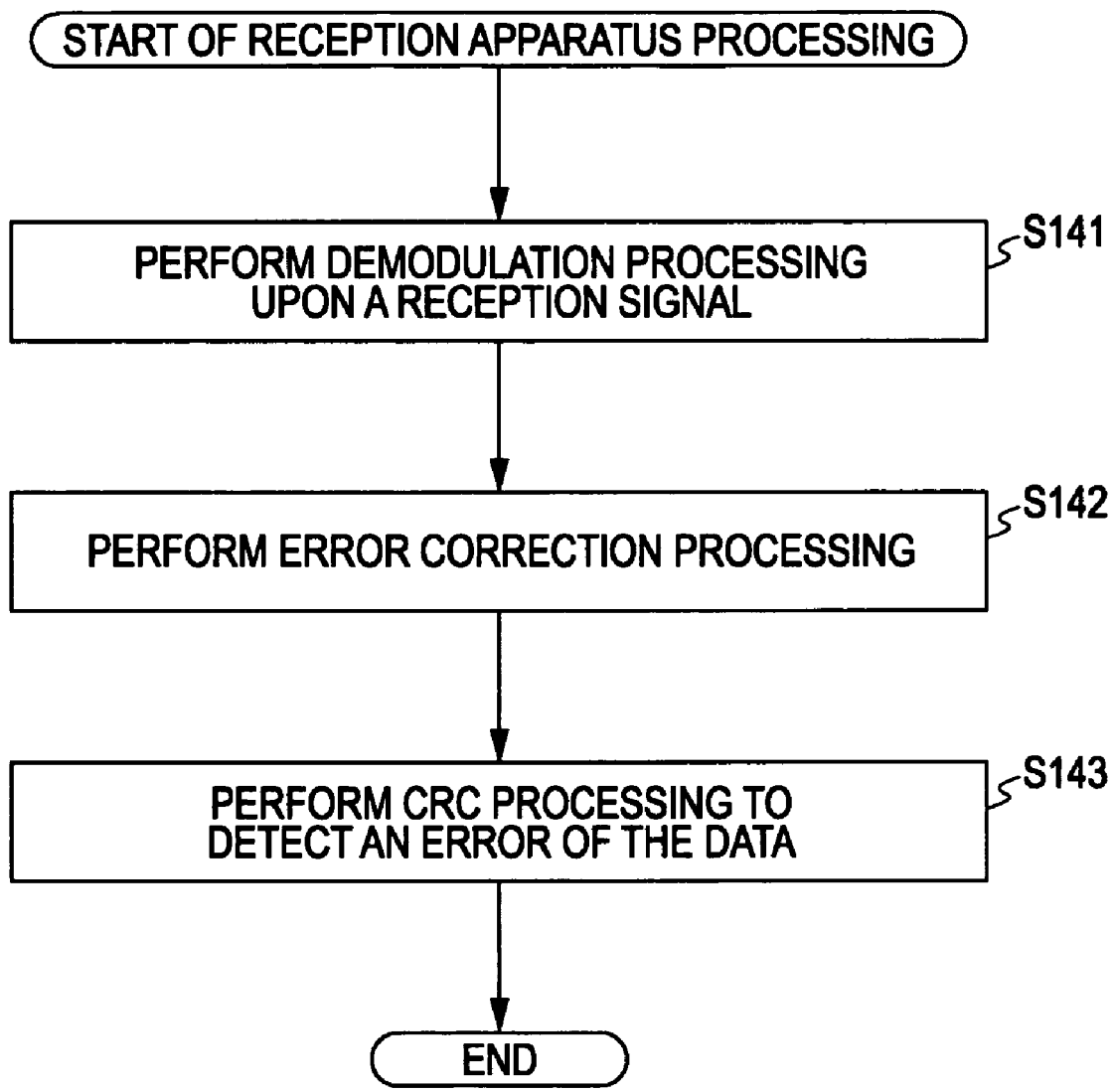
FIG. 27 is a flowchart describing processing of the reception apparatus in FIG. 22.

Next, description will be made regarding processing of the reception apparatus 503 in FIG. 22 for receiving data, with reference to the flowchart in FIG. 27.

In step S141, the OFDM demodulator 541 subjects a reception signal to OFDM demodulation processing, and outputs the obtained data to the error correction decoder 542.

In step S142, the error correction decoder 542 subjects the data supplied from the OFDM demodulator 541 to the error correction processing, and outputs the data obtained by being subjected to the error correction processing as decoded data.

In step S143, the CRC detector 543 performs CRC processing with the decoded data supplied from the error correction decoder 542 as a target, and detects an error of the data. The CRC detector 543 outputs a signal representing the detection result to the decoding series processor 544, and ends the present processing. With the decoding series processor 544, user data is reproduced based on the decoded data supplied from the error correction decoder 542, and predetermined processing is performed.

According to the above-mentioned processing, a high-precision CRC can be realized by employing a generating polynomial selected with the processing in FIG. 8.

While an arrangement has been made so far wherein $G(x)=x^8+x^4+x+1$ is employed as a generating polynomial at the CRC encoder 512 of the transmission apparatus 501, and the CRC detector 543 of the reception apparatus 503, an arrangement may be wherein multiple generating polynomials are set in the transmission apparatus 501 and reception apparatus 503 beforehand, and the employed generating polynomial is switched according to the type or length (code length) or the like of the data to be processed as appropriate.

Figure 28:
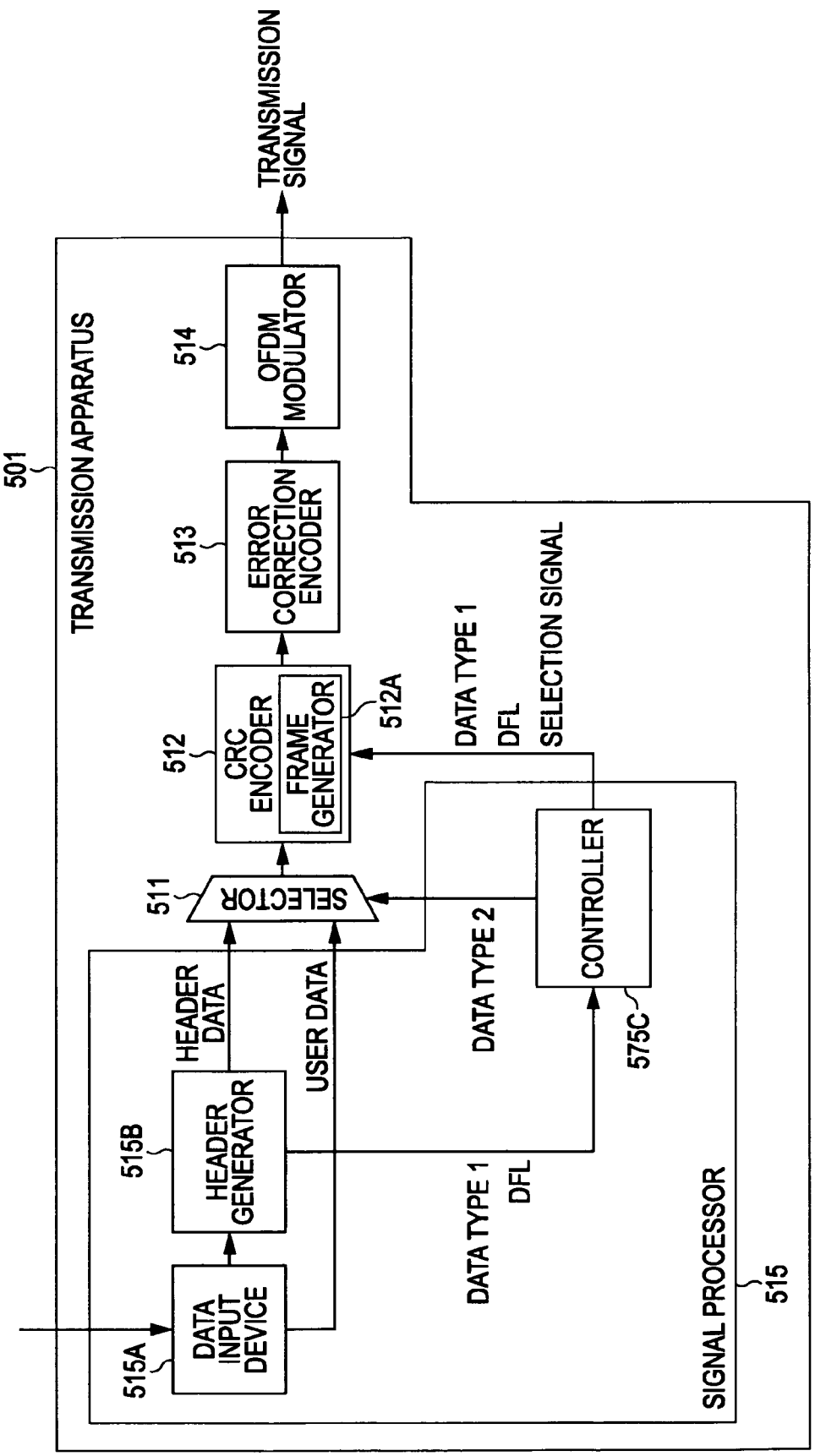
FIG. 28 is a block diagram illustrating yet another configuration example of the transmission apparatus.

FIG. 28 is a block diagram illustrating yet another configuration example of the transmission apparatus 501. The same configurations as those shown in FIG. 16 are appended with the same reference numerals. Redundant description will be omitted.

The controller 575C includes a list representing a corresponding relation between the type and length of data and a generating polynomial. The controller 575C determines the type and length of the data to be processed at the CRC encoder 512 by monitoring data to be output from the selector 511, and selects a generating polynomial corresponding to the determined type and length based on the description in the list. The controller 575C outputs a selection signal which is a signal representing the selected generating polynomial to the CRC encoder 512.

The CRC encoder 512 switches the employed generating polynomial according to the selection signal supplied from the controller 575C, and generates first and second CRC parities.

FIGS. 29 and 30 are diagrams showing an example of the list managed by the controller 575C. FIG. 29 is a diagram showing an example of a list in which a corresponding relation between a code length and a generating polynomial. According to this example, in a case wherein the code length of the data to be processed is $n_1$, a generating polynomial $G_1(x)$ is employed, and in the case of $n_2$, a generating polynomial $G_2(x)$ is employed, and in the case of $n_3$, a generating polynomial $G_3(x)$ is employed.

FIG. 30 is a diagram showing an example of a list in which a corresponding relation between a data type and a generating polynomial. According to this example, in a case wherein the data to be processed is data of a baseband header (header data), a generating polynomial $G_1(x)$ is employed, and in a case wherein the data to be processed is data of an UP (user data), a generating polynomial $G_2(x)$ is employed.

Such a corresponding relation has been obtained at the design stage by the above-mentioned method beforehand. Thus, the employed generating polynomial is switched according to the data to be processed as appropriate, whereby a CRC parity can be generated by employing a generating polynomial suitable for the data to be processed. Note that switching of the employed generating polynomial is performed dynamically when the header data and user data to be processed is input to the transmission apparatus 501.

Figure 31:
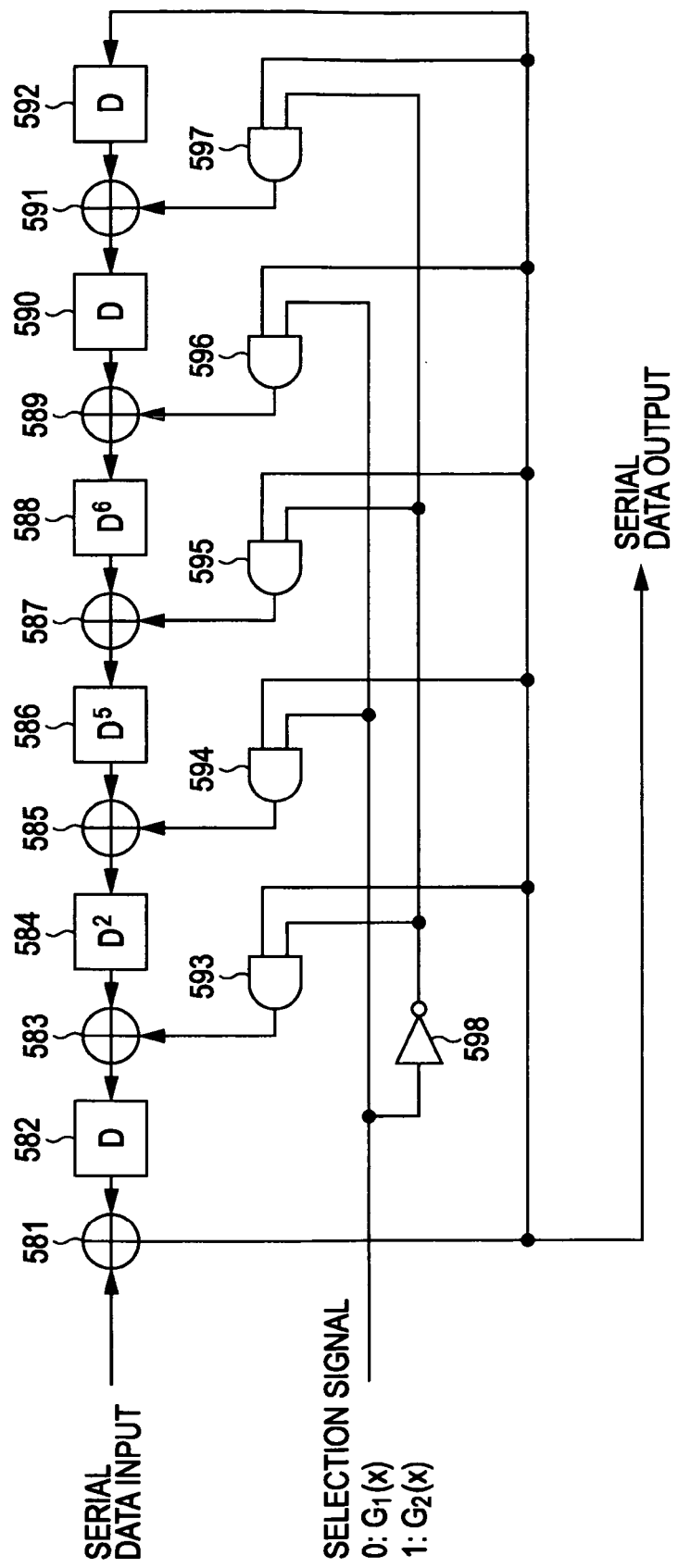
FIG. 31 is a diagram illustrating a circuit configuration example of the CRC encoder in FIG. 28.

FIG. 31 is a diagram illustrating an example of the circuit configuration of a portion for generating a CRC parity, of the CRC encoder 512 in FIG. 28. FIG. 31 illustrates a case wherein generating polynomials $G_1(x)=x^{16}+x^{15}+x^8+x+1$ and $G_2(x)=x^{16}+x^{13}+x^2+1$ are employed. In this case, either the calculation employing the generating polynomial $G_1(x)=x^{16}+x^{15}+x^8+x+1$ or the calculation employing the generating polynomial $G_2(x)=x^{16}+x^{13}+x^2+1$ is performed according to the selection signal 1, 0 from the controller 575C. The generating polynomial $G_1(x)$ employed in a case wherein the value represented with the selection signal is 0 is the generating polynomial of (38) of the above-enumerated generating polynomials, and the generating polynomial $G_2(x)$ employed in a case wherein the value represented with the selection signal is 1 is the generating polynomial of (39) of the above-enumerated generating polynomials.

With an EXOR circuit 581, an exclusive OR operation is performed based on the serial data supplied from the selector 511, and the value delayed by one timing worth at a shift register 582. The logical operation result of the EXOR circuit 581 is output as serial data, and is also supplied to AND circuits 593 through 597, and a shift register 592.

With an EXOR circuit 591, an exclusive OR operation is performed based on the value delayed by one timing worth at the shift register 592, and the value supplied from the AND circuit 597. The logical operation result of the EXOR circuit 591 is supplied to a shift register 590.

With an EXOR circuit 589, an exclusive OR operation is performed based on the value delayed by one timing worth at the shift register 590, and the value supplied from the AND circuit 596. The logical operation result of the EXOR circuit 589 is supplied to a shift register 588.

With an EXOR circuit 587, an exclusive OR operation is performed based on the value delayed by six timing worth at the shift register 588, and the value supplied from the AND circuit 595. The logical operation result of the EXOR circuit 587 is supplied to a shift register 586.

With an EXOR circuit 585, an exclusive OR operation is performed based on the value delayed by five timing worth at the shift register 586, and the value supplied from the AND circuit 594. The logical operation result of the EXOR circuit 585 is supplied to a shift register 584.

With an EXOR circuit 583, an exclusive OR operation is performed based on the value delayed by two timing worth at the shift register 584, and the value supplied from the AND circuit 593. The logical operation result of the EXOR circuit 583 is supplied to a shift register 582.

A value of 1 is output from the AND circuits 593, 595, and 597 in a case wherein the value output from the EXOR circuit 581, and the value output from the controller 575C as the selection signal and inverted at the NOT circuit 598 are both 1, and a value of 0 is output in other cases.

A value of 1 is output from the AND circuits 594 and 596 in a case wherein the value output from the EXOR circuit 581, and the value output from the controller 575C as the selection signal are both 1, and a value of 0 is output in other cases.

Figure 32:
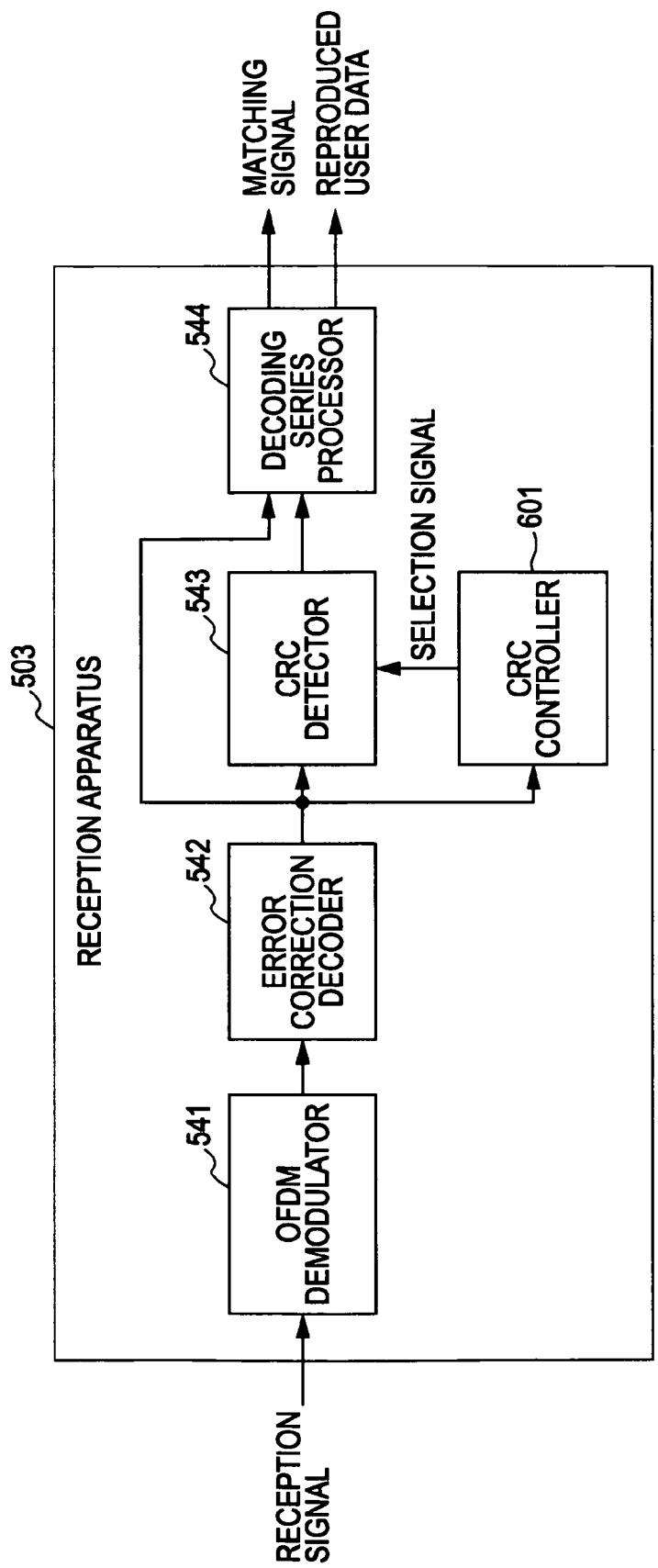
FIG. 32 is a block diagram illustrating yet another configuration example of the reception apparatus.

FIG. 32 is a block diagram illustrating yet another configuration example of the reception apparatus 503. As described above, in a case wherein the employed generating polynomial is switched at the transmission apparatus 501, the employed generating polynomial is also switched at the reception apparatus 503 as appropriate.

The configuration of the reception apparatus 503 shown in FIG. 32 differs from the configuration of the reception apparatus 503 shown in FIG. 22 in that a CRC controller 601 is further provided. The data output from the error correction decoder 542 is supplied to a CRC detector 543, decoding series processor 544, and CRC controller 601.

The CRC controller 601 includes, in the same way as with the controller 575C of the transmission apparatus 501, a list representing a corresponding relation between a data type, data length, and generating polynomial, such as shown in FIGS. 29 and 30. The CRC controller 601 determines the type and length of the data to be processed at the CRC detector 543 based on the data supplied from the error correction decoder 542, and selects a generating polynomial corresponding to the determined type and length based on the description of the list. The CRC controller 601 outputs a selection signal representing the selected generating polynomial to the CRC detector 543.

The CRC detector 543 switches the employed generating polynomial according to the selection signal supplied from the CRC controller 601, and detects whether or not the data subjected to error correction at the error correction decoder 542 includes an error.

Thus, the employed generating polynomial is switched according to the data to be processed as appropriate, whereby error detection can be performed by employing a generating polynomial suitable for the data to be processed. Note that switching of the employed generating polynomial is performed dynamically when receiving a signal.

Figure 33:
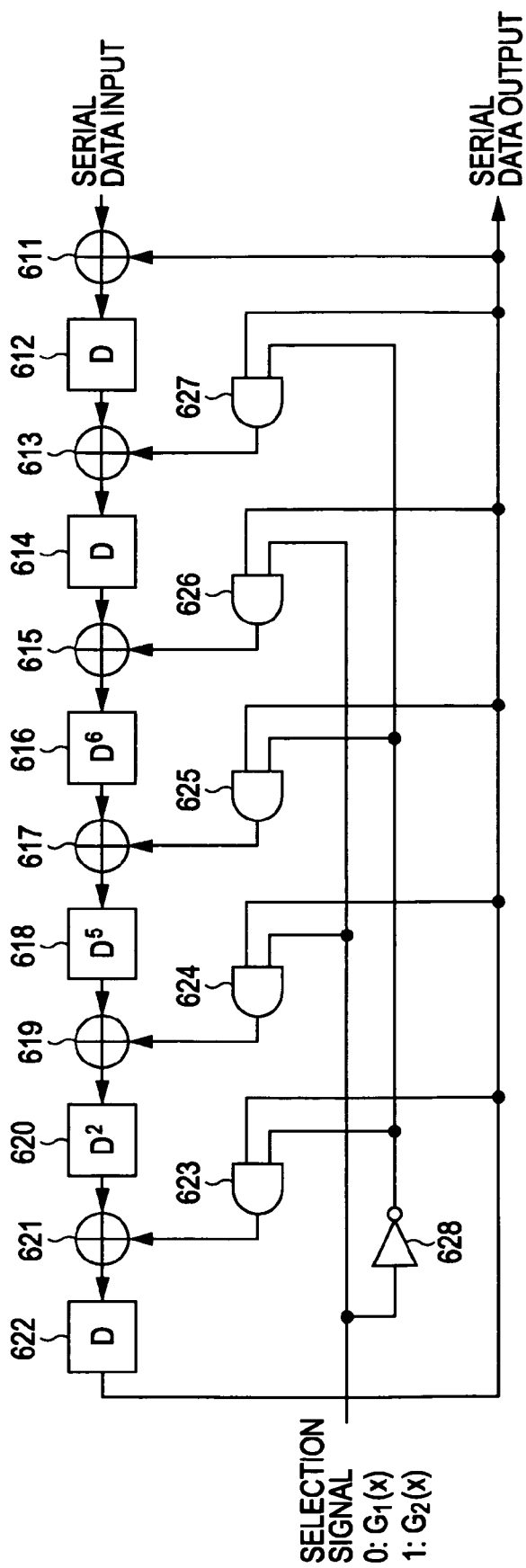
FIG. 33 is a diagram illustrating a circuit configuration example of the CRC detector in FIG. 32.

FIG. 33 is a diagram illustrating an example of the circuit configuration of a portion for performing a CRC parity check, of the CRC detector 543 in FIG. 32. FIG. 33 also illustrates a case wherein generating polynomials $G_1(x)=x^{16}+x^{15}+x^8+x+1$ and $G_2(x)=x^{16}+x^{13}+x^2+1$ are employed. In this case, the calculation employing the generating polynomial $G_1(x)=x^{16}+x^{15}+x^8+x+1$ and calculation employing the generating polynomial $G_2(x)=x^{16}+x^{13}+x^2+1$ are performed according to the selection signal 1, 0 from the CRC controller 601, respectively.

With an EXOR circuit 611, an exclusive OR operation is performed based on the serial data supplied from the error correction decoder 542, and the value delayed by one timing worth at a shift register 622. The logical operation result of the EXOR circuit 611 is supplied to a shift register 612.

With an EXOR circuit 613, an exclusive OR operation is performed based on the value delayed by one timing worth at the shift register 612, and the value supplied from an AND circuit 627. The logical operation result of the EXOR circuit 613 is supplied to a shift register 614.

With an EXOR circuit 615, an exclusive OR operation is performed based on the value delayed by one timing worth at the shift register 614, and the value supplied from an AND circuit 626. The logical operation result of the EXOR circuit 615 is supplied to a shift register 616.

With an EXOR circuit 617, an exclusive OR operation is performed based on the value delayed by six timing worth at the shift register 616, and the value supplied from an AND circuit 625. The logical operation result of the EXOR circuit 617 is supplied to a shift register 618.

With an EXOR circuit 619, an exclusive OR operation is performed based on the value delayed by five timing worth at the shift register 618, and the value supplied from an AND circuit 624. The logical operation result of the EXOR circuit 619 is supplied to a shift register 620.

With an EXOR circuit 621, an exclusive OR operation is performed based on the value delayed by two timing worth at the shift register 620, and the value supplied from an AND circuit 623. The logical operation result of the EXOR circuit 621 is supplied to a shift register 622.

A value of 1 is output from the AND circuits 623, 625, and 627 in a case wherein the value delayed by one timing worth at the shift register 622, and the value output from the CRC controller 601 as the selection signal, and inverted at a NOT circuit 628 are both 1, and a value of 0 is output in other cases.

A value of 1 is output from the AND circuits 624 and 626 in a case wherein the value delayed by one timing worth at the shift register 622, and the value output from the CRC controller 601 as the selection signal are both 1, and a value of 0 is output in other cases.

While an arrangement has been made so far wherein the generating polynomial employed by switching is either the $G_1(x)=x^{16}+x^{15}+x^8+x+1$ or the $G_2(x)=x^{16}+x^{13}+x^2+1$, another generating polynomial may be employed, or an arrangement may be made wherein one generating polynomial is selected out of three or more generating polynomials, and the selected generating polynomial is employed. Also, in stead of the employed generating polynomial being switched according to a baseband header and user data, the employed generating polynomial may be switched according to other types of data, such as a header and sub header.

Now, description will be made regarding processing of the transmission apparatus 501 having the configuration shown in FIG. 28, and reception apparatus 503 having the configuration shown in FIG. 32.

Figure 34:
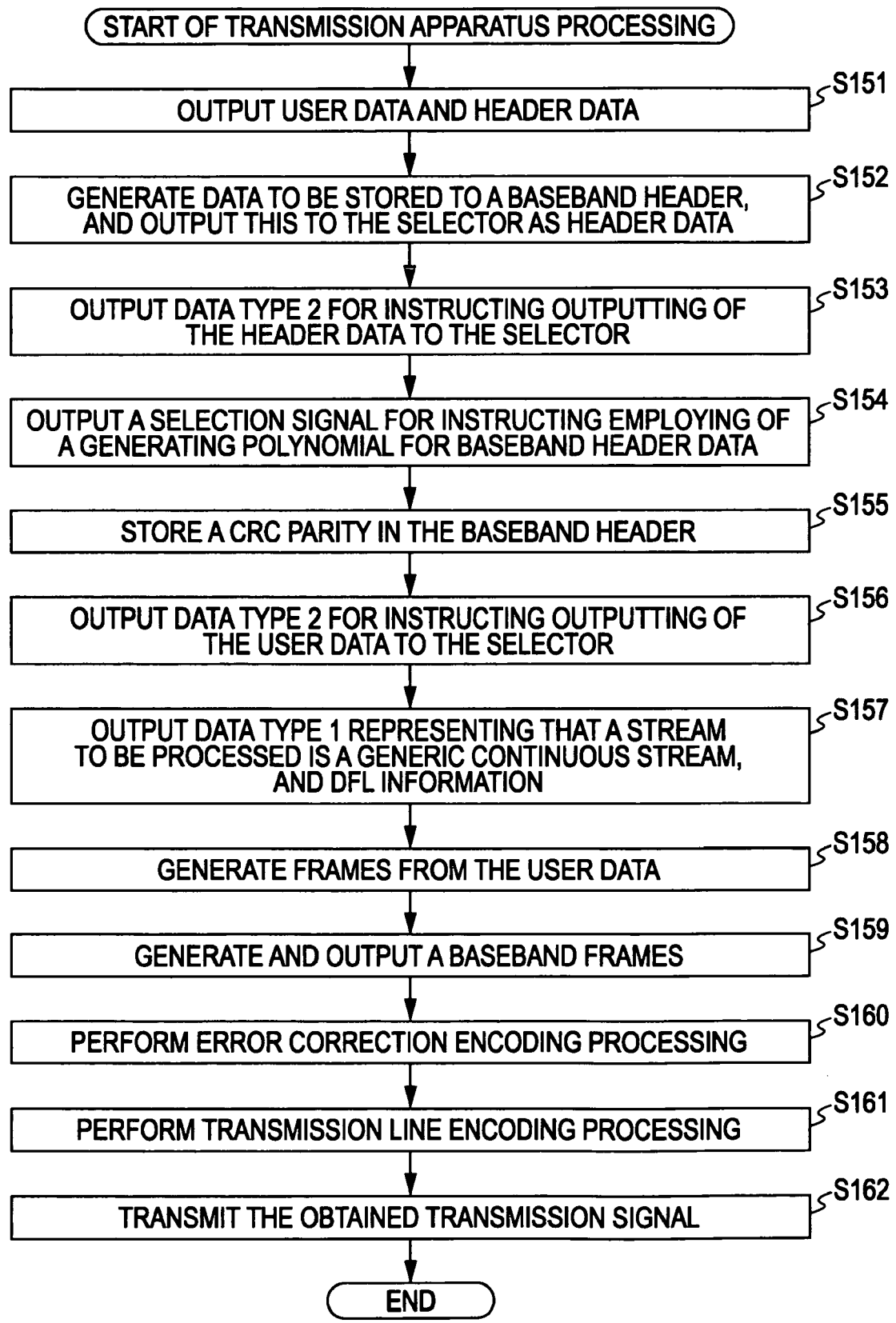
FIG. 34 is a flowchart describing processing of the transmission apparatus in FIG. 28.

First, description will be made regarding processing of the transmission apparatus 501 in FIG. 28 for transmitting user data in a generic continuous stream form, with reference to the flowchart in FIG. 34.

Figure 25:
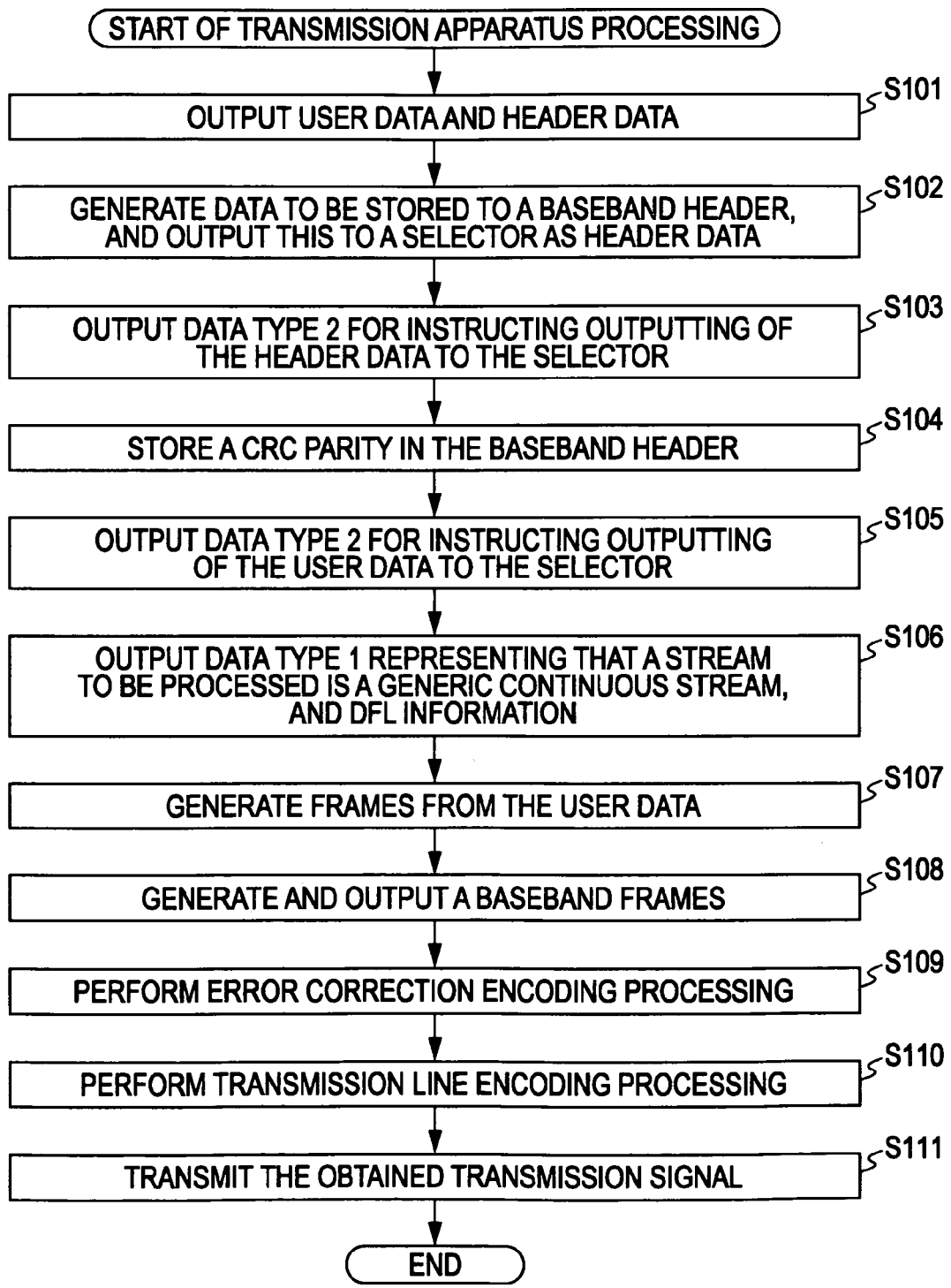
FIG. 25 is a flowchart describing processing of the transmission apparatus in FIG. 16.

This processing is the same processing as the processing in FIG. 25 except that processing wherein a selection signal for instructing a generating polynomial to be employed for CRC encoding processing is output to the CRC encoder 512 from the controller 575C is included.

Specifically, in step S151, the data input device 515A of the signal processor 515 outputs user data to the selector 511, and outputs header data to the header generator 515B.

In step S152, the header generator 515B generates each piece of data to be stored in a baseband header, and outputs the generated data to the selector 511 as header data.

In step S153, the controller 575C outputs a data type 2 for instructing to output the header data to the CRC encoder 512, to the selector 511. The header data is selected at the selector 511 in response to the data type 2 being supplied thereto, and is output to the CRC encoder 512.

In step S154, the controller 575C outputs a selection signal for instructing to perform the CRC encoding processing by employing the generating polynomial $G_1(x)$ which is a generating polynomial for the data of a baseband header (header data), to the CRC encoder 512.

In step S155, the CRC encoder 512 employs the generating polynomial $G_1(x)$ which is a generating polynomial for header data in accordance with the selection signal supplied from the controller 575C to generate a second CRC parity, and stores the generated second CRC parity in a baseband header.

In step S156, the controller 575C outputs a data type 2 for instructing to output the user data to the CRC encoder 512, to the selector 511. The user data is selected at the selector 511 in response to the data type 2 being supplied thereto, and is output to the CRC encoder 512.

In step S157, the controller 575C outputs a data type 1 representing that the stream supplied as user data is a generic continuous stream, and the DFL information to the CRC encoder 512.

In step S158, the frame generator 512A of the CRC encoder 512 segments the user data which is a generic continuous stream in increments of a data field of which the length specified by the DFL, thereby generating frames.

In step S159, the frame generator 512A appends the baseband header to each of the data fields, thereby generating baseband frames, and outputs the data in increments of a baseband frame to the error correction encoder 513.

In step S160, the error correction encoder 513 subjects the data supplied from the CRC encoder 512 to the error correction encoding processing, and outputs the data obtained by being subjected to the error correction encoding processing to the OFDM modulator 514.

In step S161, the OFDM modulator 514 performs processing such as OFDM modulation as transmission line encoding processing.

In step S162, the OFDM modulator 514 transmits a transmission signal obtained by performing processing such as OFDM processing or the like, and ends the present processing.

Description will be made regarding processing of the transmission apparatus 501 in FIG. 28 for transmitting user data in a packetized stream form, with reference to the flowchart in FIG. 35.

Figure 26:
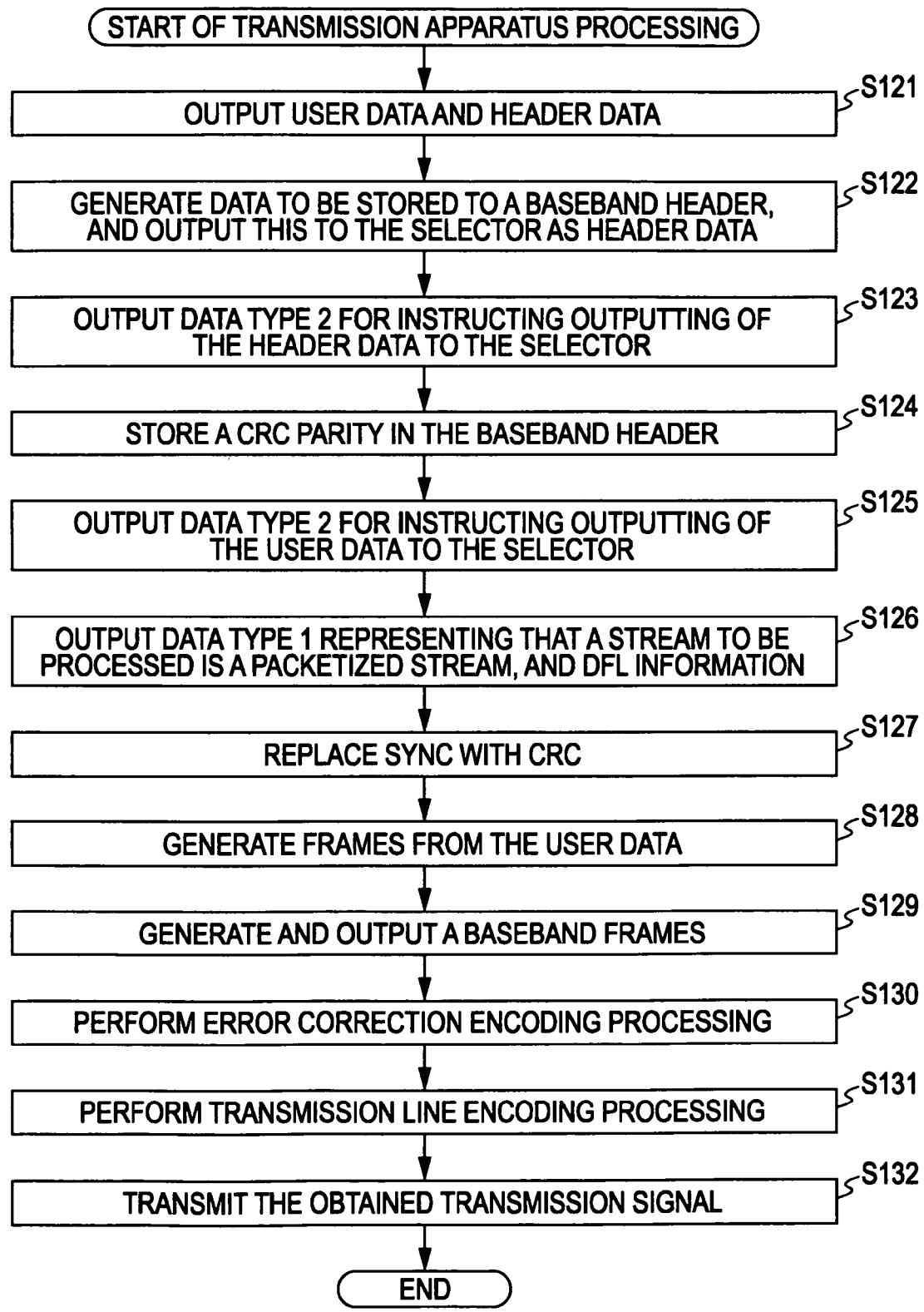
FIG. 26 is a flowchart describing another processing of the transmission apparatus in FIG. 16.
Figure 35:
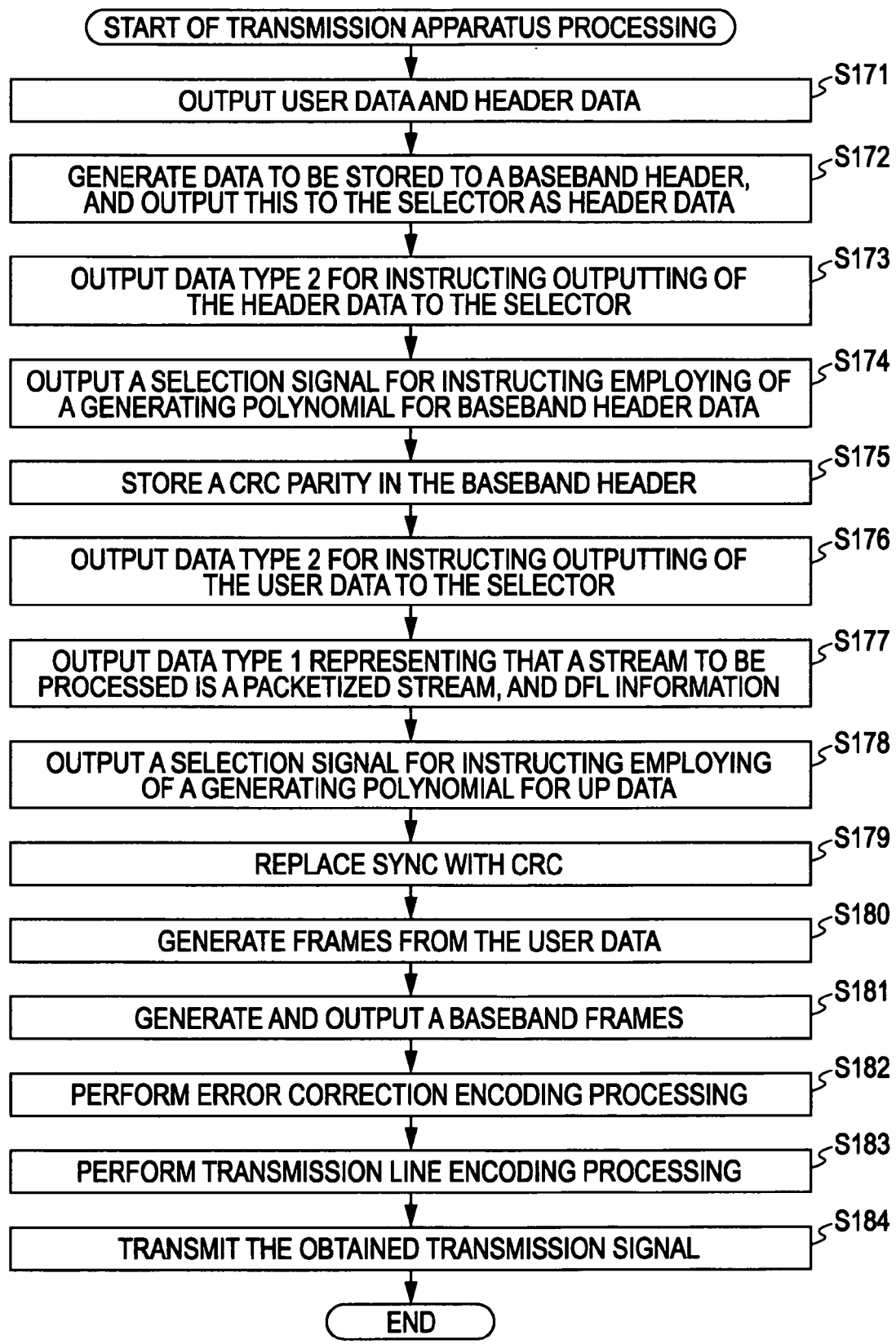
FIG. 35 is a flowchart describing another processing of the transmission apparatus in FIG. 28.

The processing in FIG. 35 is the same processing as the processing in FIG. 26 except that processing wherein a selection signal to instruct a generating polynomial employed for the CRC encoding processing is output to the CRC encoder 512 from the controller 575C.

In step S171, the data input device 515A of the signal processor 515 outputs the user data to the selector 511, and outputs the header data to the header generator 515B.

In step S172, the header generator 515B generates each piece of data to be stored in a baseband header, and outputs the generated data to the selector 511 as header data.

In step S173, the controller 575C outputs a data type 2 for instructing to output the header data to the CRC encoder 512, to the selector 511. The header data is selected at the selector 511 in response to the data type 2 being supplied thereto, and is output to the CRC encoder 512.

In step S174, the controller 575C outputs a selection signal for instructing to perform the CRC encoding processing by employing the generating polynomial $G_1(x)$ which is a generating polynomial for the data of a baseband header (header data), to the CRC encoder 512.

In step S175, the CRC encoder 512 employs the generating polynomial $G_1(x)$ which is a generating polynomial for header data in accordance with the selection signal supplied from the controller 575C to generate a second CRC parity, and stores the generated second CRC parity in a baseband header.

In step S176, the controller 575C outputs a data type 2 for instructing to output the user data to the CRC encoder 512, to the selector 511. The user data is selected at the selector 511 in response to the data type 2 being supplied thereto, and is output to the CRC encoder 512.

In step S177, the controller 575C outputs a data type 1 representing that the stream supplied as user data is a generic continuous stream, and the DFL information to the CRC encoder 512.

In step S178, the controller 575C outputs a selection signal for instructing to perform the CRC encoding processing by employing the generating polynomial $G_2(x)$ which is a generating polynomial for the data of a UP (user data), to the CRC encoder 512.

In step S179, the CRC encoder 512 employs the generating polynomial $G_2(x)$ with a SYNC and thereafter included in each UP, which is supplied as user data, as information bit series to generate a first CRC parity, and replaces a SYNC positioned in the top 8 bits of the next UP in processing order with the generated first CRC parity.

In step S180, the frame generator 512A of the CRC encoder 512 segments the user data which is a generic continuous stream in increments of a data field of which the length specified by the DFL, thereby generating frames.

In step S181, the frame generator 512A appends the baseband header to each of the data fields, thereby generating baseband frames, and outputs the data in increments of a baseband frame to the error correction encoder 513.

In step S182, the error correction encoder 513 subjects the data supplied from the CRC encoder 512 to the error correction encoding processing, and outputs the data obtained by being subjected to the error correction encoding processing to the OFDM modulator 514.

In step S183, the OFDM modulator 514 performs processing such as OFDM modulation as transmission line encoding processing.

In step S184, the OFDM modulator 514 transmits a transmission signal obtained by performing processing such as OFDM processing or the like, and ends the present processing.

Next, description will be made regarding processing of the reception apparatus 503 in FIG. 32 for receiving data, with reference to the flowchart in FIG. 36. The processing in FIG. 36 is the same processing as the processing in FIG. 27 except that processing wherein a selection signal to instruct a generating polynomial employed for the CRC processing is output to the CRC detector 543 from the controller 601.

In step S191, the OFDM demodulator 541 subjects a reception signal to OFDM demodulation processing, and outputs the obtained data to the error correction decoder 542.

In step S192, the error correction decoder 542 subjects the data supplied from the OFDM demodulator 541 to the error correction processing, and outputs the data obtained by being subjected to the error correction processing as reception data.

In step S193, the controller 601 determines the data to be subjected to the CRC processing at the CRC detector 543 based on the reception data supplied from the error correction decoder 542.

In step S194, the controller 601 outputs a selection signal for instructing a generating polynomial to be employed the CRC processing according to the data to be subjected to the CRC processing, to the CRC detector 543.

In step S195, the CRC detector 543 switches the employed generating polynomial according to the selection signal supplied from the controller 601, and subjects the reception data supplied from the error correction decoder 542 to the CRC processing. In a case wherein header data is subjected to the CRC processing, the generating polynomial $G_1(x)$ which is a generating polynomial for header data is employed, and in a case wherein user data is subjected to the CRC processing, the generating polynomial $G_2(x)$ which is a generating polynomial for user data is employed. The CRC detector 543 outputs a signal representing the CRC processing result, and ends the present processing.

While description has been made so far wherein transmission of data is performed from the transmission apparatus 501 to the reception apparatus 503 in accordance with a specification, such as DVB-T2 which is the specification of terrestrial digital broadcasting, or DVB-S2 which is the specification of satellite digital broadcasting, or the like, the difference between the DVB-T2 and DVB-S2 is in that the seventh and eighth bits of the 2-byte data of the MATYPE included in a baseband header such as shown in FIG. 13 are 2-bit "Mode" representing a transmission mode with the DVB-T2, but are 2-bit "RO" representing a roll-off factor with the DVB-S2.

The present invention is not restricted to the above-mentioned embodiment, and various changes can be made without departing from the essence and spirit of the present invention. It should be understood by those skilled in the art that various modifications, combinations, sub-combinations and alterations may occur depending on design requirements and other factors insofar as they are within the scope of the appended claims or the equivalents thereof.

What is claimed is:

1. A transmission apparatus comprising:
CRC encoding processing means configured to include a plurality of generating polynomials for an CRC encoding processing with each of a plurality of data of which the code lengths differ as a target, and employ the optimal generating polynomial out of said plurality of generating polynomials to perform the CRC encoding processing; and
transmission means configured to transmit data obtained by said CRC encoding processing means performing the CRC encoding processing.

2. The transmission apparatus according to claim 1, wherein said plurality of generating polynomials are generating polynomials selected by processing which includes
a first process for obtaining the maximum minimum hamming distance (Max.$d_{min}$) which is the maximum value of the minimum hamming distance ($d_{min}$) with a code length (n) of each of codes having a k-bit information word to which an r-bit parity is added,
a second process for obtaining a code length (n) changed in the maximum minimum hamming distance (Max.$d_{min}$) for codes, and obtaining a range of ($n_{min}$(r, Max.$d_{min}$) $\leq n \leq n_{max}$(r, Max.$d_{min}$)) of the code length (n) thereof,
a third process for finding out a generating polynomial (G(x)) satisfying a condition ($d_{min}$=Max.$d_{min}$) wherein with said range ($n_{min}$(r, Max.$d_{min}$)$\leq n \leq n_{max}$(r, Max.$d_{min}$)) of the code length (n), the minimum hamming distance ($d_{min}$) is equal to the maximum minimum hamming distance (Max.$d_{min}$) for codes, by global search, and
a fourth process for selecting out a generating polynomial of which the number of terms (w) and the undetected error probability ($P_{ud}$) are minimal out of the generating polynomial (G(x)) found out by said global search.

3. The transmission apparatus according to claim 1, wherein said CRC encoding processing means perform CRC encoding processing using generating polynomials according to target data.

4. A transmission method for a transmission apparatus including a plurality of generating polynomials for a CRC encoding processing with each of a plurality of data of which the code lengths differ as a target, said transmission method comprising the steps of:
performing the CRC encoding processing by employing the optimal generating polynomial out of said plurality of generating polynomials; and
transmitting data obtained by performing the CRC encoding processing.

5. The transmission method according to claim 4, wherein in said CRC encoding processing, CRC encoding processing is performed using generating polynomials according to target data.

6. A reception apparatus comprising:
obtaining means configured to obtain data based on a signal transmitted from a transmission apparatus; and
CRC processing means configured to include a plurality of generating polynomials for a CRC encoding processing with each of a plurality of data of which the code lengths differ as a target, and detect an error of data by employing the optimal generating polynomial out of said plurality of generating polynomials to perform the CRC encoding processing.

7. The reception apparatus according to claim 6, wherein said plurality of generating polynomials are generating polynomials selected by processing which includes a first process for obtaining the maximum minimum hamming distance (Max.$d_{min}$) which is the maximum value of the minimum hamming distance ($d_{min}$) with a code length (n) of each of codes having a k-bit information word to which an r-bit parity is added;

a second process for obtaining a code length (n) changed in the maximum minimum hamming distance (Max.$d_{min}$) for codes, and obtaining a range of ($n_{min}$(r, Max.$d_{min}$) $\leq n \leq n_{max}$(r, Max.$d_{min}$)) of the code length (n) thereof;

a third process for finding out a generating polynomial (G(x)) satisfying a condition ($d_{min}$=Max.$d_{min}$) wherein with said range ($n_{min}$(r, Max.$d_{min}$)$\leq n \leq n_{max}$(r, Max.$d_{min}$)) of the code length (n), the minimum hamming distance ($d_{min}$) is equal to the maximum minimum hamming distance (Max.$d_{min}$) for codes, by global search; and a fourth process for selecting out a generating polynomial of which the number of terms (w) and the undetected error probability ($P_{ud}$) are minimal out of the generating polynomial (G(x)) found out by said global search.

8. The transmission apparatus according to claim 6, wherein said CRC processing means perform CRC processing using generating polynomials according to target data.

9. A reception method for a reception apparatus including a plurality of generating polynomials for a CRC processing with each of a plurality of data of which the code lengths differ as a target, said reception method comprising the steps of:

obtaining data based on a signal transmitted from a transmission apparatus; and detecting an error of data by employing the optimal generating polynomial out of said plurality of generating polynomials to perform the CRC processing.

10. The transmission method according to claim 9, wherein in said CRC processing, CRC processing is performed using generating polynomials according to target data.

11. A transmission apparatus comprising:

a CRC encoding processing unit configured to include a plurality of generating polynomials for an CRC encoding processing with each of a plurality of data of which the code lengths differ as a target, and employ the optimal generating polynomial out of said plurality of generating polynomials to perform the CRC encoding processing; and a transmission unit configured to transmit data obtained by said CRC encoding processing unit performing the CRC encoding processing.

12. A reception apparatus comprising:

an obtaining unit configured to obtain data based on a signal transmitted from a transmission apparatus; and a CRC processing unit configured to include a plurality of generating polynomials for a CRC encoding processing with each of a plurality of data of which the code lengths differ as a target, and detect an error of data by employing the optimal generating polynomial out of said plurality of generating polynomials to perform the CRC encoding processing.

* * * * *